United States Patent
Yamasaki et al.

(10) Patent No.: US 6,556,603 B1
(45) Date of Patent: Apr. 29, 2003

(54) NITRIDE-CONTAINED SEMICONDUCTOR LASER ELEMENT AND OPTICAL INFORMATION REPRODUCING DEVICE

(75) Inventors: Yukio Yamasaki, Nara (JP); Toshiyuki Okumura, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/659,601

(22) Filed: Sep. 11, 2000

(30) Foreign Application Priority Data

Sep. 10, 1999 (JP) .......................... 11-256485
Aug. 25, 2000 (JP) ........................ 2000-256218

(51) Int. Cl.⁷ ............................................ H01S 5/343
(52) U.S. Cl. ...................................................... 372/45
(58) Field of Search .............................. 372/44, 45, 46, 372/26, 29

(56) References Cited

U.S. PATENT DOCUMENTS 6,031,858 A * 2/2000 Hatakoshi et al. ............ 372/46
6,146,916 A * 11/2000 Nanishi et al. ............... 438/46

FOREIGN PATENT DOCUMENTS

JP    9-55560     2/1997
JP    9-148247    6/1997

* cited by examiner

Primary Examiner—James W. Davie
(74) Attorney, Agent, or Firm—Morrison & Foerster LLP

(57) ABSTRACT

A nitride-contained semiconductor laser element includes a layer formed of an $Al_{x1}Ga_{1-x1}N$ ($0.08 \leq x1 \leq 0.2$) lower clad layer, an active layer formed of an alternate multilayer structure including an $In_wGa_{1-w}N$ well layer and an $In_vGa_{1-v}N$ barrier layer, and an $Al_{x2}Ga_{1-x2}N$ ($0.08 \leq x2 \leq 0.2$) upper clad layer layered in this order on a substrate, one or a plurality of $In_zGa_{1-z}N$ ($0 \leq z \leq 0.2$) buffer layer(s) of 200 nm or less in thickness being disposed in the lower clad layer and/or the upper clad layer.

16 Claims, 22 Drawing Sheets

F=0.3

F=0.5

NITRIDE-CONTAINED SEMICONDUCTOR LASER ELEMENT AND OPTICAL INFORMATION REPRODUCING DEVICE

BACKGROUND OF THE INVENTION

1. Field of the Invention

The present invention relates to a semiconductor laser element using a gallium-nitride-contained semiconductor laser element as well as an optical information reproducing device using the same, and particularly relates to a semiconductor laser device providing a good FFP (Far Field Pattern).

2. Description of the Background Art

Such a prototype of a semiconductor laser element is already prepared that is made of a nitride-contained semiconductor material such as GaN, InN, AlN or mixed crystal thereof, and can emit light in a region from blue to ultraviolet light FIG. 22 is a schematic view showing a nitride semiconductor laser element (or light-emitting diode) disclosed in Japanese Patent Laying-Open No. 9-55560 of the same inventors, and shows a cross section of a waveguide stripe portion of the semiconductor laser taken along a plane perpendicular to a resonator. This semiconductor laser element (or light-emitting diode) includes a low-temperature buffer layer 192 which is a thin layer of GaN, AlN or AlGaN, and is formed on a sapphire substrate 191. The semiconductor laser element further includes an n-type GaN contact layer 193, an n-type lower clad layer 202, a non-doped or silicon-doped AlGaInN active layer 196 (or light-emitting layer), a p-type upper clad layer 197 and a p-type GaN contact layer 198, which are layered on buffer layer 192. A positive electrode 200 is formed on p-type contact layer 198. n-type GaN layer 193 has a partially exposed portion, on which a negative electrode 201 is formed, For forming this exposed portion, the n-type lower clad layer, active layer, p-type upper clad layer and a p-type GaN cap layer 199 located above the n-type GaN layer are partially removed.

In this semiconductor laser element, the n-type lower clad layer is configured by repetitively growing the n-type $Al_{0.1}Ga_{0.9}N$ clad layer 194 of about 0.15–0.3 μm in thickness and an n-type $Al_aGa_{1-a}N$ ($0 \leq a \leq 1$) buffer layer 195 and about 200 Å in thickness, and thereby lower clad layer 202 having a thickness of about 1 μm is prepared.

It is desired that the total thickness of the n-type lower clad layer is large from the viewpoint of preventing such a situation that the electric field distribution in the laser oscillation mode spreads to the n-type GaN contact layer, and thereby causes ripples in FFP. Due to difficulty in crystal growth, however, the thickness of the n-type $Al_{0.1}Ga_{0.9}N$ clad layer, which can be grown on the n-type GaN layer with good yield, is restricted. Although this specification relates to the photoelectric field distribution and FFP in the semiconductor laser element structure, it particularly relates to the photoelectric field distribution and FFP in the direction perpendicular to the semiconductor multilayer film. The photoelectric field distribution and the FFP in the above direction are merely referred to as the electric field distribution and the FFP, respectively. In this semiconductor laser element, therefore, the n-type lower clad layer having a total thickness of about 1 μm is formed by repetitive growth of the n-type $Al_{0.1Ga0.9}N$ clad layer of about 0.15–0.3 μm in thickness and the n-type $Al_aGa_{1-a}N$ ($0 \leq a \leq 1$) buffer layer of about 200 Å.

However, the foregoing semiconductor laser element in the prior art suffers from the following problems. The inventors and others actually prepared the semiconductor laser wafer of the foregoing structure, and observed its surface with an optical microscope of a magnification of about 200 times. As a result, it was found that some wafers have fine or good surfaces, but the others have hexagonal cracks at peripheral portions. More specifically, the hexagonal cracks were found in eight among ten wafers.

Elements each formed of a portion of the wafer of the laser element structure, in which the crack was not present, were prepared. According to these element, laser oscillation occurred with a threshold current density of 2–3 kA/cm². Elements each made of a cracked wafer portions were also prepared. According to these elements, the laser oscillation occurred only 15 among 30 elements.

As described above, the structure which employs the buffer layers containing AlN, GaN or AlGaN cannot sufficiently achieve the effect of preventing cracks, and therefore suffers from a problem of serious lowering of the yield.

An object of the invention is to overcome the foregoing problem, to provide a nitride semiconductor laser element which is optimum for application to an optical pickup or the like, and to achieve an optical information reproducing device having good light focusing characteristics.

SUMMARY OF THE INVENTION

For achieving the above object, the invention provides a nitride-contained semiconductor laser element including a layer formed of an $Al_{x1}Ga_{1-x1}N$ ($0.08 \leq x1 \leq 0.2$) lower clad layer, an active layer formed of an alternate multilayer structure including an $In_wGa_{1-w}N$ well layer and an $In_yGa_{1-y}N$ barrier layer, and an $Al_{x2}Ga_{1-x2}N$ ($0.08 \leq x2 \leq 0.2$) upper clad layer layered in this order on a substrate, one or a plurality of $In_zGa_{1-z}N$ ($0 \leq z \leq 0.2$) buffer layer(s) of 200 nm or less in thickness being disposed in the lower clad layer and/or the upper clad layer Preferably, in the above structure, the $In_zGa_{1-z}N$ ($0 \leq z \leq 0.2$) buffer layer(s) have a thickness and a composition determined to suppress ripples in a far field pattern in a direction perpendicular to a layer surface.

Preferably, in the above structure, either or each of the upper and lower clad layers had a total thickness in a range from 0.8 μm to 10 μm.

Preferably, in the above structure, at least one of the $In_zGa_{1-z}N$ ($0 \leq z \leq 0.2$) buffer layers disposed in the upper and/or lower clad layers is configured such that each of the $In_zGa_{1-z}N$ ($0 \leq z \leq 0.2$) buffer layers (having a dielectric constant $\in_1$) and the lower/upper clad layers (having a dielectric constant $\in_A$, neighboring to the opposite sides form a waveguide providing a waveguide mode (effective refractive index $n_i$, electric field distribution $f_i(x)$ in a direction perpendicular to the semiconductor layer); a waveguide layer for oscillation light of the semiconductor laser element as well as the lower clad layer and the upper clad layer form a waveguide providing a waveguide mode (effective refractive index $n_{eq}$, electric field distribution $f_{eq}(x)$ in the direction perpendicular to the semiconductor layer); these waveguide modes determine a parameter F; and the buffer layer has the thickness and the composition determined to satisfy a relationship of F<0.4, assuming that:

$F = 1/\{1 + (\Delta/\kappa)^2\}$ $\Delta = (\pi/\lambda)(n_{eq} - n_i)$ $\kappa(\omega \cdot \in_0 / 4) \int \{f_{eq}(x)^* \cdot \delta \in(x) \cdot f_i(x)\} dx$ $\delta \in(x) = \in_I - \in_A$ (x: within $In_zGa_{1-z}N$ buffer layer), 0 (x: other than it)

$$\omega = 2\pi c_0/\lambda$$

$\lambda$: wavelength of oscillation light in vacuum $c_0$: velocity of light in vacuum $\in_0$: dielectric constant in vacuum Preferably, the above structure includes a GaN lower guide layer (thickness; 0.08–0.15 μm) located between the lower clad layer and the active layer, and a GaN upper guide layer (thickness: 0.08–0.15 μm) located between the $Al_{x2}Ga_{1-x2}N$ ($0.08 \leq x_2 \leq 0.2$) upper clad layer and the active layer; a distance from the $In_zGa_{1-z}N$ ($0 \leq z \leq 0.2$) buffer layer disposed in the lower clad layer to the GaN upper guide layer, or a distance from the $In_zGa_{1-z}N$ ($0 \leq z \leq 0.2$) buffer layer disposed in the upper clad layer to the GaN upper guide layer is equal to d [μm]; an average aluminum composition of the lower clad layer disposed in a region from the $In_zGa_{1-z}N$ ($0 \leq z \leq 0.2$) buffer layer to the GaN lower guide layer, or an average aluminum composition of the upper clad layer disposed in a region from the $InGa_{1-z}N$ ($0 \leq z \leq 0.2$) buffer layer to the GaN upper guide layer satisfies a relationship of $0.08 \leq x \leq 0.2$; and a composition $p_1$ and a thickness $t_1$ [nm] of the buffer layer are determined to satisfy the following relationship:

$$0.2 \leq d < 0.3, \ 10 \leq t_1 \leq 1/(0.0080268+0.58533p_1), \text{ and } 0.001 \leq p_1 \leq 0.09$$

or $$0.2 \leq d < 0.3, \ 10 \leq t_1 \leq -8.9956+273.95p_1, \text{ and } 0.09 < p_1 \leq 0.2$$

or $$0.2 \leq d < 0.3, \ 1/(0.00017672+0.088604p_1) \leq t_1 \leq 200, \text{ and } 0.001 \leq p_1 \leq 0.09$$

or $$0.2 \leq d < 0.3, \ -103.63+2403.3p_1 < t_1 \leq 200, \text{ and } 0.09 < p_1 \leq 0.2$$

or $$0.3 \leq d < 0.4, \ 10 \leq t_1 \leq 1/(0.0067725+0.50578p_1), \text{ and } 0.001 \leq p_1 \leq 0.09$$

or $$0.3 \leq d < 0.4, \ 10 \leq t_1 \leq -10.86+321.88p_1, \text{ and } 0.09 < p_1 \leq 0.2$$

or $$0.3 \leq d < 0.4, \ 1/(0.0014296+0.13014p_1) \leq t_1 \leq 200, \text{ and } 0.001 \leq p_1 \leq 0.09$$

or $$0.3 \leq d < 0.4, \ -42.254+1273.3p_1 \leq t_1 \leq 200, \text{ and } 0.09 < p_1 \leq 0.2$$

or $$d \geq 0.4, \ 10 \leq t_1 \leq (0.0044063+0.3622p_1)^{(-1)}, \text{ and } 0.001 \leq p_1 \leq 0.09$$

or $$d \geq 0.4, \ 10 \leq t_1 \leq -17.958+479p_1, \text{ and } 0.09 < p_1 \leq 0.2$$

or $$d \geq 0.4, \ (0.0031223+0.26847p_1)^{(-1)} \leq t_1 \leq 200, \text{ and } 0.001 \leq p_1 \leq 0.09$$

or $$d \geq 0.4, \ -25.867+664.45p_1 \leq t_1 \leq 200, \ 0.09 < p_1 \leq 0.2$$

More desirably, the above structure includes a GaN lower guide layer (thickness: 0.08–0.15 μm) located between the lower clad layer and the active layer, and a GaN upper guide layer (thickness: 0.08–0.15 μm) located between the upper clad layer and the active layer; a distance from the $In_zGa_{1-z}N$ ($0 \leq z \leq 0.2$) buffer layer disposed in the lower clad layer to the GaN upper guide layer, or a distance from the $In_zGa_{1-z}N$ ($0 \leq z \leq 0.2$) buffer layer disposed in the upper clad layer to the GaN upper guide layer is equal to d [μm]; an average aluminum composition of the lower clad layer disposed in a region from the $In_zGa_{1-z}N$ ($0 \leq z \leq 0.2$) buffer layer to the GaN lower guide layer, or an average aluminum composition of the upper clad layer disposed in a region from the $In_zGa_{1-z}N$ ($0 \leq z \leq 0.2$) buffer layer to the GaN upper guide layer satisfies a relationship of $0.08 \leq x \leq 0.2$; and a composition $p_1$ and a thickness $t_1$ [nm] of the buffer layer are determined to satisfy the following relationship:

$$0.2 \leq d < 0.3, \ 10 \leq t_1 \leq (0.0097376+0.69281p_1)^{(-1)}, \text{ and } 0.001 \leq p_1 \leq 0.09$$

or $$0.2 \leq d < 0.3, \ 10 \leq t_1 \leq -6.6349+222.72p_1, \text{ and } 0.09 < p_1 \leq 0.2$$

or $$0.3 \leq d < 0.4, \ 10 \leq t_1 \leq (0.0080268+0.58533p_1)^{(-1)}, \text{ and } 0.001 \leq p_1 \leq 0.09$$

or $$0.3 \leq d < 0.4, \ 10 \leq t_1 \leq -8.9956+273.95p_1, \text{ and } 0.09 < p_1 \leq 0.2$$

or $$0.3 \leq d < 0.4, \ (0.0017672+0.088604p_1)^{(1)} \leq t_1 \leq 200, \text{ and } 0.001 \leq p_1 \leq 0.09$$

or $$0.3 \leq d < 0.4, \ -103.63+2403.3p_1 \leq t_1 \leq 200, \text{ and } 0.09 < p_1 \leq 0.2$$

or $$0.4 \leq d < 0.8, \ 10 \leq t_1 \leq 1/(0.0067725+0.50578p_1), \text{ and } 0.001 \leq p_1 \leq 0.09$$

or $$0.4 \leq d < 0.8, \ 10 \leq t_1 \leq -10.86+321.88p_1, \text{ and } 0.09 < p_1 \leq 0.2$$

or $$0.4 \leq d < 0.8, \ 1/(0.0014296+0.13014p_1) \leq t_1 \leq 200, \text{ and } 0.001 \leq p_1 \leq 0.09$$

or $$0.4 \leq d < 0.8, \ -42.254+1273.3p_1 \leq t_1 \leq 200, \text{ and } 0.09 < p_1 \leq 0.2$$

or $$d \geq 0.8, \ 10 \leq t_1 \leq (0.0044063+0.3622p_1)^{(-1)}, \text{ and } 0.001 \leq p_1 \leq 0.09$$

or $$d \geq 0.8, \ 10 \leq t_1 \leq -17.958+479p_1, \text{ and } 0.09 < p_1 \leq 0.2$$

or $$d \geq 0.8, \ (0.0031223+0.26847p_1)^{(-1)} \leq t_1 \leq 200, \text{ and } 0.001 \leq p_1 \leq 0.09$$

or $$d \geq 0.8, \ -25.867+664.45p_1 \leq t_1 \leq 200, \text{ and } 0.09 < p_1 \leq 0.2$$

Preferably, the above structure includes a lower guide layer (thickness: 0.08–0.15 μm) located between the lower clad layer and the active layer, and containing at least indium at a rate or 0% or more but smaller than 2%, and an upper guide layer (thickness: 0.08–0.15 μm) located between the upper clad layer and the active layer, and containing at least indium at a rate of 0% or more but smaller than 2%; a distance from the $In_zGa_{1-z}N$ ($0 \leq z \leq 0.2$) buffer layer disposed in the lower clad layer to the GaN upper guide layer, or a distance from the $In_zGa_{1-z}N$ ($0 \leq z \leq 0.2$) buffer layer disposed in the upper clad layer to the GaN upper guide layer is equal to d [μm]; an average aluminum composition of the lower clad layer disposed in a region from the InGaN buffer layer to the GaN lower guide layer, or an average aluminum composition of the upper clad layer disposed in a region from the InGaN buffer layer to the GaN upper guide layer satisfies a relationship of $0.08 \leq x \leq 0.2$; and a composition $p_1$ and a thickness $t_1$ [nm] of the buffer layer are determined to satisfy the following relationship:

$d \geq 0.4$, $10 \leq t_1 \leq (0.002182+0.2838p_1)^{(-1)}$, $t_1 \leq 200$, and $0.001 \leq p_1 \leq 0.09$ or $d \geq 0.4$, $10 \leq t_1 \leq -27.916+631.14p_1+418.94p_1^2$, $t_1 \leq 200$, and $0.09 < p_1 \leq 0.2$ or $d \geq 0.4$, $(-0.0013694+0.16355p_1)^{(-1)} \leq t_1 \leq 200$, and $0.001 \leq p_1 \leq 0.09$ or $d0.4$, $60.409-840.5p_1+10843p_1^2 \leq t_1 \leq 200$, and $0.09 < p_1 \leq 0.2$ or $0.3 \leq d < 0.4$, $10 \leq t_1 \leq (0.0028147+0.32751p_1)^{(-1)}$, $t_1 \leq 200$, and $0.001 \leq p_1 \leq 0.09$ or $0.3 \leq d < 0.4$, $10 \leq t_1 \leq -24.449+560.59p_1+222.45p_1^2$, $t_1 \leq 200$, and $0.09 < p_1 \leq 0.2$ or $0.3 \leq d < 0.4$, $(-0.0011606+0.13789p_1)^{(-1)} \leq t_1 \leq 200$, and $0.001 \leq p_1 \leq 0.09$ or $0.3 \leq d < 0.4$, $81.043-1159.4p_1+13537p_1^2 \leq t_1 \leq 200$, and $0.09 < p_1 \leq 0.2$ or $0.2 \leq d < 0.3$, $10 \leq t_1 \leq (0.0039942+0.39645p_1)^{(-1)}$, $t_1 \leq 200$, and $0.001 \leq p_1 \leq 0.09$ or $0.2 \leq d < 0.3$, $10 \leq t_1 \leq -21.331+488.13p_1$, $t_1 \leq 200$, and $0.09 < p_1 \leq 0.2$ or $0.2 \leq d < 0.3$, $(-0.00076798+0.093666p_1)^{(-1)} \leq t_1 \leq 200$, and $0.001 \leq p_1 \leq 0.09$ or $0.2 \leq d < 0.3$, $108.61-1511.6p_1+19016p_1^2 \leq t_1 \leq 200$, $0.09 < p_1 \leq 0.2$ More desirably, the above structure includes a lower guide layer (thickness: 0.08–0.15 μm) located between the lower clad layer and the active layer, and containing at least indium at a rate or 0% or more but smaller than 2%, and an upper guide layer (thickness: 0.08–0.15 μm) located between the upper clad layer and the active layer, and containing at least indium at a rate of 0% or more but smaller than 2%; a distance from the InGaN buffer layer to the upper or lower guide layer is equal to d [μm]; an average aluminum composition of the upper or lower clad layer disposed in a region from the InGaN buffer layer to the upper or lower guide layer satisfies a relationship of $0.08 \leq x \leq 0.2$; and a composition $p_1$ and a thickness $t_1$ [nm] of the buffer layer are determined to satisfy the following relationship:

$d \geq 0.4$, $10 \leq t_1 \leq 1/(0.0067725+0.50578p_1)$, $t_1 \leq 200$, and $0.001 \leq p_1 \leq 0.09$ or $d \geq 0.4$, $10 \leq t_1 \leq -10.86+321.88p_1$, $t_1 \leq 200$, and $0.09 < p_1 \leq 0.2$ or $d \geq 0.4$, $1/(0.0014296+0.13014p_1) \leq t_1 \leq 200$, and $0.001 \leq p_1 \leq 0.09$ or $d \geq 0.4$, $-42.254+1273.3p_1 \leq t_1 \leq 200$, and $0.09 < p_1 \leq 0.2$ or $0.3 \leq d < 0.4$, $10 \leq t_1 \leq 1/(0.0080268+0.58533p_1)$, $t_1 \leq 200$, and $0.001 \leq p_1 \leq 0.09$ or $0.3 \leq d < 0.4$, $10 \leq t_1 \leq -8.9956+273.95p_1$, and $0.09 < p_1 \leq 0.2$ or $0.3 \leq d < 0.4$, $1/(0.00017672+0.088604p_1) \leq t_1 \leq 200$, and $0.001 \leq p_1 \leq 0.09$ or $0.3 \leq d < 0.4$, $-103.63+2403.3p_1 \leq t_1 \leq 200$, and $0.09 < p_1 \leq 0.2$ or $0.2 \leq d < 0.3$, $10 \leq t_1 \leq (0.0097376+0.69281p_1)^{(-1)}$, and $0.001 \leq p_1 \leq 0.09$ or $0.2 \leq d < 0.3$, $10 \leq t_1 \leq -6.6349+222.72p_1$, $t_1 \leq 200$, and $0.09 < p_1 \leq 0.2$ Preferably, the above structure includes a lower guide layer (thickness: 0.08–0.15 μm) located between the lower clad layer and the active layer, and containing at least indium at a rate or 2% or more but smaller than 4%, and an upper guide layer (thickness: 0.08–0.15 μm) located between the upper clad layer and the active layer, and containing at least indium at a rate of 2% or more but smaller than 4%; a distance from the $In_zGa_{1-z}N$ ($0 \leq z \leq 0.2$) buffer layer disposed in the $Al_{x1}Ga_{1-x1}N$ ($0.08 \leq x1 \leq 0.2$) lower clad layer to the GaN upper guide layer, or a distance from the $In_zGa_{1-z}N$ ($0 \leq z \leq 0.2$) buffer layer disposed in the upper clad layer to the GaN upper guide layer is equal to d [μm]; an average aluminum composition of the lower clad layer disposed in a region from the InGaN buffer layer to the GaN lower guide layer, or an average aluminum composition of the upper clad layer disposed in a region from the InGaN buffer layer to the GaN upper guide layer satisfies a relationship of $0.08 \leq x \leq 0.2$; and a composition $p_1$ and a thickness $t_1$ [nm] of the buffer layer are determined to satisfy the following relationship:

$d \geq 0.4$, $10 \leq t_1 \leq (-0.00057916+0.20257p_1)^{(-1)}$, $t_1 \leq 200$, and $0.001 \leq p_1 \leq 0.09$ or $d \geq 0.4$, $10 \leq t_1 \leq 20.248-212.49p_1+6390p_1^2$, $t_1 \leq 200$, and $0.09 < p_1 \leq 0.2$ or $d \geq 0.4$, $(-0.0025782+0.14902p_1)^{(-1)} \leq t_1 \leq 200$, and $0.001 \leq p_1 \leq 0.09$ or $d \geq 0.4$, $345.07-6361.6p_1+39339p_1^2 \leq t_1 \leq 200$, and $0.09 < p_1 \leq 0.2$ or $0.3 \leq d < 0.4$, $10 \leq t_1 \leq (-0.000048081+0.22812p_1)^{(-1)}$, $t_1 \leq 200$, and $0.001 \leq p_1 \leq 0.09$ or $0.3 \leq d < 0.4$, $10 \leq t_1 \leq 6.7893+7.0097p_1+4779.4p_1^2$, $t_1 \leq 200$, and $0.09 < p_1 \leq 0.2$ or $0.3 \leq d < 0.4$, $(-0.0024039+0.13561p_1)^{(-1)} \leq t_1 \leq 200$, and $0.001 \leq p_1 \leq 0.09$ or $0.3 \leq d < 0.4$, $410.2-7584.7p_1+46101p_1^2 t_1 \leq 200$, and $0.09 < p_1 \leq 0.2$ or $0.2 \leq d < 0.3$, $10 \leq t_1 \leq (-0.000076166+0.27608p_1)^{(-1)}$, $t_1 \leq 200$, and $0.001 \leq p \leq 0.09$ or $0.2 \leq d < 0.3$, $10 \leq t_1 \leq -4.9294+213.76p_1+2827.4p_1^2$, $t_1 \leq 200$, and $0.09 < p_1 \leq 0.2$ or $0.2 \leq d < 0.3$, $(-0.0018961+0.10494p_1)^{(-1)} \leq t_1 \leq 200$, and $0.001 \leq p_1 \leq 0.09$ or $0.2 \leq d < 0.3$, $536.08-9966.9p_1+60707p_1 \leq t_1 \leq 200$, and $0.09 < p_1 \leq 0.2$ More desirably, the above structure includes a lower guide layer (thickness: 0.08–0.15 μm) located between the lower clad layer and the active layer, and containing at least indium at a rate or 2% or more but smaller than 4%, and an upper guide layer (thickness: 0.08–0.15 μm) located between the upper clad layer and the active layer, and containing at least indium at a rate of 2% or more but smaller than 4%; a distance from the $In_zGa_{1-z}N$ ($0 \leq z \leq 0.2$) buffer layer disposed in the lower clad layer to the GaN upper guide layer, or a distance from the $In_zGa_{1-z}N$ ($0 \leq z \leq 0.2$) buffer layer disposed in the upper clad layer to the GaN upper guide layer is equal to d [μm]; an average aluminum composition of the lower clad layer disposed in a region from the InGaN buffer layer to the GaN lower guide layer, or an average aluminum composition of the upper clad layer disposed in a region from the InGaN buffer layer to the GaN upper guide layer satisfies a relationship of $0.08 \leq x \leq 0.2$; and a composition $p_1$ and a thickness $t_1$ [nm] of the buffer layer are determined to satisfy the following relationship:

$d \geq 0.4$, $10 \leq t_1 \leq (0.002182+0.2838p_1)^{(-1)}$, $t_1 \leq 200$, and $0.001 \leq p_1 \leq 0.09$ or $d \geq 0.4$, $10 \leq t_1 \leq -27.916+631.14p_1+418.94p_1^2$, $t_1 \leq 200$, and $0.09 < p_1 \leq 0.2$ or $d \geq 0.4$, $(-0.0013694+0.16355p_1)^{(-1)} \leq t_1 \leq 200$, and $0.001 \leq p_1 \leq 0.09$ or $d \geq 0.4$, $60.409-840.5p_1+10843p_1^2 \leq t_1 \leq 200$, and $0.09 < p_1 \leq 0.2$ or $0.3 \leq d < 0.4$, $10 \leq t_1 \leq (0.0028147+0.32751p_1)^{(-1)}$, $t_1 \leq 200$, and $0.001 \leq p_1 \leq 0.09$ or $0.3 \leq d < 0.4$, $10 \leq t_1 \leq -24.449+560.59p_1+222.45p_1^2$, $t_1 \leq 200$, and $0.09 < p_1 \leq 0.2$ or $0.3 \leq d < 0.4$, $(-0.0011606+0.13789p_1)^{(-1)} \leq t_1 \leq 200$, and $0.001 \leq p_1 \leq 0.09$ or $0.3 \leq d < 0.4$, $81.043-1159.4p_1+13537p_1^2 \leq t_1 \leq 200$, and $0.09 < p_1 \leq 0.2$ or $0.2 \leq d < 0.3$, $10 \leq t_1 \leq (0.0039942+0.39645p_1)^{(-1)}$, $t_1 \leq 200$, and $0.001 \leq p_1 \leq 0.09$ or $0.2 \leq d < 0.3$, $10 \leq t_1 \leq -21.331+488.13p_1$, $t_1 \leq 200$, and $0.09 < p_1 \leq 0.2$ or $0.2 \leq d < 0.3$, $(-0.00076798+0.093666p_1)^{(-1)} \leq t_1 \leq 200$, and $0.001 \leq p_1 \leq 0.09$ or $0.2 \leq d < 0.3$, $108.61-1511.6p_1+19016p_1^2 \leq t_1 \leq 200$, and $0.09 < p_1 \leq 0.2$ Preferably, the above structure includes a lower guide layer (thickness: 0.08–0.15 μm) located between the lower clad layer and the active layer, and containing at least indium at a rate of 4% or more but smaller than 6%, and an upper guide layer (thickness: 0.08–0.15 μm) located between the upper clad layer and the active layer, and containing at least indium at a rate of 4% or more but smaller than 6%; a distance from the $In_zGa_{1-z}N$ ($0 \leq z \leq 0.2$) buffer layer disposed in the lower clad layer to the GaN upper guide layer, or a distance from the $In_zGa_{1-z}N$ ($0 \leq z \leq 0.2$) buffer layer disposed in the upper clad layer to the GaN upper guide layer is equal to d [μm]; an average aluminum composition of the lower clad layer disposed in a region from the InGaN buffer layer to the GaN lower guide layer, or an average aluminum composition of the upper clad layer disposed ill a region from the InGaN buffer layer to the GaN upper guide layer satisfies a relationship of $0.08 \leq x \leq 0.2$; and a composition $p_1$ and a thickness $t_1$ [nm] of the buffer layer are determined to satisfy the following relationship:

$d \geq 0.4$, $10 \leq t_1 \leq (-0.0036588+0.15804p_1)^{(-1)}$, $t_1 \leq 200$, and $0.001 \leq p_1 \leq 0.09$ or $d \geq 0.4$, $10 \leq t_1 \leq 1192.2-22262p_1+112670p_1^2$, $t_1 \leq 200$, and $0.09 < p_1 \leq 0.2$ or $d \geq 0.4$, $(-0.0035017+0.1457p_1)^{(-1)} \leq t_1 \leq 200$, and $0.001 \leq p_1 \leq 0.09$ or $d \geq 0.4$, $524.75-10029p_1+59406p_1^2 \leq t_1 \leq 200$, and $0.09 < p_1 \leq 0.2$ or $0.3 \leq d < 0.4$, $10 \leq t_1 \leq (-0.0029727+0.18468p_1)^{(-1)}$, $t_1 \leq 200$, and $0.001 \leq p_1 \leq 0.09$ or $0.3 \leq d < 0.4$, $10 \leq t_1 \leq 211.87-3874.3p_1+25752p_1^2$, $t_1 \leq 200$, and $0.09 < p_1 \leq 0.2$ or $0.3 \leq d < 0.4$, $(-0.0033291+0.13586p_1)^{(-1)} \leq t_1 \leq 200$, and $0.001 \leq p_1 \leq 0.09$ or $0.3 \leq d < 0.4$, $587.7-11264p_1+66380p_1^2 \leq t_1 \leq 200$, and $0.09 < p_1 \leq 0.2$ or $0.2 \leq d < 0.3$, $10 \leq t_1 \leq (-0.0031947+0.21903p_1)^{(-1)}$, $t_1 \leq 200$, and $0.001 \leq p_1 \leq 0.09$ or $0.2 \leq d < 0.3$, $10 \leq t_1 \leq 139.37-2496.5p_1+17831p_1^2$, $t_1 \leq 200$, and $0.09 < p_1 \leq 0.2$ or $0.2 \leq d < 0.3$, $(-0.0028237+0.11113p_1)^{(-1)} \leq t_1 \leq 200$, and $0.001 \leq p_1 \leq 0.09$ or $0.2 \leq d < 0.3$, $766.52-14773p_1+86589p_1^2 \leq t_1 \leq 200$, and $0.09 < p_1 \leq 0.2$ More desirably, the above structure includes a lower guide layer (thickness; 0.08–0.15 μm) located between the lower clad layer and the active layer, and containing at least indium at a rate or 4% or more but smaller than 6%, and an upper guide layer (thickness: 0.08–0.15 μm) located between the upper clad layer and the active layer, and containing at least indium at a rate of 4% or more but smaller than 6%; a distance from the $In_zGa_{1-z}N$ ($0 \leq z \leq 0.2$) buffer layer disposed in the lower clad layer to the GaN upper guide layer, or a distance from the $In_zGa_{1-z}N$ ($0 \leq z \leq 0.2$) buffer layer disposed in the upper clad layer to the GaN upper guide layer is equal to d [μm]; an average aluminum composition of the lower clad layer disposed in a region from the InGaN buffer layer to the GaN lower guide layer, or an average aluminum composition of the upper clad layer disposed in a region from the InGaN buffer layer to the GaN upper guide layer satisfies a relationship of $0.08 \leq x \leq 0.2$; and a composition $p_1$ and a thickness $t_1$ [nm] of the buffer layer are determined to satisfy the following relationship:

$d \geq 0.4$, $10 \leq t_1 \leq (-0.00057916+0.20257p_1)^{(-1)}$, $t_1 \leq 200$, and $0.001 \leq p_1 \leq 0.09$ or $d \geq 0.4$, $10 \leq t_1 \leq 20.248-212.49p_1+6390p_1^2$, $t_1 \leq 200$, and $0.09 < p_1 \leq 0.2$ or $d \geq 0.4$, $(-0.0025782+0.14902p_1)^{(-1)} \leq t_1 \leq 2.00$, and $0.001 \leq p_1 \leq 0.09$ or $d \geq 0.4$, $345.07-6361.6p_1+39339p_1^2 \leq t_1 \leq 200$, and $0.09 < p_1 \leq 0.2$ or $0.3 \leq d < 0.4$, $10 \leq t_1 \leq (-0.000048081+0.22812p_1)^{(-1)}$, $t_1 \leq 200$, and $0.001 \leq p_1 \leq 0.09$ or $0.3 \leq d < 0.4$, $10 \leq t_1 \leq 6.7893+7.0097p_1+4779.4p_1^2$, $t_1 \leq 200$, and $0.09 < p_1 \leq 0.2$ or $0.3 \leq d < 0.4$, $(-0.0024039+0.13561p_1)^{(-1)} \leq t_1 \leq 200$, and $0.001 \leq p_1 \leq 0.09$ or $0.3 \leq d < 0.4$, $410.2-7584.7p_1+46101p_1^2 \leq t_1 \leq 200$, and $0.09 < p_1 \leq 0.2$ or $0.2 \leq d < 0.3$, $10 \leq t_1 \leq (-0.000076166+0.27608p_1)^{(-1)}$, $t_1 \leq 200$, and $0.001 \leq p_1 \leq 0.09$ or $0.2 \leq d < 0.3$, $10 \leq t_1 \leq -4.9294+213.76p_1+2827.4p_1^2$, $t_1 \leq 200$, and $0.09 < p_1 \leq 0.2$ or $0.2 \leq d < 0.3$, $(-0.0018961+0.10494p_1)^{(-1)} \leq t_1 \leq 200$, and $0.001 \leq p_1 \leq 0.09$ or $0.2 \leq d < 0.3$, $536.08-9966.9p_1+60707p_1 \leq t_1 \leq 200$, and $0.09 < p_1 \leq 0.2$ Preferably, the above structure includes a lower guide layer (thickness: 0.08–0.15 μm) located between the lower clad layer and the active layer, and containing at least indium at a rate or 6% or more but smaller than 7%, and an upper guide layer (thickness: 0.08–0.15 μm) located between the upper clad layer and the active layer, and containing at least indium at a rate of 6% or more but smaller than 7%; a distance from the $In_zGa_{1-z}N$ ($0 \leq z \leq 0.2$) buffer layer disposed in the lower clad layer to the GaN upper guide layer, or a distance from the $In_zGa_{1-z}N$ ($0 \leq z \leq 0.2$) buffer layer disposed in the upper clad layer to the GaN upper guide layer is equal to d [μm]; an average aluminum composition of the lower clad layer disposed in a region from the InGaN buffer layer to the GaN lower guide layer, or an average aluminum composition of the upper clad layer disposed in a region from the InGaN buffer layer to the GaN upper guide layer satisfies a relationship of $0.08 \leq x \leq 0.2$; and a composition $p_1$ and a thickness $t_1$ [nm] of the buffer layer are determined to satisfy the following relationship:

$$d \geq 0.4, 10 \leq t_1 \leq (-0.0036588+0.15804p_1)^{(-1)}, t_1 \leq 200, \text{ and } 0.001 \leq p_1 \leq 0.09$$

or $$d \geq 0.4, 10 \leq t_1 \leq 1192.2-22262p_1+112670p_1^2, t_1 \leq 200, \text{ and } 0.09 < p_1 \leq 0.02$$

or $$d \geq 0.4, (-0.0041761+0.13916p_1)^{(-1)} \leq t_1 \leq 200, \text{ and } 0.001 \leq p_1 \leq 0.09$$

or $$d \geq 0.4, 958.16-18852p_1+105870p_1^2 \leq t_1 \leq 200, \text{ and } 0.09 < p_1 \leq 0.2$$

or $$0.3 \leq d < 0.4, \text{ and } 10 \leq t_1 \leq (-0.0038108+0.16856p_1)^{(-1)}, t_1 \leq 200, \text{ and } 0.001 \leq p_1 \leq 0.09$$

or $$0.3 \leq d < 0.4, \text{ and } 10 \leq t_1 \leq 973.69-18186p_1+93321p_1^2, t_1 \leq 200, \text{ and } 0.09 < p_1 \leq 0.2$$

or $$0.3 \leq d < 0.4, \text{ and } (-0.0040339+0.13236p_1)^{(-1)} \leq t_1 \leq 200, \text{ and } 0.001 \leq p_1 \leq 0.09$$

or $$0.3 \leq d < 0.4, \text{ and } 1056.2-20815p_1+116460p_1^2 \leq t_1 \leq 200, \text{ and } 0.09 < p_1 \leq 0.2$$

or $$0.2 \leq d < 0.3, 10 \leq t_1 \leq (-0.0040773+0.19547p_1)^{(-1)}, t_1 \leq 200, \text{ and } 0.001 \leq p_1 \leq 0.09$$

or $$0.2 \leq d < 0.3, 10 \leq t_1 \leq 539.75-10088p_1+54757p_1^2, t_1 \leq 200, \text{ and } 0.09 < p_1 \leq 0.2$$

or $$0.2 \leq d < 0.3, (-0.0035424+0.11285p_1)^{(-1)} \leq t_1 \leq 200, \text{ and } 0.001 \leq p_1 \leq 0.09$$

or $$0.2 \leq d < 0.3, 1335.8-26428p_1+147260p_1^2 \leq t_1 \leq 200, \text{ and } 0.09 < p_1 \leq 0.02$$

More desirably, the above structure includes a lower guide layer (thickness: 0.08–0.15 μm) located between the lower clad layer and the active layer, and containing at least indium at a rate or 6% or more but smaller than 7%, and an upper guide layer (thickness: 0.08–0.15 μm) located between the upper clad layer and the active layer, and containing at least indium at a rate of 6% or more but smaller than 7%; a distance from the $In_zGa_{1-z}N$ ($0 \leq z \leq 0.2$) buffer layer disposed ill the lower clad layer to the GaN upper guide layer, or a distance from the $In_zGa_{1-z}N$ ($0 \leq z \leq 0.2$) buffer layer disposed in the upper clad layer to the CaN upper guide layer is equal to d [μm]; an average aluminum composition of the lower clad layer disposed in a region from the InGaN buffer layer to the GaN lower guide layer, or an average aluminum composition of the upper-clad layer disposed in a region from the InGaN buffer layer to the GaN upper guide layer satisfies a relationship of $0.08 \leq x \leq 0.2$; and a composition $p_1$ and a thickness $t_1$ [nm] of the buffer layer are determined to satisfy the following relationship:

$$d \geq 0.4, 10 \leq t_1 \leq (-0.0036588+0.15804p_1)^{(-1)}, t_1 \leq 200, \text{ and } 0.001 \leq p_1 \leq 0.09$$

or $$d \geq 0.4, 10 \leq t_1 \leq 1192.2-22262p_1+112670p_1^2, t_1 \leq 200, \text{ and } 0.09 < p_1 \leq 0.2$$

or $$d \geq 0.4, (-0.0035017+0.14571p_1)^{(-1)} \leq t_1 \leq 200, \text{ and } 0.001 \leq p_1 \leq 0.09$$

or $$d \geq 0.4, 524.75-10029p_1+59406p_1^2 \leq t_1 \leq 200, \text{ and } 0.09 < p_1 \leq 0.2$$

or $$0.3 \leq d < 0.4, \text{ and } 10 \leq t_1 \leq (-0.0029727+0.18468p_1)^{(-1)}, t_1 \leq 200, \text{ and } 0.001 \leq p_1 \leq 0.09$$

or $$0.3 \leq d < 0.4, \text{ and } 10 \leq t_1 \leq 211.87-3874.3p_1+25752p_1^2, t_1 \leq 200, \text{ and } 0.09 < p_1 \leq 0.2$$

or $$0.3 \leq d < 0.4, \text{ and } (-0.0033291+0.13586p_1)^{(-1)} \leq t_1 \leq 200, \text{ and } 0.001 \leq p_1 \leq 0.09$$

or $$0.3 \leq d < 0.4, \text{ and } 587.7-11264p_1+66380p_1^2 \leq t_1 \leq 200, \text{ and } 0.09 < p_1 \leq 0.02$$

or $$0.2 \leq d < 0.3, 10 \leq t_1 \leq (-0.0031947+0.21903p_1)^{(-1)}, t_1 \leq 200, \text{ and } 0.001 \leq p_1 \leq 0.09$$

or $$0.2 \leq d < 0.3, 10 \leq t_1 \leq 139.37-2496.5p_1+17831p_1^2, t_1 \leq 200, \text{ and } 0.09 < p_1 \leq 0.2$$

or $$0.2 \leq d < 0.3, (-0.0028237+0.11113p_1)^{(-1)} \leq t_1 \leq 200, \text{ and } 0.001 \leq p_1 \leq 0.09$$

or $$0.2 \leq d < 0.3, 766.52-14773p_1+86589p_1^2 \leq t_1 \leq 200, \text{ and } 0.09 < p_1 \leq 0.2$$

Preferably, the above structure includes a lower guide layer (thickness 0.08–0.15 μm) located between the lower clad layer and the active layer, and containing at least indium at a rate or 7% or more but smaller than 10%, and an upper guide layer (thickness: 0.08–0.15 μm) located between the upper clad layer and the active layer, and containing at least indium at a rate of 7% or more but smaller than 10%; a distance from the $In_zGa_{1-z}N$ ($0 \leq z \leq 0.2$) buffer layer disposed in the lower clad layer to the GaN upper guide layer, or a distance from the $In_zGa_{1-z}N$ ($0 \leq z \leq 0.2$) buffer layer disposed in the upper clad layer to the GaN upper guide layer is equal to d [$\mu$m]; an average aluminum composition of the lower clad layer disposed in a region from the InGaN buffer layer to the GaN lower guide layer, or an average aluminum composition of the upper clad layer disposed in a region from the InGaN buffer layer to the GaN upper guide layer satisfies a relationship of $0.08 \leq x \leq 0.2$; and a composition $p_1$ and a thickness $t_1$ [nm] of the buffer layer are determined to satisfy the following relationship:

$d \leq 0.4$, $10 \leq t_1 \leq (-0.004347+0.14719p_1)^{(-1)}$, $t_1 \leq 200$, and $0.001 \leq p_1 \leq 0.09$ or $d \geq 0.4$, $10 \leq t_1 \leq 858.55-16866p_1+95186p_1^2$, $t_1 \leq 200$, and $0.09 < p_1 \leq 0.2$ or $d \geq 0.4$, $(-0.005134+0.1362p_1)^{(-1)} \leq t_1 \leq 200$, and $0.001 \leq p_1 \leq 0.09$ or $d \geq 0.4$, $2497.8-49961p_1+264020p_1^2 \leq t_1 \leq 200$, and $0.09 < p_1 \leq 0.2$ or $0.3 \leq d < 0.4$, and $10 \leq t_1 \leq (-0.0044872+0.15446p_1)^{(-1)}$, $t_1 \leq 200$, and $0.001 \leq p_1 \leq 0.09$ or $0.3 \leq d < 0.4$, and $10 \leq t_1 \leq 780.26-15299p_1+86683p_1^2$, $t_1 \leq 200$, and $0.09 < p_1 \leq 0.2$ or $0.3 \leq d < 0.4$, and $(-0.0049851+0.13106p_1)^{(-1)} \leq t_1 \leq 200$, and $0.001 \leq p_1 \leq 0.09$ or $0.3 \leq d < 0.4$, and $2705.9-54159p_1+285760p_1^2 \leq t_1 < 200$, and $0.09 < p_1 \leq 0.2$ or $0.2 \leq d < 0.3$, $10 \leq t_1 \leq (-0.0048885+0.17591p_1)^{(-1)}$, $t_1 < 200$, and $0.001 \leq p_1 \leq 0.09$ or $0.2 \leq d < 0.3$, $10 \leq t_1 \leq 597.65-11661p_1+66983p_1^2$, $t_1 \leq 200$, and $0.09 < p_1 \leq 0.2$ or $0.2 \leq d < 0.3$, $(-0.0044282+0.11446p_1)^{(-1)} \leq t_1 \leq 200$, and $0.001 \leq p_1 0.09$ or $0.2 \leq d < 0.3$, $3324.9-66656p_1+351050p_1^2 \leq t_1 \leq 200$, and $0.09 < p_1 \leq 0.2$ More desirably, the above structure includes a lower guide layer (thickness: 0.08–0.15 $\mu$m) located between the lower clad layer and the active layer, and containing at least indium at a rate or 7% or more but smaller than 8, and an upper guide layer (thickness: 0.08–0.15 $\mu$m) located between the upper clad layer and the active layer, and containing at least indium at a rate of 7% or more but smaller than 8; a distance from the $In_zGa1_{1-z}N$ ($0 \leq z \leq 0.2$) buffer layer disposed in the lower clad layer to the GaN upper guide layer, or a distance from the $In_zGa_{1-z}N$ ($0 \leq z0.2$) buffer layer disposed in the upper clad layer to the GaN upper guide layer is equal to d [$\mu$m]; an average aluminum composition of the lower clad layer disposed in a region from the InGaN buffer layer to the GaN lower guide layer, or an average aluminum composition of the upper clad layer disposed in a region from the InGaN buffer layer to the GaN upper guide layer satisfies a relationship of $0.08 \leq x \leq 0.2$; and a composition $p_1$ and a thickness $t_1$ [nm] of the buffer layer are determined to satisfy the following relationship:

$d \geq 0.4$, $10 \leq t_1 \leq (-0.0036588+0.15804p_1)^{(-1)}$, $t_1 \leq 200$, and $0.001 \leq p_1 \leq 0.09$ or $d \geq 0.4$, $10 \leq t_1 < 1192.2-22262p_1+112670p_1^2$, $t_1 \leq 200$, and $0.09 < p_1 \leq 0.2$ or $d \geq 0.4$, $(-0.0041761+0.13916p_1)^{(-1)} \leq t_1 \leq 200$, and $0.001 \leq p_1 \leq 0.09$ or $d \geq 0.4$, $958.16-18852p_1+105870p_1^2 \leq t_1 \leq 200$, and $0.09 < p_1 \leq 0.2$ or $0.3 \leq d < 0.4$, and $10 \leq t_1 \leq (-0.0038108+0.16856p_1)^{(-1)}$, $t_1 \leq 200$, and $0.001 \leq p_1 \leq 0.09$ or $0.3 \leq d < 0.4$, and $10 \leq t_1 \leq 973.69-18186p_1+93321p_1^2$, $t_1 \leq 200$, and $0.09 < p_1 \leq 0.2$ or $0.3 \leq d < 0.4$, and $(-0.0040339+0.13236p_1)^{(-1)} \leq t_1 \leq 200$, and $0.001 \leq p_1 \leq 0.09$ or $0.3 \leq d < 0.4$, and $1056.2-20815p_1+116460p_1^2 \leq t_1 \leq 200$, and $0.09 < p_1 \leq 0.2$ or $0.2 \leq d < 0.3$, $10 \leq t_1 \leq (-0.0040773+0.19547p_1)^{(-1)}$, $t_1 \leq 200$, and $0.001 \leq p_1 \leq 0.09$ or $0.2 \leq d < 0.3$, $10 \leq t_1 \leq 539.75-10088p_1+54757p_1^2$, $t_1 \leq 200$, and $0.09 < p_1 \leq 0.2$ or $0.2 \leq d < 0.3$, $(-0.0035424+0.11285p_1)^{(-1)} \leq t_1 \leq 200$, and $0.001 \leq p_1 \leq 0.09$ or $0.2 \leq d < 0.3$, $1335.8-26428p_1+147260p_1^2 \leq t_1 \leq 200$, and $0.09 < p_1 \leq 0.02$ Alternatively, the above structure includes a lower guide layer (thickness: 0.08–0.15 $\mu$m) located between the lower clad layer and the active layer, and containing at least indium at a rate or 8% or more but smaller than 10%, and an upper guide layer (thickness. 0.08–0.15 µm) located between the upper clad layer and the active layer, and containing at least indium at a rate of 8% or more but smaller than 10%; a distance from the $In_zGa_{1-z}N$ ($0 \leq z \leq 0.2$) buffer layer disposed in the lower clad layer to the GaN upper guide layer, or a distance from the $In_zGa_{1-z}N$ ($0 \leq z \leq 0.2$) buffer layer disposed in the upper clad layer to the GaN upper guide layer is equal to d [µm]; an average aluminum composition of the lower clad layer disposed in a region from the InGaN buffer layer to the GaN lower guide layer, or an average aluminum composition of the upper clad layer disposed in a region from the InGaN buffer layer to the GaN upper guide layer satisfies a relationship of $0.08 \leq x \leq 0.2$; and a composition $p_1$ and a thickness $t_1$ [nm] of the buffer layer are determined to satisfy the following relationship:

$$d \geq 0.4,\ 10 \leq t_1 \leq (-0.004347+0.14719 p_1)^{(-1)},\ t_1 \leq 200,\ \text{and}\ 0.001 \leq p_1 \leq 0.09$$

or $$d \geq 0.4,\ 10 \leq t_1 \leq 858.55 - 16866 p_1 + 95186 p_1^2,\ t_1 \leq 200,\ \text{and}\ 0.09 < p_1 \leq 0.02$$

or $$d \geq 0.4,\ (-0.005134 + 0.1362 p_1)^{(-1)} \leq t_1 \leq 200,\ \text{and}\ 0.001 \leq p_1 \leq 0.09$$

or $$d \geq 0.4,\ 2497.8 - 49961 p_1 + 264020 p_1^2 \leq t_1 \leq 200,\ \text{and}\ 0.09 < p_1 \leq 0.2$$

or $$0.3 \leq d < 0.4,\ \text{and}\ 10 \leq t_1 \leq (-0.0044872 + 0.15446 p_1)^{(-1)},\ t_1 \leq 200,\ \text{and}\ 0.001 \leq p_1 \leq 0.09$$

or $$0.3 \leq d < 0.4,\ \text{and}\ 10 \leq t_1 \leq 750.25 - 15299 p_1 + 86683 p_1^2,\ t_1 \leq 200,\ \text{and}\ 0.09 < p_1 \leq 0.2$$

or $$0.3 \leq d < 0.4,\ \text{and}\ (-0.0049851 + 0.13106 p_1)^{(-1)} \leq t_1 \leq 200,\ \text{and}\ 0.001 \leq p_1 \leq 0.09$$

or $$0.3 \leq d < 0.4,\ \text{and}\ 2705.9 - 54159 p_1 + 285760 p_1^2 \leq t_1 \leq 200,\ \text{and}\ 0.09 < p_1 \leq 0.2$$

or $$0.2 \leq d < 0.3,\ 10 \leq t_1 \leq (-0.0048885 + 0.17591 p_1)^{(-1)},\ t_1 \leq 200,\ \text{and}\ 0.001 \leq p_1 \leq 0.09$$

or $$0.2 \leq d < 0.3,\ 10 \leq t_1 \leq 597.65 - 11661 p_1 + 66983 p_1^2,\ t_1 \leq 200,\ \text{and}\ 0.09 < p_1 \leq 0.2$$

or $$0.2 \leq d < 0.3,\ (-0.0044282 + 0.11446 p_1)^{(-1)} \leq t_1 \leq 200,\ \text{and}\ 0.001 \leq p_1 \leq 0.09$$

or $$0.2 \leq d < 0.3,\ 3324.9 - 66656 p_1 + 351050 p_1^2 \leq t_1 \leq 200,\ \text{and}\ 0.09 < p_1 \leq 0.2$$

Preferably, at least one $In_zGa_{1-z}N$ buffer layer containing indium at a rate of 0% or more but smaller than 20% is interposed between the lower clad layer and the substrate.

The invention provides an optical information reproducing device for reproducing recorded information recorded on an optical disk by performing photo-conversion of reflected light of laser light emitted onto the optical disk having an information recording surface, wherein any one of the preceding semiconductor laser elements is used as a light source In the specification, the x-axis is perpendicular to the semiconductor layer surface. κ indicates a coupling coefficient between modes I and II. λ indicates an oscillation wavelength in a vacuum. $\omega(=2\pi c/\lambda,$ c: velocity of light in vacuum) indicates an oscillation angular frequency. $\in_0$ indicates a dielectric constant in a vacuum. $\mu_0$ indicates a magnetic permeability in a vacuum. An integration range in a calculation formula of κ is within the n-type InGaN buffer layer, $f_{eq}(x)$ and $f_i(x)$ satisfy the following relationship of normalization, respectively.

$$(n_{eq}/2/\omega/\mu 0) \int |f_{eq}(x)|^2 dx = 1$$

$$(n_i/2/\omega/\mu 0) \int |f_i(x)|^2 dx = 1$$

where the integration is performed in a range from a negative infinite to a positive infinite.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 3A shows the case of F<0.4, and FIG. 3B shows the case of F>0.4;

DESCRIPTION OF THE PREFERRED EMBODIMENTS

FIGS. 1–18 shows embodiments of the invention. The embodiments of the invention will now be described.

Figure 1:
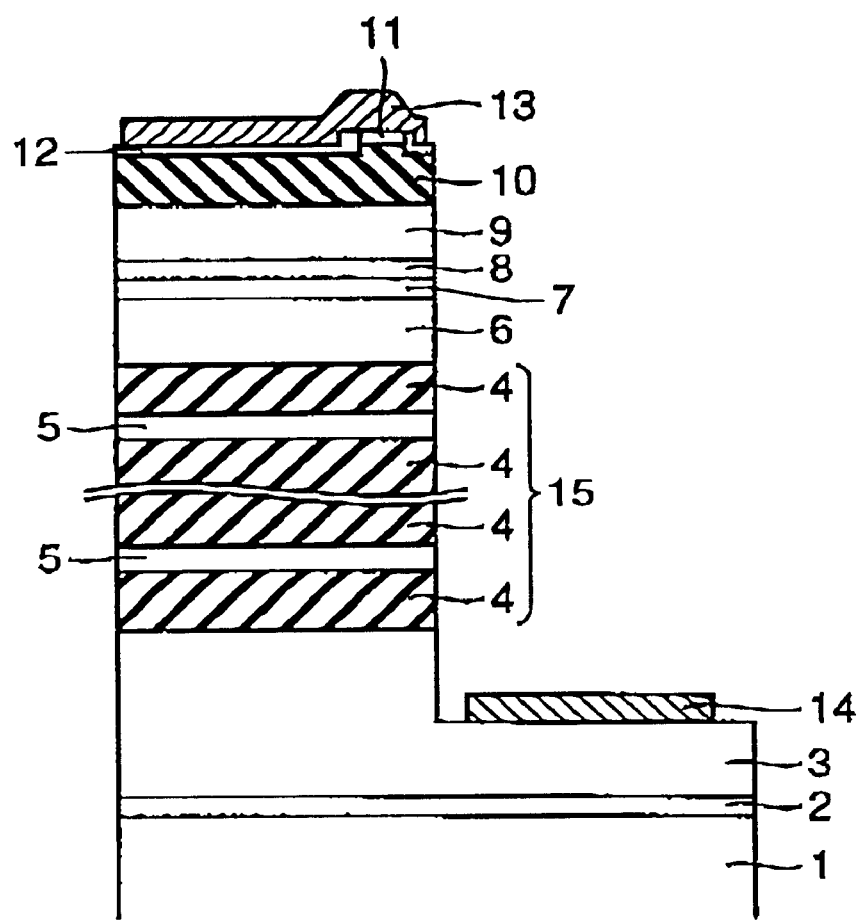
FIG. 1 is a schematic view showing a semiconductor laser element according to the invention.

FIG. 1 is a schematic view showing a semiconductor laser element of the invention. FIG. 1 shows a section of a waveguide portion of the semiconductor laser element, and particularly shows a section perpendicular to a resonator. The semiconductor laser element includes various nitride-contained semiconductor layers, and more specifically includes a (0001) C-surface sapphire substrate 1 (thickness: 30–300 μm), a GaN low-temperature buffer layer 2 (thickness: 0–100 nm), an n-type GaN contact layer 3 (thickness; 0.1–10 μm), an n-type AlGaInN clad layer 15 (total thickness: 0.8–10 μm) formed of an alternate multi-layer structure (n-type clad layer, n-type buffer layer, . . . , n-type buffer layer and n-type clad layer) including n-type $Al_xGa_{1-x}N$ (0.08≦x≦0.2) clad layers 4 (individual thickness; 0.2–0.8 μm) and n-type $In_pGa_{1-p}N$ (0<p≦0.2) buffer layers 5 (individual thickness: 10–200 nm), an n-type $In_sGa_{1-s}N$ (0≦s≦0.1) guide layer 6 (thickness: 0.08–0.15 μm), a multiple quantum well active layer 7 (light emission wavelength: 370–430 nm, total thickness: 5–60 nm) formed of an alternate multilayer structure (barrier layer, well layer, . . . , well layer and barrier layer) including $In_wGa_{1-w}N$ (0<w<0.2) well layers and $In_vGa_{1-v}N$ (0<v<w) barrier layers, a p-type $AL_zGa_tN$ (0≦z≦0.3) carrier block layer 8 (thickness: 0–20 nm), a p-type $In_rGa_{1-r}N$ (0≦t≦0.1) guide layer 9 (thickness: 0.08–0.15 μm), a p-type $Al_yGa_{1-y}N$ (0.08≦y≦0.2) clad layer 10 (thickness: 0.2–0.8 μm) and a p-type GaN contact layer 11 (thickness: 0.01–10 μm).

Above these layers, an insulating film 12 of a required configuration is formed in a mesa-like form on the substantially whole surface. A positive electrode 13(e.g., Pd/Au, Ni/Pd/Au or Pd/Pt/Au) is formed over the substantially whole surface in a mesa-like form including the whole of the exposed surface of p-type GaN contact layer 11. A negative electrode 14 (e.g., Ti/Al, Zr/Al or Hf/Al) is formed on a portion of an exposed surface of n-type GaN contact layer 3. The mesa is formed of the n-type GaN contact layer, n-type InGaN buffer layer, n-type AlGaInN clad layer, n-type GaN guide layer, InGaN multiple quantum well active layer, p-type AlGaN carrier block layer, p-type AlGaN clad layer, p-type GaN contact layer, insulating film (more specifically, only in the required region) and positive electrode. The opposite end surfaces of the stripe function as mirrors, and form a photo-resonator.

Then, description will be given on a method of manufacturing the semiconductor laser element of this embodiment.

First, the (0001) C-surface sapphire substrate (thickness: 30–300 μm) is cleaned. The cleaned (0001) C-surface sapphire substrate is moved into a MOCVD device, and is subjected to cleaning within an atmosphere of $H_2$ at a temperature of about 1100° C. After lowering the temperature, $NH_3$ and trimethyl gallium (TMG) at 600° C. are supplied at rates of 5 liter/minute and 20 mol/minute, respectively, while flowing hydrogen ($H_2$) at 10 liter/minute as a carrier gas. Thereby, the GaN low temperature buffer layer of 0–100 nm in thickness is grown. The low temperature buffer layer is not restricted to GN. Alternatively, trimethyl aluminum (TMA), TMG or NH3 may be used, and thereby an AlN or GaAlN film may be used without causing no adverse effect.

Then, the temperature is raised to about 1050° C. while flowing $N_2$ and $NH_3$ each at a rate of 5 liter/minute. When the temperature rises, the carrier gas is changed from $N_2$ to $H_2$, and TMG and $SiH_4$ are supplied at rates of 100 μmol/minute and 10 nmol/minute, respectively, so that the n-type GaN contact layer of 0.1–10 μm is grown. Then, the flow rate of TMG is adjusted to 50 μmol/minute, and the TMA is supplied at a constant rate so that the n-type $Al_{x1}Ga_{1-x1}N$ ($0.08 \leq x1 \leq 0.2$) clad layer of 0.2–0.8 μm in thickness is grown. Then, the supply of TMG and TMA is stopped, and the carrier gas is changed from $H_2$ to $N_2$ again. After lowering the temperature to about 800° C., the flow rate of TMG is adjusted to 15 μmol/minute, and the TMI is supplied at a constant rate. Thereby, the $In_pGa_{1-p}N$ ($0<p \leq 0.2$) buffer layer of 0–200 nm in thickness is grown.

Then, the supply of TMI and TMG is stopped, and the temperature is raised to 1050° C. again. The carrier gas is changed from $N_2$ to $H_2$. The flow rate of TMG is adjusted to 50 μmol/minute, and the TMA is supplied at a constant rate. Thereby, the n-type $Al_{x2}Ga_{1-x2}N$ ($0.08 \leq x2 \leq 0.2$) clad layer of 0.2–0.8 μm in thickness is grown. The above growth of the n-type AlGaN layer and the n-type InGaN layer is repeated to grow the n-type AlGaInN clad layer, which has a total thickness of 0.8–10 μm, and is formed of the alternate multilayer structure (n-type clad layer, n-type buffer layer, . . . , n-type buffer layer and n-type clad layer) including the n-type AlGaN clad layers and n-type InGaN buffer layers When growth of the AlGaInN ends, the supply of TMA is stopped, and the flow rate of TMG is adjusted to 100 μmol/minute so that the n-type GaN guide layer of 0.08–0.15 μm in thickness is grown.

Thereafter, the supply of TMG is stopped, and the carrier gas is changed from $H_2$ to $N_2$ again. After lowering the temperature to 700° C., the trimethyl indium (TMI) which is an indium material is supplied at a constant rate, and the TMG is supplied at a rate of 15 μmol/minute so that the barrier layer made of $In_vGa_{1-v}N$ is grown. Thereafter, the supply rate of TMI is increased to a certain value so that the well layer made of $In_wGa_{1-w}N$ is grown. The multiple quantum well (MQW) active layer formed of the alternate multilayer structure (barrier layer, well layer, . . . , well layer and barrier layer) including the InGaN barrier layer and the InGaN well layer. The contents of InGaN in the barrier layers and well layers as well as the thicknesses thereof are designed to provide the light emission wavelength in a range of 370–430 nm. The flow rate of TMI which is supplied during the growth is adjusted to provide the film of the indium composition equal to a designed value. When the growth of the MQW active layer ends, the supply of TMI and TMG is stopped, and the temperature is raised to 1050° C. again. The carrier gas is changed from $N_2$ to $H_2$ again, and the TMG is supplied at a rate of 50 μmol/minute. Also, the TMA is supplied at an appropriate rate, and bis cyclopentadienyl magnesium ($Cp_2Mg$), which is a p-type doping material, is flowed at a rate of 10 nmol/minute so that the p-type $Al_zGa_{1-z}N$ ($0 \leq z \leq 0.3$) carrier block layer of 0–20 nm in thickness is grown.

When growth of the carrier block layer stops, the supply of TMA is stopped, and the supply rate of TMG is adjusted to 100 μmol/minute so that the p-type CaN guide layer of 0.08–0.15 μm in thickness is grown. Thereafter, the supply rate of TMG is adjusted to 50 μm/minute, and the TMA is supplied at a constant rate so that the p-type $Al_yGa_{1-y}N$ ($0.08 \leq y \leq 0.2$) clad layer of 0.2–0.8 μm in thickness is grown. Finally, the supply rate of TMG is adjusted to 100 μmol/minute, and the supply of TMA is stopped so that the p-type GaN contact layer of 0.01–10 μm in thickness is grown. Thereby, the growth of the light-emitting element structure ends When the growth ends, the supply of TMG and $Cp_2Mg$ is stopped, and the temperature is lowered. Then, the structure at a room temperature is taken out from the MOCVD device.

The outermost surface (last grown surface) of the film having the laser structure of the embodiment had a surface roughness of about 10 nm in average value (Ra), and thus exhibited a very good flatness. Further, a plurality of wafers were prepared. Each wafer had the structure formed of the (0001) C-surface sapphire substrate, GaN low temperature buffer layer, n-type GaN contact layer, and n-type AlGaInN clad layer (thickness: about 1 μm) having the alternate multilayer structure (a-type clad layer, n-type buffer layer, . . . , n-type buffer layer and n-type clad layer) including the n-type AlGaN clad layers and the n-type InGaN buffer layers. The surfaces of these wafers were observed with an optical microscope of a magnification of about 200 times. Almost no hexagonal crack was present in these wafers More specifically, only one among the ten wafers contained the hexagonal crack at its periphery. The problem of the prior art could be overcome owing to the fact that the n-type AlGaN clad layers were grown at multiple levels, between which the buffer layers containing indium were interposed.

Thereafter, the photolithography technique and reactive ion etching technique are used to effect the etching on the p-type $Al_yGa_{1-y}N$ ($0.08 \leq y \leq 0.2$) clad layer while leaving the p-type GaN contact layer in the stripe form having a stripe width of 3 μm. Thereby, the light waveguide is formed. Then, the insulating film is formed by the photolithography technique in the region except for a portion, where the p-type GaN contact layer is in contact with the electrode. Thereafter, the reactive ion etching technique is used to remove a portion, where the negative electrode is to be formed, from a region between the wafer top surface and a middle position of the n-type GaN contact layer. Thereafter, the positive electrode is formed on the exposed portion of the surface of the p-type GaN contact layer in the mesa-like form. The material of the electrodes may be Au/Ni or Au/Pd. The negative electrode is formed substantially entirely over the exposed surface portion of the n-type GaN contact layer. The material of the negative electrode may be Al/Ti or Au/W.

Finally, cleavage or dry etching is performed to achieve the element length of about 0.5 mm, and the end surface forming the mirror is formed.

In the foregoing manners, the laser which has the blue violet light emitting wavelength and uses the nitride compound semiconductor shown in FIG. 1 is manufactured.

In the semiconductor laser element, the single or multiple n-type InGaN buffer layer(P) disposed in the n-type AlGaInN clad layer have the film thickness and the indium content, which are designed to provide such conditions that the laser oscillation mode does not couple to the three-layer slab waveguide formed of each n-type InGaN buffer layer and the neighboring layers, i.e., the n-type AlGaN clad layers may not occur.

If InGaN is used as the buffer layer in the AlGaN clad layer, the AlGaN clad, InGaN and AlGaN clad form the three-layer slab waveguide, resulting in a new problem that the laser oscillation mode couples to the foregoing three-layer slab waveguide. When the laser oscillation mode couples to the n-type InGaN buffer layer, this causes lowering of the factor of confinement of the laser oscillation mode in the active layer, and thereby causes rising of the threshold current density. Further, the mode spreads into the n-type GaN contact layer to a large extent, and the electric field amplitude of the laser oscillation mode in the n-type GaN contact layer increases. This causes generation of ripples in the FFP (fore field pattern), and causes a problem of disturbance of the profile in the light collected point in the case where the above semiconductor laser is used as a light source of the optical reproducing device such as an optical pickup. As a result, the record density on the optical disk or the like lowers.

These problems can be avoided by appropriately setting the thickness and the indium composition of the interposed n-type InGaN buffer layer(s).

Description will now be given on the conditions for suppressing coupling of the laser oscillation mode to the n-type InGaN buffer layer in the case where only one n-type InGaN buffer layer is disposed in the n-type AlGaInN clad layer In the case where the two or more n-type InGaN buffer layers are disposed in the n-type AlGaInN clad layer, and in the case where the two or more p-type InGaN buffer layers are disposed in the p-type AlGaIn layer, it is merely required that each buffer layer satisfies the conditions which will be described below.

In this specification, the following waveguide mode will be referred to as a "mode I". Thus, the waveguide mode which is referred to as the "mode I" has an effective refractive index $n_{eq}$ and an electric field amplitude $f_{eq}(x)$, and occurs in the multilayer slab waveguide, which is formed of the n-type AlGaN clad layer (having an infinite thickness), n-type GaN guide layer, InGaN multilayer quantum well active layer, p-type AlGaN carrier stop layer, p-type GaN guide layer and p-type AlGaN clad layer (having an infinite thickness). In this specification, the layer structure which includes the active layer and is located between the p- or n-type clad layers is referred to as the waveguide layer of the oscillation light of the semiconductor laser element. In this embodiment, the multilayer structure including the n- and p-type GaN guide layers and layers between them forms the waveguide layer of the oscillation light of the semiconductor laser element. In this specification, the following waveguide mode will be referred to as a "mode II". Thus, the waveguide mode which is referred to as the "mode II" has an effective refractive index ni and an electric field amplitude $f_i(x)$, and occurs in the three-layer slab waveguide, which is formed of the n-type AlGaN clad layer (having an infinite thickness), n-type InGaN buffer layer and n-type AlGaN clad layer (having an infinite thickness). Usually, the maximum transfer rate of the light wave power transferring from the mode I to the mode II in accordance with the mode coupling theory (i.e., the relative value of the maximum intensity of the excited mode II assuming the full waveguide light power is equal to 1) is expressed by the following formula:

$$F=1/\{1+(\Delta/\kappa)^2\}$$

where $$\Delta=(\pi/\lambda)(n_{eq}-n_i)$$

$$\kappa=(\omega\cdot\in_0/4)\int\{f_{eq}(x)^*\cdot\delta\in(x)\cdot f_i(x)\}dx$$

$\delta\in(x)=\in_I-\in_A$, (x: within $In_zGa_{1-z}N$ buffer layer), 0(x: other than it)

$\in_I$; dielectric constant of a-type AlGaN clad layer $\in_A$; dielectric constant of n-type InGaN buffer layer In the above case, the x-axis is perpendicular to the semiconductor layer plane. The position x which is the factor of each of $f_{eq}(x)$ and $f_i(x)$ is common to the other. More specifically, the distance between n-type InGaN buffer layer and the GaN guide layer is equal to that in the actual semiconductor laser element structure. $\kappa$ is a coupling factor of the modes I and II. The integration in the above formula is performed over the so direction of thickness of the n-type InGaN buffer layer, and all the integration symbols in calculations of $\kappa$ in this specification are handled in the similar manner, $f_{eq}(x)$ and $f_i(x)$ satisfy the following normalization conditions.

$$(n_{eq}/2/\omega/\mu 0)\int|f_{eq}(x)|^2 dx=1$$

$$(n_i/2/\omega/\mu 0)\int|f_i(x)|^2 dx=1$$

Although a plurality of modes may be present as the mode I, the mode which actually causes the laser oscillation (i.e., the mode causing the maximum light intensity distribution of the active layer) is selected as the mode I. In this specification, this is merely referred to as the waveguide mode of the oscillation light of the laser element.

Likewise, a plurality of modes may be present as the mode II, and the mode in the highest order is selected The effective refractive index $n_{eq}$ and $n_i$ as well as the electric field distributions $f_{eq}(x)$ and $f_i(x)$ of the waveguide mode can be obtained from ordinary calculation of the electric field distribution in the slab waveguide.

This can be referred, e.g., to M. J. Bergmann and H. C. Casey, Jr.: J. Appl. Phys. vol. 84 (1998) pp. 1196–1203. The refractive index n of each material with the oscillation wavelength $\lambda$ [nm] is obtained from the following formula. The oscillation wavelength $\lambda$ may be in a range between 300 and 800 nm Parameter $E_g$ [eV] of each material can be expressed by the following formulas:

For $In_sGa_{1-s}N$ ($0\leq s\leq 1$), $$E_g=E_{g1}[s]=3.42(1-s)+2.65s-3.94s(1-s)$$

For $Al_tGa_{1-t}N$ ($0\leq t\leq 1$)

$$E_g=E_{g2}[t]=3.42(1-t)+6.2t-1.057t(1-t)$$

For $In_sAl_tGa_{1-s-t}N$ (0<s<1, 0<t<1)

$$E_g=\{sE_{g1}[s+t]+tE_{g2}[s+t]\}/(s+t)$$

Thereby, the refractivity is expressed as follows:

$$p[\lambda]=1/[1/\lambda-(E_g-3.42)/1239.852],$$

and

If $p[\lambda]>360.7$ $$n(p[\lambda])=[4.3663801+p^2/(p^2-295.9^2)]^{0.5}$$

If $p[\lambda]\leq 360.7$ $$n(p[\lambda])=c_0+c_1q+c_2q^2+c_3q^3+c_4q^4$$

Figure 2:
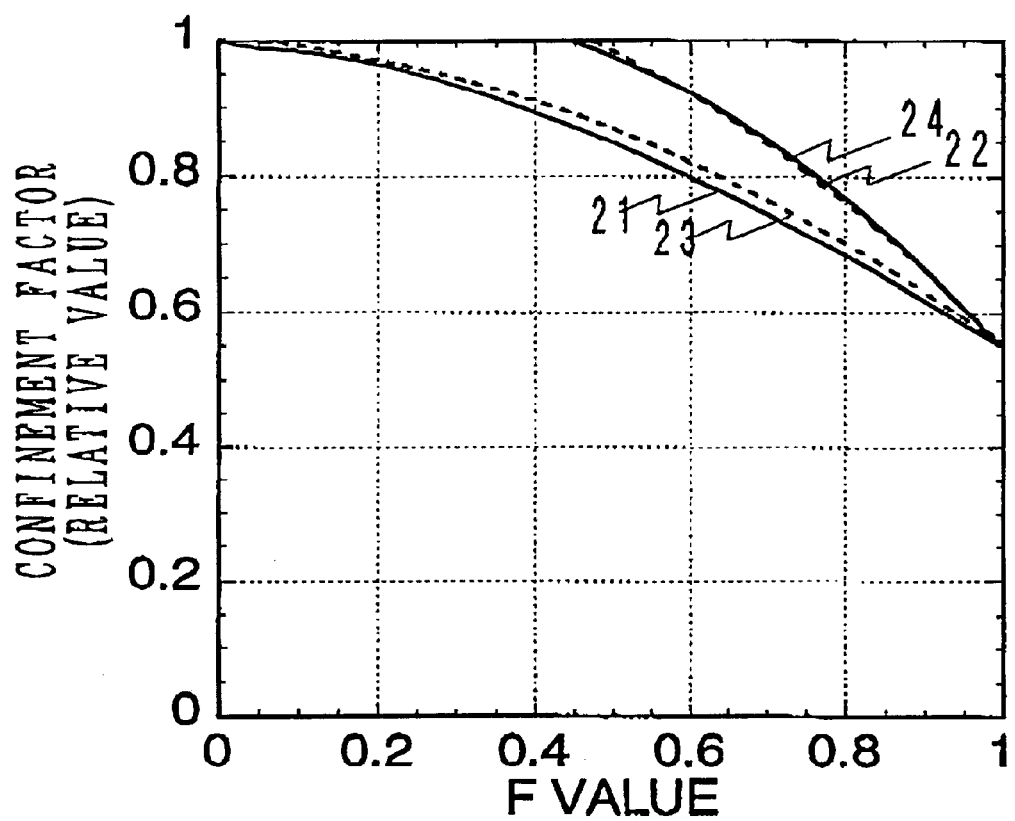
FIG. 2 shows a relationship between a relative value of an active layer confinement factor in a laser oscillation mode and a F parameter.

$q=p[\lambda]-360$
$c_0=2.718$
$c_1=9.976\times10^{-3}$
$c_2=3.005\times10^{-4}$
$c_3=4.584\times10^{-6}$
$c_4=2.596\times10^{-8}$ In the invention, the effective refractive indexes ($n_{eq}, n_i, \ldots$) and the electric field distributions ($f_{eq}(x), f_i(x), \ldots$) are obtained by the calculation of the electric field on the slab waveguide as already described, using the parameters defined above FIG. 2 shows a relationship between the relative value of the active layer confinement factor of the laser oscillation mode and the parameter of the foregoing F. The relative value of the active layer confinement factor represents the relative value based on the assumption that the active layer confinement factor with F=0 (i.e., when the AlGaInN clad layer is formed of AlGaN not containing the InGaN buffer layer) is equal to 1. A solid line 21 represents the change in relative value of the active layer confinement factor which occurs when the indium content of the n-type InGaN buffer layer is kept at a fed value, and the thickness of the n-type InGaN buffer layer is increased from 0 until F changes from 0 to 1. A broken line 23 represents the change in relative value of the active layer confinement factor which occurs when the thickness of the n-type InGaN buffer layer is fixed, and the indium content of the n-type InGaN buffer layer is increased until F changes from 0 to 1. Solid line 21 and broken line 23 match with each other to an extremely high extent. This represents that the influence applied on F by change in thickness of the InGaN buffer layer is the same as that by the change in indium content thereof. FIG. 2 shows that the confinement factor of the laser oscillation mode takes on a sufficient large value, which is 90% or more of the value of the structure not provided with the InGaN buffer layer, and good FFP can be produced, in the following case;

$$F<0.4 \quad (1)$$

In FIG. 2, a solid line 22 represents the change in relative value of the active layer confinement factor which occurs when the indium content of the n-type InGaN buffer layer is fixed, and the thickness of the n-type InGaN buffer layer is further increased from the state of F=1. In this case, F decreases from 1, and the relative value of the active layer confinement factor tends to increase. A broken line 24 represents the change in relative value of the active layer confinement factor which occurs when the thickness of the n-type InGaN buffer layer is fixed, and the indium content of the n-type InGaN buffer layer is further increased from the state of F=1. Solid line 22 and broken line 24 match with each other to an extremely high extent, which shows that the influence applied on F by the change in thickness of the InGaN buffer layer is the same as that by the change in indium content of thereof.

Solid line 22 is located above solid line 21, and the relative value of the active layer confinement factor likewise takes on the value of 90% or more when F is larger than 0.4 However, many ripples are likely to occur in the FFP. It can be seen that the ripples decrease to an ignorable extent only when F is 0.4 or less.

As a result, by designing and preparing the layer structure of the semiconductor laser element to satisfy the formula (1), it is possible to suppress the coupling of the laser oscillation mode to the InGaN buffer layer to an ignorable extent, the active layer confinement factor of the laser oscillation mode can be large, and good FFP can be obtained.

Also, it is already confirmed that the relationships shown in FIG. 2 hardly change even when the light emission wavelength of the active layer changes within a range from 370 to 430 nm, and even when the contents and thicknesses of all the semiconductor growth layers change in predetermined ranges.

When the formula (1) is satisfied, $n_{eq}$ and $f_{eq}(x)$ take on values similar to the effective refractive index and the electric field distribution of the laser oscillation mode. In the calculation of (1), therefore, the effective refractive index and the electric field distribution of the laser oscillation mode may be used as the $n_{eq}$ and $f_{eq}(x)$, respectively.

Figure 3A:
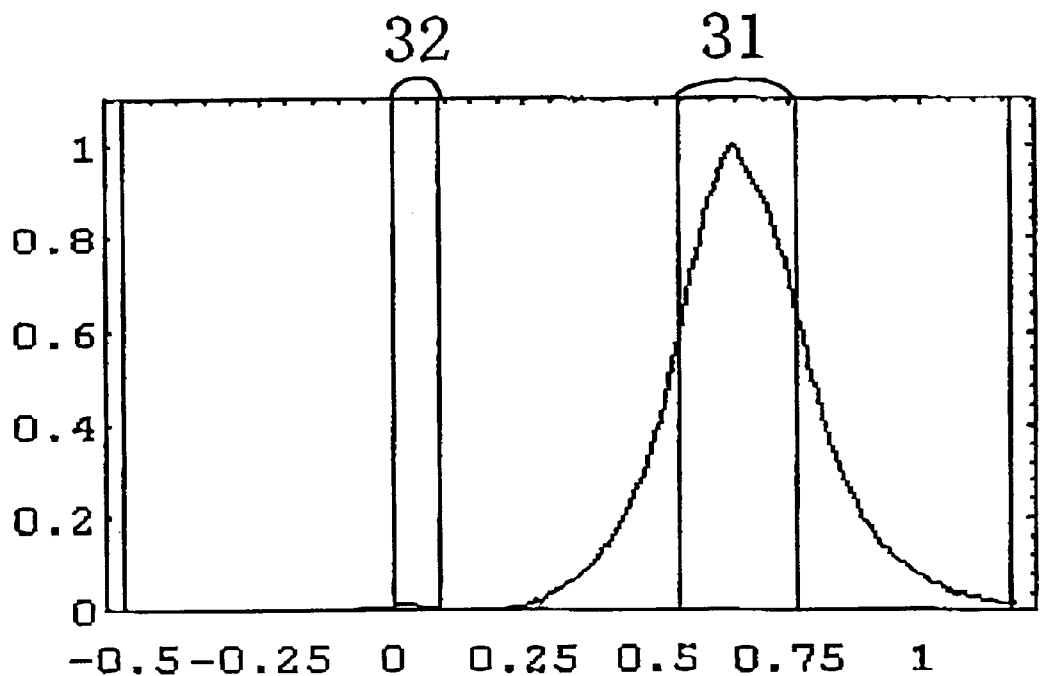
FIGS. 3A and 3B show electric field distributions in the laser oscillation mode.
Figure 3B:
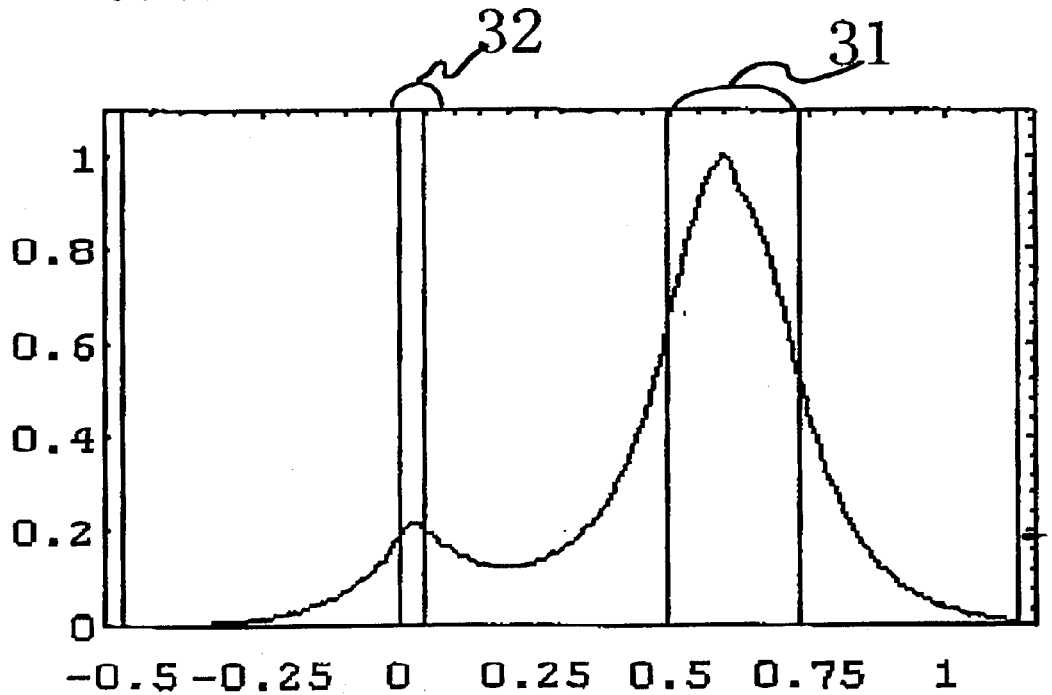

FIGS. 3A and 3B show electric field distributions of the laser oscillation mode. FIG. 3A shows an example in the case of F<0.4, and FIG. 3B shows an example in the case of F>0.4. More specifically, FIG. 3A shows the case of F=0.3, and FIG. 3B shows the case of F=0.5. In these figures, the abscissa gives the position in the direction perpendicular to the substrate plane, and the ordinate gives the intensity of the electric field amplitude. The abscissa gives the position in units of $\mu$m, and the position of the origin does not have particular meaning. The units on the ordinate are not particularly restricted.

Vertical lines 31 represent the position of the multilayer slab waveguide formed of the n-type AlGaN clad layer, n-type GaN guide layer, InGaN multiple quantum well active layer, p-type AlGaN carrier stop layer, p-type GaN guide layer and p-type AlGaN clad layer. For the simplicity reason, lines 31 represent only the position of boundary between the n-type AlGaN clad layer and the n-type GaN guide layer as well as the position of boundary between the p-type GaN guide layer and the p-type AlGaN clad layer. Vertical lines 32 represent the position of the three-layer slab waveguide formed of the n-type AlGaN clad layer, n-type InGaN buffer layer and n-type AlGaN clad layer, and more specifically show the position of boundary between the n-type AlGaN clad layer and n-type InGaN buffer layer as well as the position of boundary between the n-type InGaN buffer layer and the n-type AlGaN clad layer. Further, the intensity of electric field amplitude is standardized so that the maximum value thereof may be equal to 1.

In FIG. 3A, the electric field amplitude intensity in the InGaN buffer layer of the laser oscillation mode is kept to be sufficiently small, and coupling of the laser oscillation mode to the waveguide including the InGaN buffer layer as the core is sufficiently suppressed In FIG. 3B, however, the electric field amplitude intensity in the InGaN buffer layer of the laser oscillation mode is large, and coupling of the laser oscillation mode to the waveguide including the InGaN buffer layer as the core occurs to a large extent.

From FIGS. 3A and 3B, the following can be understood. For sufficiently reducing the intensity of the electric field amplitude in the InGaN buffer layer, the layer structure of the semiconductor laser element may be designed and manufactured to satisfy the formula (1), whereby the coupling of the laser oscillation mode to the InGaN buffer layer can be reduced to a substantially ignorable degree.

The inventors and others have made various studies to determine whether the value of F can be changed to satisfy the conditions of the formula (1) or not, and have found that the conditions can be satisfied by providing the InGaN buffer layer having a specific composition and a specific film thickness.

In the case where two or more InGaN buffer layers are present in the n-type AlGaN clad layer, the influence of the mode coupling to the InGaN buffer layers is reduced to a substantially ignorable degree if the layer satisfying the relationship of $F_i<0.4$ is present where $F_1, F_2, \ldots, F_i$ are determined by the electric field distribution ($f_{eq}(x)$) and the effective refractive index ($n_{eq}$) of the waveguide mode as well as the electric field distributions ($f_1(x), f_2(x), \ldots, f_i(x), \ldots$) and the effective refractive index ($n_1, n_2, \ldots, n_i, \ldots$) of the waveguide mode occurring in the respective InGaN buffer layers. If at least one of the InGaN buffer layers which are present in the n-type AlGaN clad layer satisfies the foregoing conditions, the effects of suppressing the ripple in the FFP and improving the active layer confinement factor are achieved.

In the scope of the appended claims, the semiconductor laser element may have a p-type AlGaInN clad layer, which includes one or more InGaN buffer layers satisfying the conditions of formula (1). In this case, the p-type AlGaN clad layer can be grown at multiple levels, between which the InGaN buffer layers are interposed. This allows suppression of absorption of the laser oscillation mode in the positive electrode, and can reduce the threshold current density.

Owing to increase in thickness of the p-type AlGaInN clad layer, the electric field amplitude of the laser oscillation mode in the p-type GaN contact layer can be suppressed so that the p-type GaN contact layer can be increased. In the structure where the n-type GaN contact layers thick and the p-type GaN contact layer is thin, it is difficult to prepare, by cleavage, the end surface forming the mirror, which forms the resonator of the semiconductor laser element, in a direction perpendicular to the semiconductor layer at the vicinity of the active layer. However, the mirror end surface near the active layer can be prepared in the direction perpendicular to the semiconductor layer by employing the p- and n-type GaN contact layers having the substrate same thicknesses.

By preparing the p-type GaN contact layer having a large thickness, die bonding of the semiconductor laser element can be performed such that the surface of the semiconductor growing side is opposed to a sub-mount. Thereby, heat generated by oscillation of the semiconductor laser element can be discharged easily, resulting in improvement of the characteristics of the semiconductor laser element. However, in the case where the p-type GaN contact layer had a small thickness of 0.5 µm or less, and the die-bonding were performed such that the surface thereof on the semiconductor growth side is opposed the sub-mount, an adhesive (e.g., indium) between the semiconductor laser element and the sub-mount would ascend along the side surface of the semiconductor laser element. This would often cause short-circuiting between the p- and n-type semiconductor layers of the semiconductor laser element, resulting in a failure in the semiconductor laser element. By increasing the thickness of the p-type GaN contact layer, however, it becomes possible to suppress the failure in the semiconductor laser element.

The InGaN buffer layer which is disposed in the p- or n-type clad layer may have the content and the thickness, which are variable within the layer. If variable, it is merely required that the average values of the content and thickness fall within ranges satisfying the formula (1), respectively.

The absorption in the InGaN buffer layer disposed in the p- or n-type clad layer causes absorption of the laser oscillation mode, and increases the threshold current density Therefore, it is desirable that the absorption factor or coefficient of the InGaN buffer layer is small.

Although the substrate used in the semiconductor laser element is made of sapphire, it may be made of another material such as GaN. If made of GaN, the content and thickness of the InGaN buffer layer disposed in the AlGaInN clad layer are merely required to satisfy the same ranges of conditions as the case of employing the sapphire substrate.

The semiconductor laser elements were prepared within-the ranges satisfying the above conditions. In this case, the elements causing the oscillation were larger in number than the semiconductor laser elements in the prior art More specifically, the laser oscillation occurred in the 25 semiconductor laser elements among 30 elements, and thus the yield was improved as compared with the conventional semiconductor laser elements. Further, the threshold current density in the semiconductor laser element according to the invention was lower than that of the conventional semiconductor laser elements in which normal laser oscillation occurred More specifically, the oscillation occurred with 1–2 kA/cm$^2$ in the semiconductor laser element according to the invention. This is primarily owing to the fact that the n-type AlGaN clad layers are grown with the n-type InGaN buffer layers therebetween so that the crystallinity of the underlying layer of the growing active layer is improved, and thereby the crystallinity of the active layer is improved, and that coupling of the laser oscillation mode to the n-type InGaN buffer layer is suppressed. If the conventional semiconductor laser continuously oscillates for ten hours or more, the light output rapidly lowers. However, the semiconductor laser element of the embodiment having the n-type InGaN buffer layer disposed in the n-type AlGaN clad layer can main the intended characteristics even after operation for about 1000 hours. The laser oscillation mode of the semiconductor laser element of the invention exhibits the FFP without a ripple, and thus exhibits good optical characteristics.

(First Embodiment)

Figure 4:
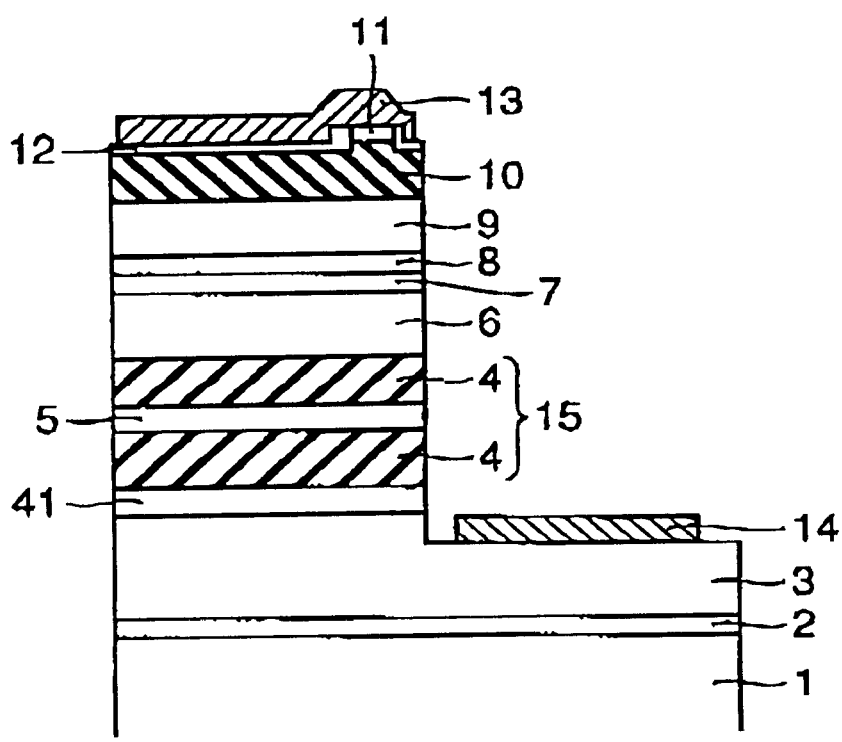
FIG. 4 is a schematic view showing a semiconductor laser element of a first embodiment of the invention.

FIG. 4 is a schematic view showing a semiconductor laser element of the first embodiment of the invention. FIG. 4 shows a section of a waveguide portion of the semiconductor laser element, and particularly shows the section perpendicular to a resonator. The semiconductor laser element includes various nitride-contained semiconductor layered and more specifically includes (0001) C-surface sapphire substrate 1 (thickness: 30–300 µm), GaN low-temperature buffer layer 2 (thickness: 0–100 nm), n-type GaN contact layer 3 (thickness; 0.1–10 µm), n-type In$_r$Ga$_{1-r}$N ($0 \leq r \leq 0.2$) buffer layer 41 (thickness: 0–200 nm), n-type AlGaInN clad layer 15 (total thickness: 0.8–10 µm) formed of n-type Al$_{x1}$Ga$_{1-x1}$N ($0.08 < x1 \leq 0.2$) clad layer 4 (thickness: 0.2–0.8 µm), n-type In$_{p1}$Ga$_{1-p1}$N ($0.08 \leq p_1 \leq 0.2$) buffer layer 5 (thickness: 10–200 nm) and n-type Al$_{x2}$Ga$_{1-x2}$N ($0.08 \leq x_2 \leq 0.2$) clad layer 4 (thickness: 0.2–0.8 µm), n-type GaN guide layer 6 (thickness: 0.08–0.15 µm), multiple quantum well active layer 7 (light emission wavelength: 370–430 nm, total thickness: 5–60 nm) formed of an alternate multilayer structure (barrier layer, well layer, . . . , well layer and barrier layer) including the In$_w$Ga$_{1-w}$N ($0 < w < 0.2$) well layers and the In$_v$Ga$_{1-v}$N ($0 < v < w$) barrier layers, p-type Al$_z$Ga$_{1-z}$N ($0 \leq z \leq 0.3$) carrier block layer 8 (thickness: 0–20 nm), p-type GaN guide layer 9 (thickness: 0.08–0.15 µm), p-type Al$_y$Ga$_{1-y}$N ($0.08 \leq y \leq 0.2$) clad layer 10 (thickness: 0.2–0.8 µm) and p-type GaN contact layer 11 (thickness: 0.01–10 µm).

Above these layers, an insulating film 12 of a required configuration is formed in a mesa-like form on the substantially whole surface. A positive electrode 13 (e.g., Pd/Au, Ni/Pd/Au or Pd/Pt/Au) is formed over the substantially whole surface in a mesa-like form including the whole of the exposed surface of the p-type GaN contact layer. The negative electrode 14 (e.g., Ti/Al, Zr/Al or Hf/Al) is formed on a portion of an exposed surface of the n-type GaN contact layer. The mesa is formed of the n-type GaN contact layer, n-type InGaN buffer layer, n-type AlGaInN clad layer, n-type GaN guide layer, InGaN multiple quantum well active layer, p-type AlGaN carrier block layer, p-type GaN guide layer, p-type AlGaN clad layer, p-type GaN contact layer, insulating film (more specifically, only in the required region) and positive electrode. The opposite end surfaces of the stripe function as mirrors, and form a photo-resonator.

Then, description will be given on a method of manufacturing the semiconductor laser element of the first embodiment.

First, the (0001) C-surface sapphire substrate is cleaned. The cleaned (0001) C-surface sapphire substrate is moved into a MOCVD device, and is subjected to cleaning within an atmosphere of $H_2$ at a temperature of about 1100° C. After lowering the temperature, $NH_3$ and trimethyl gallium (MG) at 600° C. are supplied at rates of 5 liter/minute and 20 mol/minute, respectively, while flowing hydrogen ($H_2$) at 10 liter/minute as a carrier gas. Thereby, the GaN low temperature buffer layer of 0–100 nm (e.g., about 20 nm) in thickness is grown. The low temperature buffer layer is not restricted to GaN. Alternatively, trimethyl aluminum (TMA), TMG or NII3 may be used, and thereby an AlN or GaAlN film may be used without causing no adverse effect.

Then, the temperature is raised to about 1050° C. while flowing $N_2$ and $NH_3$ each at a rate of 5 liter/minute. When the temperature rises, the carrier gas is changed from $N_2$ to $H_2$, and TMG and $SiH_4$ are supplied at rates of 100 μmol/minute and 10 nmol/minute, respectively, so that the n-type GaN contact layer of 0.1–10 μm (e.g., about 4 μm) is grown. Then, the supply of TMG is stopped, and the carrier gas is changed from $H_2$ to $N_2$ again. After lowering the temperature to about 800° C., the flow rate of TMG is adjusted to 15 μmol/minute, and trimethyl indium (TMI) which is an indium material is supplied at a constant rate. Thereby, the $In_rGa_{1-r}N$ (e.g., r=0.07) buffer layer of 0–200 nm (e.g., 50 nm) in thickness is grown. Then, the supply of TMI and TMG is stopped, and the temperature is raised to 1050° C. again. The carrier gas is changed from $N_2$ to $H_2$. The flow rate of TMG is adjusted to 50 μmol/minute, and the TMA is supplied at a rate of 40 μmol/minute. Thereby, the n-type $Al_{x1}Ga_{1-x1}N$ (e.g., x1=0.1) clad layer of 0.2–0.8 μm (e.g., 0.4 μm) in thickness is grown. The supply of TMG and TMA is stopped, and the carrier gas is changed from $H_2$ to $N_2$. After lowering the temperature to about 800° C., the flow rate of TMG is adjusted to 15 μmol/minute, and the TMI is supplied at a constant rate. Thereby, the $In_pGa_{1-p}N$ (e.g., p=0.02) buffer layer of 10–200 nm (e.g., 50 nm) in thickness is grown. Then, the supply of TMI and TMG is stopped, and the temperature is raised to 1050° C. again. The carrier gas is changed from $N_2$ to $II_2$. The flow rate of TMG is adjusted to 50 μmol/minute, and the TMA is supplied at a rate of 40 μmol/minute. Thereby, the n-type $Al_{x2}Ga_{1-x2}N$ (e.g., x2=0.1) clad layer of 0.2–0.8 μm (e.g., 0.5 μm) in thickness is grown. When the growth of $Al_{x2}Ga_{1-x2}N$ stops, the supply of TMA is stopped, and n-type GaN guide layer of 0.08–0.15 μm (e.g., 0.1 μm) in thickness is grown.

Thereafter, the supply of TMG is stopped, and the carrier gas is changed from $H_2$ to $N_2$ again. After lowering the temperature to 700° C., the trimethyl indium (TMI) which is an indium material is supplied at a rate of 10 μmol/minute, and the TMG is supplied at a rate of 15 μmol/minute so that the barrier layer made of $In_vGa_{1-v}N$ (e.g., v=0.05) and having a thickness of 4 nm is grown. Thereafter, the supply rate of TMI is increased to a 50 μmol/minute so that the well layer having a thickness of 2 nm and made of $In_wGa_{1-w}N$ (e.g., w=0.17) is grown. The well layers which are three in total number are grown in the similar manner, and the multiple quantum well (MQW) having a light emission wavelength of about 380–430 nm (e.g., 400–410 nm) is grown. This MQW includes the barrier layers of four in total number, which are present between the well layers or on the opposite sides of the well layers. When the growth of the MQW ends, the supply of TMI and TMG is stopped, and the temperature is raised to 1050° C. again. The carrier gas is changed from $N_2$ to $H_2$ again, and the TMG is supplied at a rate of 50 μmol/minute, the TMA is supplied at a rate of 30 μmol/minute, and the bis cyclopentadienyl magnesium ($Cp_2Mg$), which is a p-type doping material, is flowed at a rate of 10 nmol/minute so that the p-type $Al_zGa_{1-z}N$ (e.g., z=0.2) carrier block layer of 0–20 μm (e.g., 20 nm) in thickness is grown. When growth of the carrier block layer slops, the supply of TMA is stopped, and the supply rate of TMG is adjusted to 100 μmol/minute so that the p-type GaN guide layer of 0.08–0.15 an (e.g. 0.1 μm) in thickness is grown. Thereafter, the supply rate of TMG is adjusted to 50 μm/minute, and the TMA is supplied at a rate of 40 μmol/minute so that the p-type $Al_yGa_{1-y}N$ (e.g., y=0.1) clad layer of 0.2–0.8 μm (e.g., 0.5 μm) in thickness is grown. Finally, the supply rate of TMG is adjusted to 100 μmol/minute, and the supply of TMA is stopped so that the p-type GaN contact layer of 0.01–10 μm (e.g., 0.1 μm) in thickness is grown. Thereby, the growth of the light-emitting element structure ends. When the growth ends, the supply of TMG and $Cp_2Mg$ is stopped, and the temperature is lowered. Then, the structure at a room temperature is taken out from the MOCVD device.

The outermost surface (last grown surface) of the film having the laser structure of the embodiment had a surface roughness of about 10 nm in average value (Ra), and thus exhibited a very good flatness. Further, a plurality of wafers were prepared. Each wafer had the structure formed of the (0001) C-surface sapphire substrate, GaN low temperature buffer layer (thickness: 20 nm), n-type GaN contact layer (thickness: about 4 μm), n-type $Al_{0.1}Ga_{0.9}N$ clad layer (thickness: 0.5 μm), n-type $Al_{0.03}Ga_{0.97}N$ buffer layer (thickness: 50 nm) and n-type $Al_{0.1}Ga_{0.9}N$ clad layer (thickness: 0.5 μm). The surfaces of these wafers were observed with an optical microscope of a magnification of about 200 times. It was found that no hexagonal crack was present in each wafer. In this wafer, the total thickness of the n-type clad layers is equal to about 1 μm. The problem of the prior art could be overcome owing to the fact that the buffer layers including at least indium was formed in the clad layer.

Thereafter, the photolithography technique and reactive ion etching technique are used to effect the egg on the p-type $Al_yGa_{1-y}N$ clad layer while leaving the p-type GaN contact layer in the stripe form having a stripe width of 3 μm Thereby, the insulating film is formed by the photolithography technique in the region except for a portion, where the p-type GaN contact layer is in contact with the electrode. Thereafter, the reactive ion etching technique is used to remove a portion, where the negative electrode is to be formed, from a region between the wafer top surface and a middle position of the n-type GaN contact layer. Thereafter, the positive electrode is formed on the exposed portion of the surface of the p-type GaN contact layer in the mesa-like form. The material of the electrodes may be Au/Ni or Au/Pd The negative electrode is formed substantially entirely over the exposed surface portion of the n-type GaN contact layer. The material of the negative electrode may be Al/Ti or Au/W.

Finally, the surface of the sapphire substrate remote from the semiconductor multilayer film surface is polished so that the lager thickness including the semiconductor multilayer film and the sapphire substrate may be equal to a value (e.g., about 60 μm) in a range from 30 to 300 μm. Thereafter, cleavage is used to achieve the element length of about 0.5 mm, and the end surface forming the mirror is formed.

In the foregoing manners, the semiconductor laser element of the first embodiment shown in FIG. 4 is manufactured.

In the semiconductor laser element of the first embodiment, the n-type InGaN buffer layer contained in the n-type AlGaIn clad layer has the film thickness and the indium content, which are designed to satisfy the formula (1) of such conditions that the laser oscillation mode does not couple to the three-layer slab waveguide formed of the n-type InGaN buffer layer and the neighboring layers, i.e., the n-type AlGaN clad layers.

Figure 20:
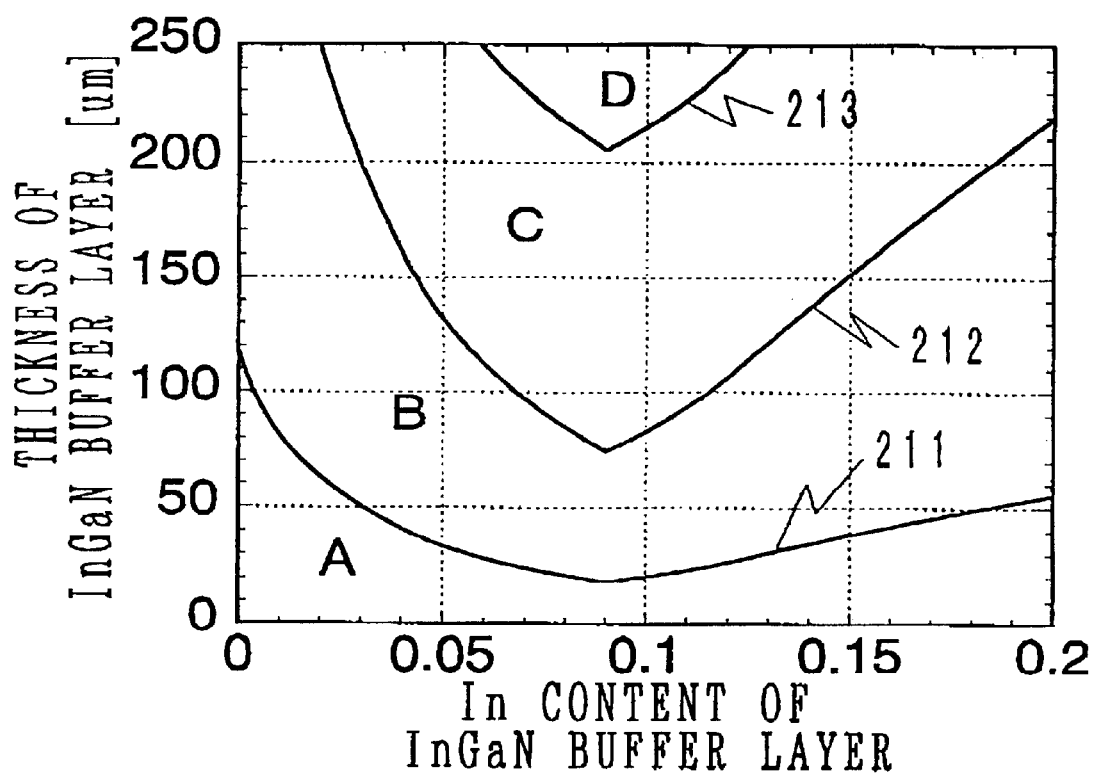
FIG. 20 shows conditions for satisfying a conditional formula (1) and thus a relationship of F<0.4 in the first embodiment of the invention.

FIG. 20 shows an example of conditions satisfying the conditional formula (1).

In FIG. 20, curves 211 and 212 represent conditions of the indium content and thickness of the InGaN buffer layer achieving the relationship of F=0.4. A region B is defined between curves 211 and 212, and thus represents a region which does not satisfy the conditions of F>0.4, i.e., the conditional formula (1). A region A is located under curve 211 in the figure, and represents a region which can satisfy the conditions of F<0.4, i.e., the conditional formula (1). Regions C and D are located above curve 212, and represent regions which can satisfy the conditions of F<0.4, i.e., the conditional formula (1).

A curve 213 represents a boundary between two regions, i.e., a region, where a high-order waveguide mode other than a basic order waveguide mode occurs in the three-layer slab waveguide formed of the InGaN buffer layers and tile neighboring layers, i.e., AlGaN clad layers, and a region where such a high-order waveguide mode does not occur. A region D is located above curve 213, and represents a region where the high-order wave guide mode occurs. Regions A, B and C are located under curve 213, and represent regions where the high-order waveguide mode does not occur. If the high-order waveguide mode occurs in the InGaN buffer layer, the indium content and thickness of the InGaN buffer layer may be set such that the F parameter determined by the highest order mode and the laser oscillation mode may satisfy the formula (1). However, the regions where the high-order waveguide mode occurs do not satisfy the formula (1) in many cases Therefore, no actual problem arises even if the discussion is based on whether the high-order waveguide mode occurs in the InGaN buffer layer or not.

Accordingly, the laser oscillation mode can be prevented from coupling to the InGaN buffer layer only by preparing such a structure that the indium content and thickness of the InGaN buffer layer are included in region A or C in the figure.

In connection with the manufacturing, the foregoing regions are further restricted. According to experiments of the inventors and others, it was found that the InGaN buffer layer of the layered structure having a thickness larger than 200 μm caused deterioration of the crystallinity of the semiconductor layer formed thereon. Further, the InGaN buffer layer having the indium content larger than 0.2 caused deterioration of the crystallinity of the semiconductor layer formed thereon. According to these results, it is appropriate that the InGaN buffer layer has the thickness of 200 nm or less and the indium content of 0.2 or less. Further, the InGaN buffer layer can achieve an effect of preventing a crick even if its indium content is very small and does not exceed 0.001. It was also found that the degree of the crack preventing effect hardly changed even if the indium content was changed. The InGaN buffer layer could achieve the effect of preventing a crack even if the thickness thereof was very small, and did not exceed 10 nm. Even if the thickness was changed, the degree of the crack preventing effect hardly changed.

Accordingly, the region of the indium content and thickness of the InGaN buffer layer, which can prevent coupling of the laser oscillation mode to the InGaN buffer layer, is restricted only to a range within region A or C, and particularly is restricted only to a region of the indium content from 0.001 to 0.2 and the thickness from 10 nm to 200 nm.

Figure 21:
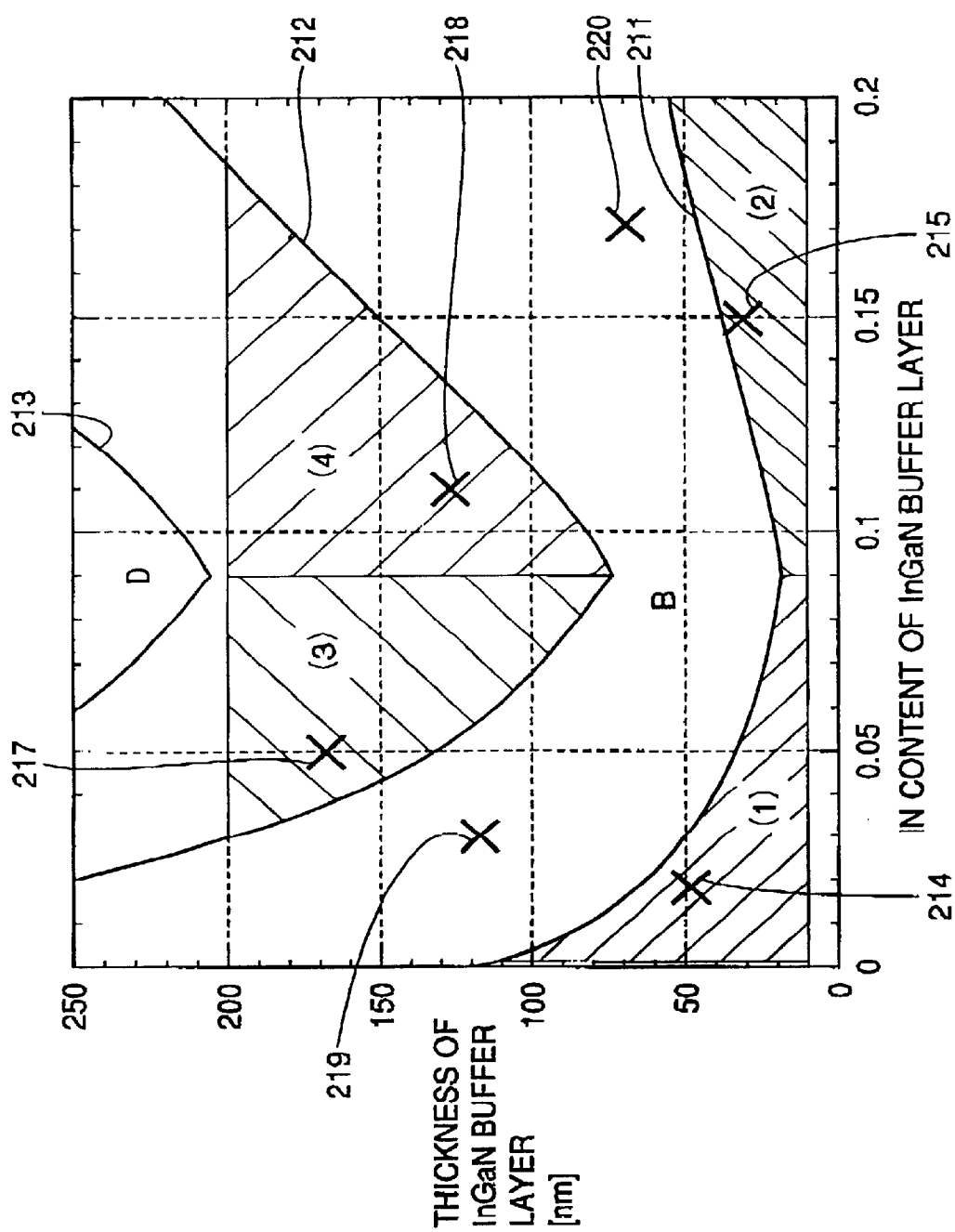
FIG. 21 shows a region to be satisfied by the InGaN buffer layer in the first embodiment of the invention.
Figure 22:
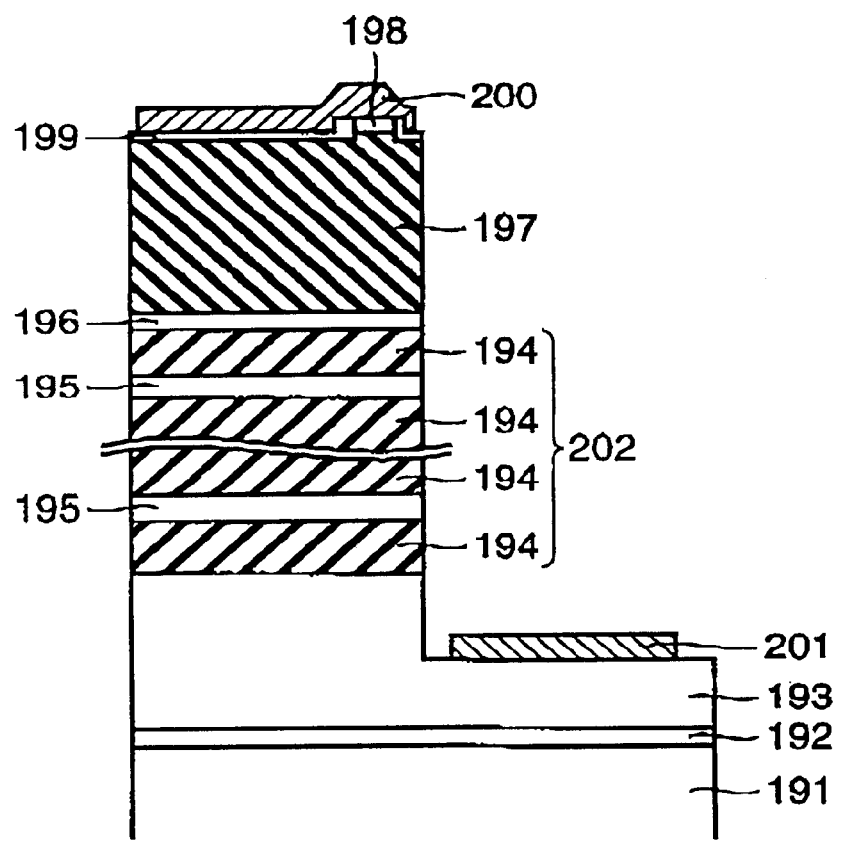
FIG. 22 is a schematic view showing a semiconductor laser element in the prior art.

FIG. 21 shows regions to be satisfied by the InGaN buffer layer. In FIG. 21, the regions to be satisfied by the InGaN buffer layer are indicated by <1>–<4>, respectively. Referring to FIG. 21, the regions to be satisfied by the InGaN buffer layer an be mathematically expressed as follows. Assuming that $p_1$ and $t_1$ [nm] are the indium content and thickness of InGaN buffer layer, respectively, boundary line 211 between regions A and B is expressed by the following formula:

$$t_1(0.0067725+0.50578p_1)^{-1}(0 \leq p_1 \leq 0.09)-10.86+ 321.88p_1(0.09 \leq p_1 \leq 0.2)$$

Likewise, boundary line 212 between regions B and C is expressed by the following formula:

$$t_1=(0.0014296+0.13014p_1)^{-1}(0 \leq p_1 \leq 0.09)-42.254+ 1273.3p_1(0.09 \leq p_1 \leq 0.2)$$

By using the above, region <1> is expressed by the following formula:

$$0.001 \leq p_1 \leq 0.09, \text{ and } 10 \leq t_1 \leq (0.0067725+0.50578p_1)^{-1}$$

Region <2> is expressed by the following formula:

$$0.09 \leq p_1 \leq 0.2, \text{ and } 10 \leq t_1 \leq -10.86+321.88p_1$$

Region <3> is expressed by the following formula:

$$0.001 \leq p_1 \leq 0.09, \text{ and } (0.0014296+0.13014p_1)^{-1} \leq t_1 \leq 200$$

Region <4> is expressed by the following formula:

$$0.09 \leq p_1 \leq 0.2, \text{ and } -42.254+1273.3p_1 \leq t_1 \leq 200$$

Thus, the conditions to be sated by indium content $p_1$ and thickness $t_1$ [nm] of the InGaN buffer layer are contained in any one of the regions <1><4> in which $(p_1, t_1)$ are expressed by the foregoing formulas.

Figure 5:
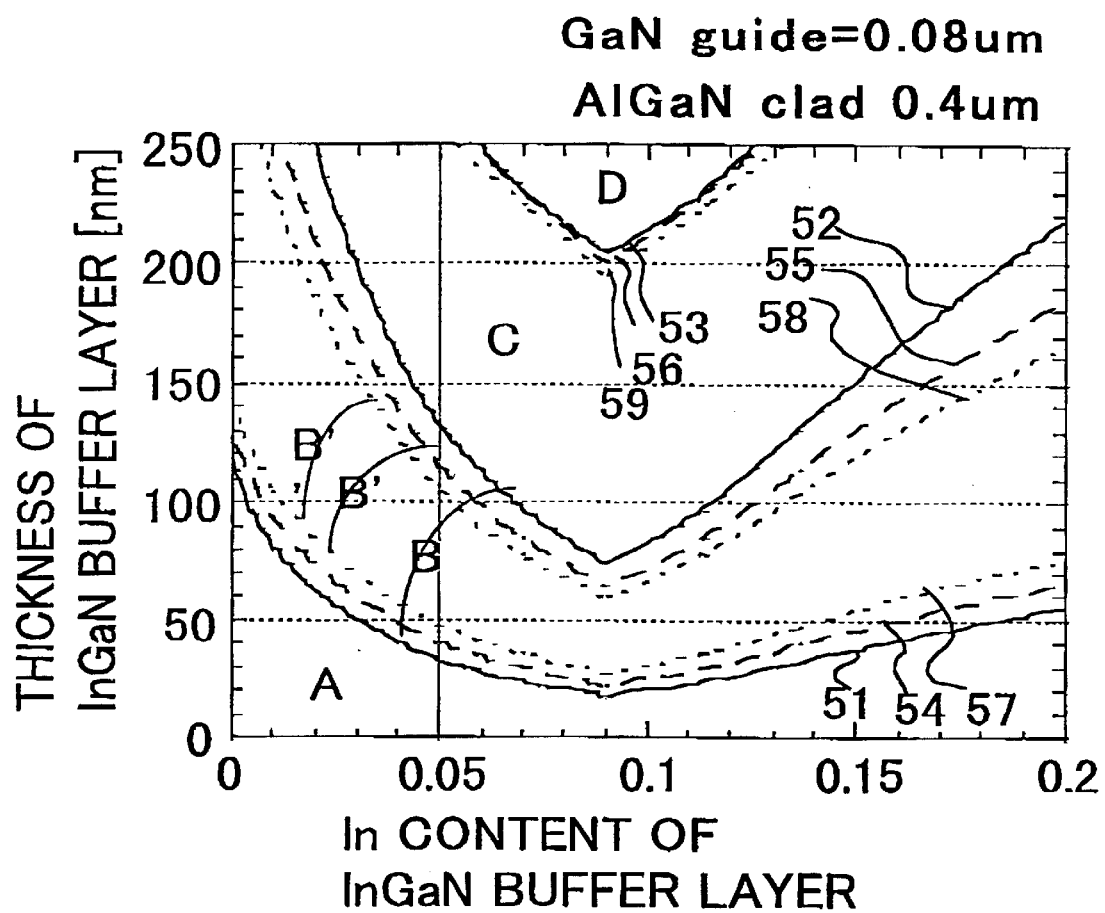
FIG. 5 shows ranges of an indium content and a thickness of an InGaN buffer layer satisfying a relationship of F<0.4, and particularly shows a change in boundary line of the above ranges according to various values of aluminum contents of an n-type AlGaN clad layer and a p-type AlGaN clad layer.
Figure 6:
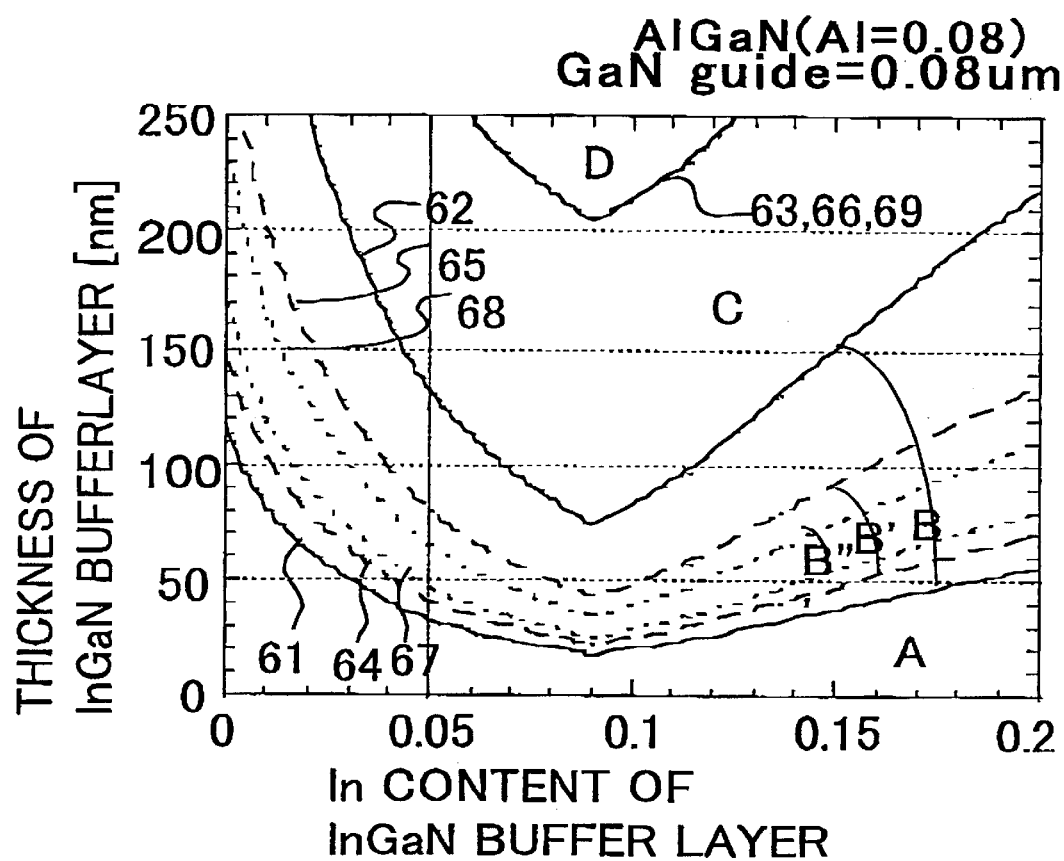
FIG. 6 shows ranges of the indium content and thickness of the InGaN buffer layer satisfying a relationship of F<0.4, and particularly shows a change in boundary line of the above ranges according to various values of a distance between an InGaN buffer layer and a guide layer in a range of 0.4 µm or more.
Figure 7:
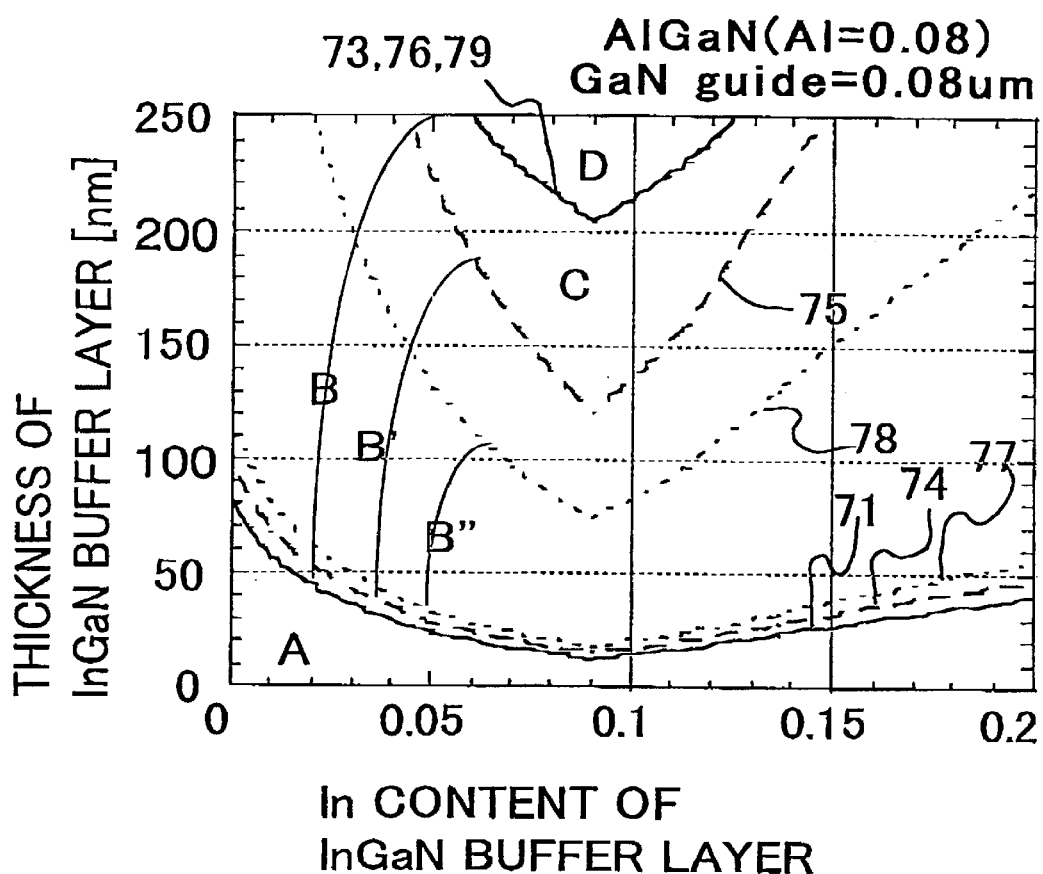
FIG. 7 shows ranges of the indium content and thickness of an InGaN buffer layer satisfying a relationship of F<0.4, and particularly shows a change in boundary line of the above ranges according to various values of a distance between the InGaN buffer layer and the guide layer in a range from 0.2 to 0.4 µm.
Figure 8:
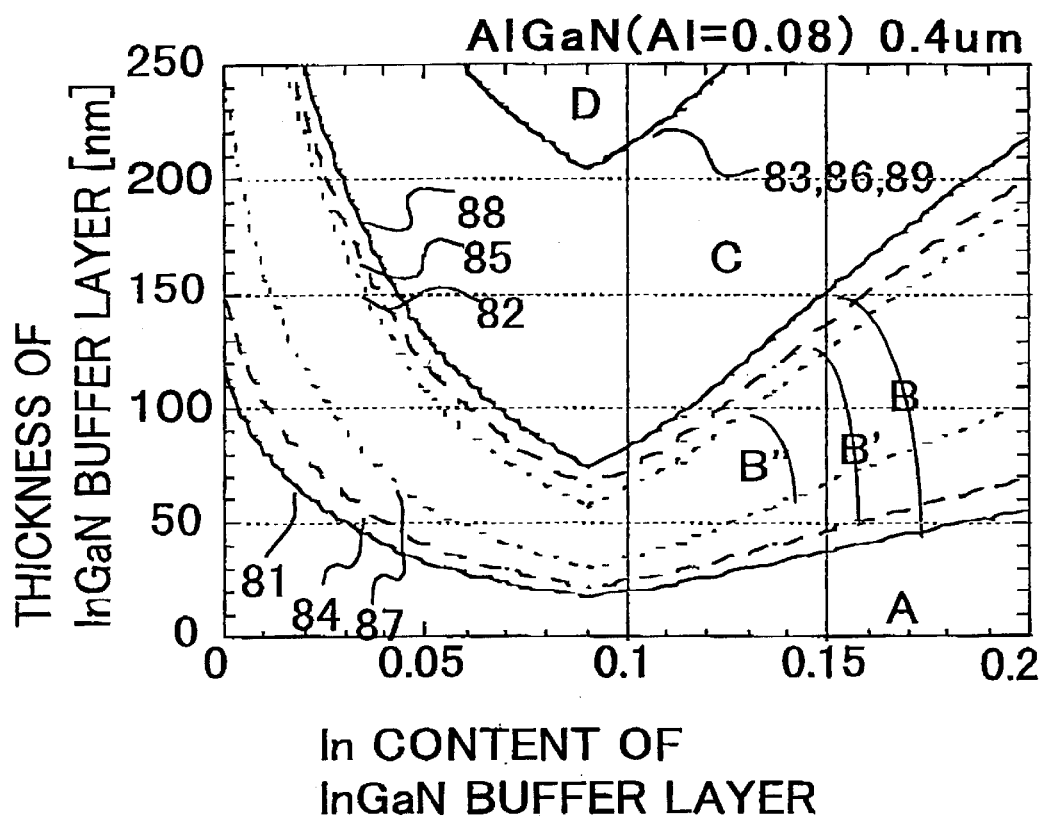
FIG. 8 shows ranges of the indium content and thickness of an InGaN buffer layer satisfying a relationship of F<0.4, and particularly shows a change in boundary line of the above ranges according to various values of thicknesses of p- and n-type guide layers.

In FIG. 20, boundary line 211 between regions A and B, boundary line 212 between regions B and C, and boundary line 213 between regions C and D change in accordance with the structure around the InGaN buffer layer. FIGS. 5–8 shows changes in boundary lines in accordance with the change in the structure around the InGaN buffer layer. FIG. 5 shows the change in boundary lines in accordance with the change in aluminum content of the AlGaN clad layer, FIGS. 6 and 7 show the changes in boundary lines in accordance with the change in distance between the buffer layer and the guide layer, and FIG. 8 shows the change in boundary lines in accordance with the change in thickness of the guide layer.

FIG. 5 shows ranges of the indium content and thickness of the n-type InGaN buffer layer satisfying formula (1) in the structure of the semiconductor laser element of this embodiment. In FIG. 5, conditions in regions A and C satisfy the formula (1). Conditions in region B allow easy coupling of the laser oscillation mode to the InGaN buffer layer so that this region B must be avoided. Conditions in region D cause high-order mode higher than the first order in the InGaN buffer layer, and allow easy recoupling of the laser oscillation mode to the InGaN buffer layer so that this region D must be avoided.

Lines 51–59 represent boundaries, each of which is defined between the regions satisfying and not sa ng the formula (1), under various conditions. As conditions and points common to all the lines, the structure of the semiconductor laser element of this embodiment includes the n-type InGaN buffer layer and the n-type guide layer, which are spaced by 0.4 μm from each other, as well as the p- and a-type GaN guide layers each having a thickness of 0.08 μm.

Solid lines 51, 52 and 53 represent the boundaries each defined between the regions satisfying and not satisfying the formula (1) in the case where all the n-type AlGaN clad layers included in the n-type AlGaInN clad layer and the p-type AlGaN clad layer have the aluminum content of 0.08. Solid line 51 represents the boundary between regions A and B, solid line 52 represents the boundary between regions B and C, and solid line 53 represents the boundary between regions C and D. Broken lines 54, 55 and 56 represent the boundaries each defined between the regions satisfying and not satisfying the formula (1) in the case where all the n-type AlGaN clad layers included in the n-type AlGaInN clad layer and the p-type AlGaN clad layer have the aluminum content of 0.10. Broken line 54 represents the boundary between regions A and B, broken line 55 represents the boundary between regions B and C, and broken line 56 represents the boundary between regions C and D. Broken lines 57, 58 and 59 represent the boundaries each defined between the regions satisfying and not satisfying the formula (1) in the case where all the n-type AlGaN clad layers included in the n-type AlGaInN clad layer and the p-type AlGaN clad layer have the aluminum content of 0.12. Dotted line 57 represents the boundary between regions A and B, dotted line 58 represents the boundary between regions B and C, and dotted line 59 represents the boundary between regions C and D. Among lines 51–59, solid lines 51, 52 and 53 can be approximately expressed by the following formulas, assuming that the InGaN buffer layer has the indium content of $x_1$ and the thickness of $t_1$ [$\mu$m]. Solid line 51 can be approximately expressed by $t_1 = (0.0067725+0.50578x_1)^{(-1)}$ if $x_1 \leq 0.09$, and by $t_1 = -10.86+321.88x_1$ if $0.09 \leq x_1 \leq 0.2$. Solid line 52 can be approximately expressed by $t_1 = (0.0014296+0.13014x_1)^{(-1)}$ if $x_1 \leq 0.09$, and by $t_1 = -42.254+1273.3x_1$ if $0.09 \leq x_1 \leq 0.2$. Solid line 53 can be approximately expressed by $t_1 = (0.0020902+0.031559x_1)^{(-1)}$ if $x_1 \leq 0.09$, and by $t_1 = 111.52+1110.5x_1$ if $0.09 \leq x_1 \leq 0.2$.

FIG. 6 shows ranges of the indium content and thickness of the n-type InGaN buffer layer satisfying formula (1) in the structure of the semiconductor laser element of this embodiment. In FIG. 6, conditions in regions A and C satisfy the formula (1). Conditions in region B allow easy coupling of the laser oscillation mode to the InGaN buffer layer so that this region B must be avoided Conditions in region D cause high-order mode higher than the first order in the InGaN buffer layer, and allow easy recoupling of the laser oscillation mode to the InGaN buffer layer so that this region D must be avoided.

Lines 61–69 represent boundaries, each of which is defined between the regions satisfying and not satisfying the formula (1), under various conditions. As conditions common to all the lines, the semiconductor laser element of this embodiment has the structure in which all the n-type AlGaN clad layers included in the n-type AlGaInN clad layer and the p-type AlGaN clad layer have the aluminum content of 0.08, and each of the p- and n-type GaN guide layers has the thickness of 0.08 $\mu$m. Solid lines 61, 62 and 63 represent the boundaries each defined between the regions satisfying and not satisfying the formula (1) in the case where the n-type InGaN buffer layer and the n-type guide layer are spaced by 0.4 $\mu$m from each other. Solid line 61 represents the boundary between regions A and B, solid line 62 represents the boundary between regions B and C, and solid line 63 represents the boundary between regions C and D. Broken lines 64, 65 and 66 represent the boundaries each defined between the regions satisfying and not satisfying the formula (1) in the case where the n-type InGaN buffer layer and the n-type guide layer are spaced by 0.6 $\mu$m from each other. Broken line 64 represents the boundary between regions A and B, broken line 65 represents the boundary between regions B and C, and broken line 66 represents the boundary between regions C and D. Dotted lines 67, 68 and 69 represent the boundaries each defined between the regions satisfying and not satisfying the formula (1) in the case where the n-type InGaN buffer layer and the n-type guide layer are spaced by 0.8 $\mu$m from each other. Dotted line 67 represents the boundary between regions A and B, dotted line 68 represents the boundary between regions B and C, and dotted line 69 represents the boundary between regions C and D. Among lines 61–69, dotted lines 67, 68 and 69 can be approximately expressed by the following formulas, assuming that the InGaN buffer layer has the indium content of $x_1$ and the thickness of $t_1$ [$\mu$m]. Dotted line 67 can be approximately expressed by $t_1 = (0.0044063+0.3622x_1)^{(-1)}$ if $x_1 \leq 0.09$, and $t_1 = -17.958+479x_1$ if $0.09 \leq x_1 \leq 0.2$. Dotted line 68 can be approximately expressed by $t_1 = (0.0031223+0.26847x_1)^{(-1)}$ if $x_1 \leq 0.09$, and by $t_1 = -25.867+664.45x_1$ if $0.09 \leq x1 \leq x0.2$. Dotted line 69 can be approximately expressed by $t_1 = (0.0020902+0.031559x_1)^{(-1)}$ if $x_1 \leq 0.09$, and by $t_1 = 111.52+1110.5x_1$ if $0.09 \leq x_1 \leq 0.2$.

In the specification, the distance between n- or p-type guide layer and n- or p-type InGaN buffer layer is represented by the average distance between the surface of the guide layer remote from the active layer and the surface of the buffer layer nearer to the active layer, and particularly the distance averaged through the whole surface of the semiconductor layer.

FIG. 7 shows ranges of the indium content and thickness of the n-type InGaN buffer layer satisfying formula (1) in the structure of the semiconductor laser element of this embodiment. In FIG. 7, conditions in regions A and C satisfy the formula (1). Conditions in region B allow easy coupling of the laser oscillation mode to the InGaN buffer layer so that this region B must be avoided Conditions in region D cause high-order mode higher than the first order in the InGaN buffer layer, and allow easy recoupling of the laser oscillation mode to the InGaN buffer layer so that this region D must be avoided.

Lines 71–79 represent boundaries, each of which is defined between the regions satisfying and not satisfying in the formula (1), under various conditions. As conditions common to all the lines, the semiconductor laser element of this embodiment has the structure in which all the n-type AlGaN clad layers included in the n-type AlGaInN clad layer and the p-type AlGaN clad layer have the aluminum content of 0.08, and each of the p- and n-type GaN guide layers has the thickness of 0.08 $\mu$m. Solid lines 71 and 72 represent the boundaries each defined between the regions satisfying and not satisfying the formula (1) in the case where the n-type InGaN buffer layer and the n-type guide layer are spaced by 0.2 $\mu$m from each other Solid line 71 represents the boundary between regions A and B, sold line 72 represents the boundary between regions B and C, and solid line 73 represents the boundary between regions C and D. Broken lines 74, 75 and 76 represent the boundaries each defined between the regions satisfying and not satisfying the formula (1) in the case where the n-type InGaN buffer layer and the n-type guide layer are spaced by 0.3 $\mu$m from each other. Broken line 74 represents the boundary between regions A and B, broken line 75 represents the boundary between regions B and C, and broken line 76 represents the boundary between regions C and D. Dotted lines 77, 78 and 79 represent the boundaries each defined between the regions satisfying and not satisfying the formula (1) in the case where the n-type InGaN buffer layer and the n-type guide layer are spaced by 0.4 im from each other. Dotted line 77 represents the boundary between regions A and B, dotted line 78 represents the boundary between regions B and C, and dotted line 79 represents the boundary between regions C and D. Among lines 71–79, solid line 71 can be approximately expressed by the following formulas, assuming that the InGaN buffer layer has the indium content of $p_1$ and the thickness of $t_1$ [$\mu$m]. Solid line 71 can be approximately expressed by $t_1=(0.0097376+0.69271p_1)^{(-1)}$ if $p_1 \leq 0.09$, and $t_1=-6.6349+222.72p_1$ if $0.09 \leq p_1 \leq 0.2$. Broken line 72 can be approximately expressed by $t_1=(0.0080268+0.58533p_1)^{(-1)}$ if $p_1 \leq 0.09$, and $t_1=-8.9956+273.95p_1$ if $0.09 \leq p_1 = 0.2$. Broken line 75 can be approximately expressed by $t_1=(0.0017672+0.088604p_1)^{(-1)}$ if $p_1 \leq 0.09$, and $t_1=-103.63+2403.3p_1$ if $0.09 \leq p_1 \leq 0.2$. Dotted line 73 can be approximately expressed by $t_1=(0.0067725+0.50578p_1)^{(-1)}$ if $p_1 \leq 0.09$, and $t_1=-10.86+321.88p_1$ if $0.09 \leq p_1 \leq 0.2$. Dotted line 76 can be approximately expressed by $t_1=(0.0014296+0.13014p_1)^{(-1)}$ if $p_1 \leq 0.09$, and $t_1=-42.254+1273.3p_1$ if $0.09 \leq p_1 \leq 0.2$.

FIG. 8 shows ranges of the indium content and thickness of the n-type InGaN buffer layer satisfying formula (1) in the structure of the semiconductor laser element of this embodiment. In FIG. 8, conditions in regions A and C satisfy the formula (1). Conditions in region B allow easy coupling of the laser oscillation mode to the InGaN buffer layer so that this region B must be avoided. Conditions in region D cause high-order mode higher than the fist order in the InGaN buffer layer, and allow easy recoupling of the laser oscillation mode to the InGaN buffer layer so that this region D must be avoided.

Lines 81–89 represent boundaries, each of which is defined between the regions satisfying and not satisfying the formula (1), under various conditions. As conditions common to all the lines, the semiconductor laser element of this embodiment has the structure in which all the n-type AlGaN clad layers included in the n-type AlGaInN clad layer and the p-type AlGaN clad layer have the aluminum content of 0.08, and the n-type InGaN buffer layer and the n-type guide layer are spaced by 0.4 $\mu$m from each other Solid lines 81, 82 and 83 represent the boundaries each defined between the regions satisfying and not satisfying the formula (1) in the case where the GaN guide layer has the thickness of 0.08 $\mu$m. Solid line 81 represents the boundary between regions A and B, solid line 82 represents the boundary between regions B and C, and solid line 83 represents the boundary between regions C and D. Broken lines 84, 85 and 86 represent the boundaries each defined between the regions satisfying and not satisfying the formula (1) in the case where the GaN guide layer has the thickness of 0.10 $\mu$m. Broken line 84 represents the boundary between regions A and B, broken line 85 represents the boundary between regions B and C, and broken line 86 represents the boundary between regions C and D. Dotted lines 87, 88 and 89 represent the boundaries each defined between the regions satisfying and not satisfying the formula (1) in the case where the GaN guide layer has the thickness of 0.15 $\mu$m. Dotted line 87 represents the boundary between regions A and B, dotted line 88 represents the boundary between regions B and C, and dotted line 89 represents the boundary between regions C and D.

For easily obtaining the results of calculation shown in FIG. 8, the upper and lower guide films have thicknesses which are determined to provide a symmetrical relationship. However, these may be asymmetrical, in which case the average thicknesses of the upper and lower guide layers, i.e., $(d_1+d_2)/2=d$ can be considered as the guide layer thickness assuming that the thicknesses of p- and n-type guide layers are equal to $d_1$ [$\mu$m] and $d_2$ [$\mu$m], respectively. Thereby, the relationships in FIG. 8 can be substantially maintained However, if the degree of asymmetry is increased to a considerably large extent, this adversely affects the light confinement in the active layer, and therefore the asymmetry is allowed only to an extent not causing the adverse effect. For a practical use, a relationship of $0.33 \leq d_1/d_2 \leq 3$ is required, and particularly a relationship of $0.56 \leq d_1/d_2 \leq 1.8$ is preferable.

From FIGS. 5–8, it can be seen that the region satisfying the formula (1) becomes narrowest if the semiconductor laser element of the embodiment has a structure, in which all the n-type AlGaN clad layers included in the n-type AlGaInN clad layer and the p-type AlGaN clad layer have the aluminum content of 0.08, the n-type InGaN buffer layer and the n-type guide layer are spaced by 0.4 $\mu$m from each other, and the GaN guide layer has the thickness of 0.08 $\mu$m. In the actual manufacturing of the semiconductor laser element, the thickness and indium content of the InGaN buffer layer are designed to fall within the region satisfying the formula (1), i.e., region A or C, and it is desired that these values are contained in a region which is sufficiently remote from the boundary line between the regions satisfying and not satisfying the formula (1).

According to the experiments by the inventors and others, the InGaN buffer layer having the layered structure of 200 nm or more in thickness caused deterioration of crystallinity of the semiconductor layer formed thereon. The InGaN buffer layer of the indium content larger than 0.2 caused deterioration of crystallinity of the semiconductor layer formed thereon. According to these results, it is appropriate that the InGaN buffer layer has the thickness of 200 nm or less and the indium content of 0.2 or less. Further, the InGaN buffer layer could achieve an effect of preventing a crack even if the content of indium was very small and did not exceed 0.001. Even if the indium content was changed, the degree of the crack preventing effect hardly changed. The InGaN buffer layer could achieve the effect of preventing a crack even if the thickness thereof was very small and did not exceed 10 $\mu$m. Even if the thickness was changed, the degree of the crack preventing effect hardly changed From the above result, it can be understood that, in the semiconductor laser element of this embodiment, the following regions must be substantially satisfied by $(p_1, t_1)$, i.e., by the indium content $p_1$ and thickness $t_1$ [$\mu$m] of the InGaN buffer layer in the cases (a), (b) and (c) relating to the distance between the InGaN buffer layer and the GaN guide layer, and more specifically, in the case (a) of the distance of 0.2–0.3 $\mu$m, the case (b) of the distance of 0.3–0.4 $\mu$m and the case (c) of the distance larger than 0.4 $\mu$m.

(a) In the case of 0.2–0.3 $\mu$m, $$10 \leq t_1 \leq (0.0080268+0.58533p_1)^{(-1)}, \text{ and } 0.001 \leq p_1 \leq 0.09$$

or $$10 \leq t_1 \leq -8.9956+273.95p_1, \text{ and } 0.09 < p_1 \leq 0.2$$

or $$(0.00017672+0.088604p_1)^{(-1)} \leq t_1 \leq 200, \text{ and } 0.001 \leq p_1 \leq 0.09$$

or $$-103.63+2403.3p_1 \leq t_1 \leq 200, \text{ and } 0.09 < p_1 \leq 0.2 \qquad (2)$$

(b) In the case of 0.3–0.4 $\mu$m, $$10 \leq t_1 \leq (0.0067725+0.50578p_1)^{(-1)}, \text{ and } 0.001 \leq p_1 \leq 0.09$$

or $$10 \leq t_1 \leq -10.86+321.88p_1, \text{ and } 0.09 < p_1 \leq 0.2$$

or $$(0.0014296+0.13014p_1)^{(-1)} \leq t_1 \leq 200, \text{ and } 0.001 \leq p_1 \leq 0.09$$

or $$-42.254+1273.3p_1 \leq t_1 \leq 200, \text{ and } 0.09 < p_1 \leq 0.2 \qquad (3)$$

(c) In the case of 0.4 $\mu$m or more $$10 \leq t_1 \leq (0.0044063+0.3622p_1)^{(-1)}, \text{ and } 0.001 \leq p_1 \leq 0.09$$

or $$10 \leq t_1 \leq -17.958+479p_1, \text{ and } 0.09 < p_1 \leq 0.2$$

or $$(0.0031223+0.26847p_1)^{(-1)} \leq t_1 \leq 200, \text{ and } 0.001 \leq p_1 \leq 0.09$$

or $$-25.867+664.45p_1 \leq t_1 \leq 200, \text{ and } 0.09 < p_1 \leq 0.2 \qquad (4)$$

The ranges described above do not change when the calculation is made with the central wavelength of the laser oscillation varying in a range from 370 to 430 nm (20° C.), the content in the AlGaN clad layer interposed between the InGaN buffer layer and the guide layer varying in a range from 0.08 to 0.2, and the distance between the n-type InGaN buffer layer and the n-type guide layer varying from 0.4 to 0.8 $\mu$m.

From the foregoing, the following relationships can be obtained between $p_1$ and $t_1$ satisfying the foregoing conditions, particularly in the case of (b).

If $0.001 < p_1 \leq 0.01$, $t_1 \leq 80$

If $0.01 < p_1 \leq 0.02$, $t_1 \leq 60$

If $0.02 < p_1 \leq 0.03$, $t_1 \leq 50$

If $0.03 < p_1 \leq 0.04$, $t_1 \leq 40$

If $0.04 < p_1 \leq 0.05$, $t_1 \leq 30$ or $160 \leq t_1 \leq 200$

If $0.05 < p_1 \leq 0.06$, $t_1 \leq 25$ or $130 \leq t_1 \leq 200$

If $0.06 < p_1 \leq 0.07$, $t_1 \leq 22$ or $110 \leq t_1 \leq 200$

If $0.07 < p_1 \leq 0.11$, $t_1 \leq 20$ or $100 \leq t_1 \leq 200$

If $0.11 < p_1 \leq 0.12$, $t_1 \leq 23$ or $110 \leq t_1 \leq 200$

If $0.13 < p_1 \leq 0.14$, $t_1 \leq 30$ or $140 \leq t_1 \leq 200$

If $0.14 < p_1 \leq 0.15$, $t_1 \leq 32$ or $150 \leq t_1 \leq 200$

If $0.15 < p_1 \leq 0.16$, $t_1 \leq 35$ or $165 \leq t_1 \leq 200$

If $0.16 < p_1 \leq 0.17$, $t_1 \leq 40$ or $175 \leq t_1 \leq 200$

If $0.17 < p_1 \leq 0.18$, $t_1 \leq 45$ or $190 \leq t_1 \leq 200$

If $0.18 < p_1 \leq 0.20$, $t_1 \leq 50$

Ranges relating to the cases (a) and (c) are not described for simplicity reason. The foregoing example of the InGaN buffer layer, which is prepared in the method of manufacturing the semiconductor laser element of the embodiment, has the thickness of 50 nm and the content of 0.02, which fall within the foregoing ranges.

For achieving the good optical characteristics, the indium content $p_1$ and thickness $t_1$ of the InGaN buffer layer are restricted to the foregoing regions. For sating the following demand, the preferable range of the InGaN buffer layer is further restricted. The InGaN buffer layer disposed in the p- or n-type clad layer performs the absorption, which causes absorption of the laser oscillation mode, and increases the threshold current density. Therefore, it is desired that the absorption factor of the InGaN buffer layer is Small. If the indium content of the InGaN buffer layer is large, the absorption of the laser oscillation mode in the InGaN buffer layer increases so that it is preferable that the indium content of the InGaN buffer layer is relatively small. In view of the above, it is further desirable that the conditions of $p_1 \leq 0.09$ are added to the restrictions on the range described above.

Figure 9:
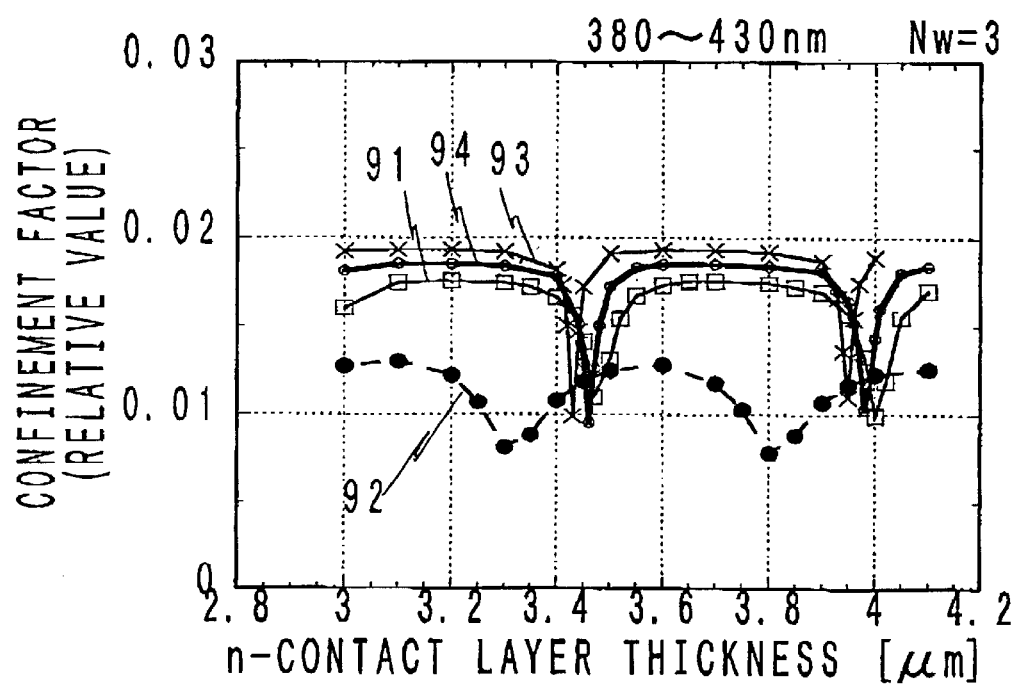
FIG. 9 shows the active layer confinement factor in the laser oscillation mode with various values of the thickness of the n-type GaN contact layer in the structure of the semiconductor laser element of the first embodiment.

FIG. 9 shows the change in active layer confinement factor of the laser oscillation mode in accordance with the change in thickness of the n-type GaN contact layer in the structure of the semiconductor laser element of this embodiment. Characteristics 91, 92 and 93 are exhibited when the content and thickness of the n-type InGaN buffer layer disposed in the n-type AlGaInN clad layer having a total thickness of 0.8 $\mu$m belong to regions A, B and C shown in FIGS. 5–8, respectively. In FIG. 9, characteristics 91 are exhibited when the InGaN buffer layer has the content of 0.02 and the layer thickness of 50 nm. Characteristics 92 are exhibited when the content is 0.07, and the thickness is 50 nm. Characteristics 93 are exhibited when the content is 0.09, and the thickness is 100 nm. Characteristics 94 are exhibited when the n-type AlGaInN clad layer is formed of only the n-type AlGaN clad layer of 0.8 $\mu$m in thickness. When the thickness of the n-type GaN contact layer changes, the active layer confinement factor falls in all the characteristics 91, 92, 93 and 94. This occurs under the worst conditions, and thus when spreading of the laser oscillation mode into the n-type GaN contact layer occurs to a large extent. Under these conditions, such problems that the threshold current density increases, and the ripples occur in FFP become remarkable.

As can be seen from FIG. 9, the regions where the active layer confinement factor falls according to characteristics 91 and 93 are narrower than that according tu characteristics 92. This is because the conditions according to characteristics 92 easily cause coupling of the laser oscillation mode to the InGaN buffer layer, and easily cause spreading of the laser oscillation mode coupled to the InGaN buffer layer into the n-type GaN contact layer Thus, the content and thickness of the n-type InGaN buffer layer disposed in the n-type AlGaInN clad layer may be set to fall within the regions satisfying the formula (1) or (2)–(4), whereby the coupling of the laser oscillation mode to the n-type GaN contact layer can be suppressed, and thereby lowering in threshold current density and suppression of ripples in FFP can be achieved.

Characteristics 91 and 93 exhibit the active layer confinement factors, which are raised as compared with that in characteristics 92, over the whole area of thickness of the n-type GaN contact layer thickness shown in the figure. This is for the following reasons. Characteristics 92 provide the conditions, under which the laser oscillation mode is strongly coupled to the InGaN buffer layer, and the electric field amplitude of the laser oscillation mode in the InGaN buffer layer is large so that the active layer confinement factor is lowered. In contrast to this, characteristics 91 and 93 suppress the coupling of the laser oscillation mode to the InGaN buffer layer so that the active layer confinement factor is improved Almost all the laser elements prepared in accordance with the embodiment performed the oscillation with the oscillation threshold voltage ($V_p$) of about 5 V and the threshold current density ($J_{th}$) of about 2 kA/cm². In the conventional semiconductor laser, such a phenomenon in which the light output rapidly lowers occurs when the oscillation continues for 10 hours or more, even if the element has no crack. According to the laser element of the embodiment, in which the n-type InGaN buffer layer is disposed in the n-type AlGaN clad layer, characteristics do not change even after elapsing of about 1000 hours. Further, the FFP has a single crest, and good optical characteristics can be achieved.

TABLE 1

| InGaN buffer layer | | | Confinement | Electric Field |
|---|---|---|---|---|
| In Content p1 | Thickness ti [nm] | Position in FIG. 2I | Factor of Laser Oscillation Mode | Distribution of Laser Oscillation Mode |
| Theory | — | 0 | 1(Standard) | |
| case 1 | 0.02 | 50 | <1> | 0.98 | Similar to FIG. 3A |
| case 2 | 0.15 | 30 | <2> | 0.97 | Similar to FIG. 3A |
| case 3 | 0.05 | 170 | <3> | 0.92 | Similar to FIG. 3A |
| case 4 | 0.11 | 125 | <4> | 0.93 | Similar to FIG. 3A |
| case 5 | 0.03 | 120 | B | 0.65 | Similar to FIG. 3B |
| case 6 | 0.17 | 70 | B | 0.59 | Similar to FIG. 3B |

A Table 1 shows a result of an experiment using various combinations of the indium content and thickness of the InGaN buffer layer. Theoretical values are results of calculation of the active layer confinement factor of the laser oscillation mode in the case where the InGaN buffer layer is removed from the structure (i.e., the thickness of InGaN buffer layer is 0 nm). Cases 1–6 correspond to points 214, 215, 217, 218, 219 and 220 in FIG. 21, respectively. Case 1, 2, 3 and 4 belong to regions <1>, <2>, <3> and <4>, respectively. Both cases 5 and 6 belong to region B. In all cases 1–6, the peripheral structure of the InGaN buffer layer is configured such that the distance between the n-type InGaN buffer layer and the n-type GaN guide layer is 0.4 μm, the aluminum content of the n-type AlGaN clad layer is 0.1, and the thickness of each of the n-t and p-type GaN guide layers is 0.1 μm. The active layer confinement factor of the laser oscillation mode is represented by a relative value with respect to the value of one, which is assumed to be obtained when the InGaN buffer layer has a thickness of 0 nm (theoretical value). It can be seen that, in all cases 1, 2, 3 and 4, the active layer confinement factor of the laser oscillation mode takes on the value of 90% or more of the value (theoretical value) achieved by the InGaN buffer layer of 0 nm in thickness. The electric field distribution of the laser oscillation mode is similar to that in FIG. 3(a), and the FFP has a single crest form. In contrast to this, the active layer confinement factor of the laser oscillation mode according to cases 5 and 6 takes on the value smaller than 90% of the value (theoretical value) achieved by the InGaN buffer layer of 0 nm in thickness. The electric field distribution of the laser oscillation mode is similar to that in FIG. 3(b), and the FFP has many ripples. It can be understood from the above that, by setting the indium content and thickness of the InGaN buffer layer in the predetermined ranges, the active layer confinement factor of the laser oscillation mode is improved, and the ripples in the FFP are suppressed The foregoing facts are already confirmed by the experiment.

In this embodiment, it is not essential that all the n-type AlGaN clad layers included in the n-type AlGaInN clad layer and the p-type AlGaN layer have the same aluminum content. Even if different aluminum contents are employed, the semiconductor laser element may have the structure including the InGaN buffer layer, which is designed to satisfy the formula (1) by the parameter of the foregoing F, in the n-type AlGaInN clad layer, whereby the effects of the invention can be achieved. However, it is desired that all the aluminum contents of the AlGaN clad layers in the semiconductor laser element structure are the same, in view of the symmetry of the laser oscillation mode.

In this embodiment, the active layer is formed of the three-layer quantum well active layer. However, it may be formed of a quantum well active layer having two, four or more layers. Even in the latter case, the relational formula (1) required in the invention as well as the relational formulas (2)–(4) required in connection with the InGaN buffer layer are the same as those already described, and the same effects can be achieved In the structure of the semiconductor laser element of the embodiment, the n-type $In_rGa_{1-r}N$ buffer layer interposed between the n-type AlGaIn clad layer and the n-type GaN contact layer has the effect of further reducing the cracks in the semiconductor multilayer wafer. However, the structure not provided with the n-type $In_rGa_{1-r}N$ buffer layer is also contained in the scope of the appended claims, and hardly affects the active layer confinement factor of the semiconductor laser element and the FFP.

The substrate used in the semiconductor laser element of the embodiment is made of sapphire, but may be made of another material such as GaN. In the latter case, the content and thickness of the InGaN buffer layer disposed in the AlGaInN clad layer must satisfy the same ranges of conditions as the case of the sapphire substrate.

(Second Embodiment)

FIG. 4 is a schematic view showing a semiconductor laser element of the second embodiment of the invention. FIG. 4 shows a section of a waveguide portion of the semiconductor laser element, and particularly shows the section perpendicular to a resonator. The semiconductor laser element includes various nitride-contained semiconductor layers, and more specifically includes (0001) C-surface sapphire substrate 1 (thickness: 30–300 μm), GaN low-temperature buffer layer 2 (thickness: 0–100 nm), n-type GaN contact layer 3 (thickness: 0.1–10 μm), n-type $In_rGa_{1-r}N$ ($0 \leq r \leq 0.2$) buffer layer 41 (thickness: 0–200 nm), n-type AlGaInN clad layer 15 (total thickness: about 0.8–10 μm) formed of n-type $Al_{x1}Ga_{1-x1}N$ ($0.08 \leq x_1 \leq 0.2$) clad layer 4 (thickness; 0.2–0.8 μm), n-type $In_{p1}Ga_{1-p1}N$ ($0.08 \leq p_1 \leq 0.2$) buffer layer 5 (thickness. 10–200 nm) and n-type $Al_{x2}Ga_{1-x2}N$ ($0.08 \leq x_2 \leq 0.2$) clad layer 4 (thickness: 0.2–0.8 μm), n-type $In_sGa_{1-s}N$ ($0 \leq s \leq 0.1$) guide layer 6 (thickness: 0.08–0.15 μm), multiple quantum well active layer 7 (light emission wavelength: 370–430 μm, total thickness: 5–60 nm) formed of an alternate multilayer structure (barrier layer, well layer, ..., well layer and barrier layer) including the $In_wGa_{1-w}N$ ($0 \leq w \leq 0.2$) well layers and the $In_vGa_{1-v}N$ ($0 \leq v \leq w$) barrier layers, p-type $Al_zGa_{1-z}N$ ($0 \leq z \leq 0.3$) carrier block layer 8 (thickness: 0–20 nm), p-type $In_tGa_{1-t}N$ ($0 \leq t \leq 0.1$) guide layer 9 (thickness: 0.08–0.15 μm), p-type $Al_yGa_{1-y}N$ ($0.08 \leq y \leq 0.2$) clad layer 10 (thickness: 0.2–0.8 μm) and p-type GaN contact layer 11 (thickness: 0.01–10 μm).

Above these layers, an insulating film 12 of a required configuration is formed in a mesa-like form on the substantially whole surface. A positive electrode 13 (e.g., Pd/Au, Ni/Pd/Au or Pd/Pt/Au) is formed over the substantially whole surface in a mesa-like form including the whole of the exposed surface of the p-type GaN contact layer. The negative electrode 14 (e.g., Ti/Al, Zr/Al or Hf/Al) is formed on a portion of an exposed surface of the n-type GaN contact layer. The mesa is formed of the n-type GaN contact layer, n-type InGaN buffer layer, n-type AlGaInN clad layer, n-type InGaN guide layer, InGaN multiple quantum well active layer, p-type AlGaN carrier block layer, p-type InGaN guide layer, p-type AlGaN clad layer, p-type GaN contact layer, insulating film (more specifically, only in the required region) and positive electrode. The opposite end surfaces of the stripe function as mirrors, and form a photo-resonator.

Then, description will be given on a method of manufacturing the semiconductor laser element of the second embodiment.

First, the (0001) C-surface sapphire substrate is cleaned. The cleaned (0001) C-surface sapphire substrate is moved into a MOCVD device, and is subjected to cleaning within an atmosphere of $H_2$ at a temperature of about 1100° C. After lowering the temperature, $NH_3$ and trimethyl gallium (TMG) at 600° C. are supplied at rates of 5 liter/minute and 20 mol/minute, respectively, while flowing hydrogen ($H_2$) at 10 liter/minute as a carrier gas. Thereby, the GaN low temperature buffer layer of 0–100 nm (e.g., about 20 nm) in thickness is grown. The low temperature buffer layer is not restricted to GaN. Alternatively, trimethyl aluminum (CMA), TMG or NH3 may be used, and thereby an AlN or GaAlN film may be used without causing no adverse effect.

Then, the temperature is raised to about 1050° C. while flowing $N_2$ and $NH_3$ each at a rate of 5 liter/minute. When the temperature rises, the carrier gas is changed from $N_2$ to $H_2$, and TMG and $SiH_4$ are supplied at rates of 100 $\mu$mol/minute and 10 nmol/minute, respectively, so that the n-type GaN contact layer of 0.1–10 $\mu$m (e.g., about 4 $\mu$m) is grown. Then, the supply of TMG is stopped, and the carrier gas is changed from $H_2$ to $N_2$ again. After lowering the temperature to about 800° C., the flow rate of TMG is adjusted to 15 $\mu$mol/minute, and trimethyl indium (TMI) which is an indium material is supplied at a constant rate. Thereby, the $In_rGa_{1-r}N$ (e.g., r=0.07) buffer layer of 0–200 nm (e.g., 50 nm) in thickness is grown. Then, the supply of TMI and TMG is stopped, and the temperature is raised to 1050° C. again. The carrier gas is changed from $N_2$ to $H_2$. The flow rate of TMG is adjusted to 50 $\mu$mol/minute, and the TMA is supplied at a rate of 40 $\mu$mol/minute. Thereby, the n-type $Al_{x1}Ga_{1-x1}N$ (e.g., $x_1$=0.1) clad layer of 0.2–0.8 $\mu$m (e.g., 0.5 $\mu$m) in thickness is grown. The supply of TMG and TMA is stopped, and the carrier gas is changed from $H_2$ to $N_2$. After lowering the temperature to about 800° C., the flow rate of TMG is adjusted to 15 $\mu$mol/minute, and the TMI is supplied at a constant rate. Thereby, the $In_pGa_{1-p}N$ (e.g., p=0.02) buffer layer of 10–200 nm (e.g., 50 nm) in thickness is grown. Then, the supply of TMG is stopped, and the temperature is raised to 1050° C. again. The carrier gas is changed from $N_2$ to $H_2$. The flow rate of TMG is adjusted to 50 $\mu$mol/minute, and the TMA is supplied at a rate of 40 $\mu$mol/minute. Thereby, the n-type $Al_{x2}Ga_{1-x2}N$ (e.g., $x_2$=0.1) clad layer of 0.2–0.8 $\mu$m (e.g., 0.5 $\mu$m) in thickness is grown.

When the growth of $Al_{x2}Ga_{1-x2}N$ stops, the supply of TMA and TMG is stopped, and the carrier gas is changed from $H_2$ to $N_2$ again. After lowering the temperature to 700° C., the flow rate of TMG is adjusted to 15 $\mu$mol/minute, and the TMI is supplied at a constant rate so that n-type InsGa1-sN guide layer (e.g., s=0.01) of 0.08–0.15 $\mu$m (e.g., 0.1 $\mu$m) in thickness is grown. The flow rate of TMI is adjusted to 10 $\mu$mol/minute to grow the barrier layer of 4 nm in thickness, which is made of $In_vGa_{1-v}N$ (e.g., v=0.05). Thereafter, the supply rate of TMI is increased to a 50 $\mu$mol/minute so that the well layer having a thickness of, e.g., 2 nm and made of $In_wGa_{1-w}N$ (e.g., w=0.17) is grown. The well layers which are three in total number are grown in the similar manner, and the multiple quantum well (MQW) having a light emission wavelength of about 380–430 nm (e.g., 400–410 nm) is grown. This MQW includes the barrier layers of four in total number, which are present between the well layers or on the opposite sides of the well layers. When the growth of the MQW ends, the supply of TMI and TMG is stopped, and the temperature is raised to 1050° C. again. The carrier gas is changed from $N_2$ to $H_2$ again, and the TMG is supplied at a rate of 50 $\mu$mol/minute. Also, the TMA is supplied at a rate of 30 $\mu$mol/minute, and the bis cyclopentadienyl magnesium ($Cp_2Mg$), which is a p-type doping material, is flowed at a rate of 10 nmol/minute so that the p-type $AL_zGa_{1-z}N$ (e.g., z=0.2) carrier block layer of 0–20 nm (e.g., 20 nm) in thickness is grown. When growth of the carrier block layer stops, the supply of TMA, TMG and $Cp_2Mg$ is stopped, and the carrier gas is changed from $II_2$ to $N_2$. The temperature is lowered to about 700° C. The flow rate of TMG is adjusted to 15 $\mu$mol/minute, and the TMI is supplied at a constant rate. $Cp_2Mg$ is flowed at a rate of 10 nmol/minute so that the p-type $In_tGa_{1-t}N$ guide layer (e.g., t =0.01) of 0.08–0.15 $\mu$m (e.g., 0.1 $\mu$m) in thickness is grown. Supply of TMA, TMG and $Cp_2Mg$ is stopped, and the temperature is raised to 1050° C. again. Also, the carrier gas is changed from $N_2$ to $H_2$ again. Thereafter, the supply rate of TMG is adjusted to 50 $\mu$m/minute, the TMA is supplied at a rate of 40 $\mu$mol/minute and $Cp_2Mg$ is supplied at a rate of 10 $\mu$mol/minute so that the p-type $Al_yGa_{1-y}N$ (e.g., y=0.1) clad layer of 0.2–0.8 $\mu$m (e.g., 0.5 $\mu$m) in thickness is grown. Finally, the supply rate of TMG is adjusted to 100 $\mu$mol/minute, and the supply of TMA is stopped so that the p-type GaN contact layer of 0.01–10 $\mu$m (e.g., 0.1 $\mu$m) in thickness is grown. Thereby, the growth of the light-emitting element structure ends. When the growth ends, the supply of TMG and $Cp_2Mg$ is stopped, and the temperature is lowered Then, the structure at a room temperature is taken out from the MOCVD device The outermost surface (last grown surface) of the film having the laser structure of the embodiment had a surface roughness of about 10 nm in average value (Ra), and thus exhibited a very good flatness.

Thereafter, the photolithography technique and reactive ion etching technique are used to effect the etching on the p-type $Al_yGa_{1-y}N$ clad layer while leaving the p-type GaN contact layer in the stripe form having a stripe width of 3 $\mu$m. Thereby, the insulating film is formed by the photolithography technique in the region except for a portion, where the p-type GaN contact layer is in contact with the electrode. Thereafter, the reactive ion etching technique is used to remove a portion, where the negative electrode is to be formed, from a region between the wafer top surface and a middle position of the n-type GaN contact layer. Thereafter, the positive electrode is formed on the exposed portion of the surface of the p-type GaN contact layer in the mesa-like form. The material of the electrodes may be Au/Ni or Au/Pd. The negative electrode is formed substantially entirely over the exposed surface portion of the n-type GaN contact layer. The material of the negative electrode may be Al/Ti or Au/W.

Finally, cleavage or dry etching is used to achieve the element length of about 0.5 mm, and the end surface forming the mirror is formed In the foregoing manners, the semiconductor laser element of the second embodiment shown in FIG. 4 is manufactured.

In the semiconductor laser element of the first embodiment, the n- and p-type guide layers are made of InGaN. In the semiconductor laser element of the second embodiment, the n-type InGaN buffer layer contained in the n-type AlGaInN clad layer has the film thickness and the indium content, which are designed to satisfy the formula (1) of such conditions that the laser oscillation mode does not couple to the three-layer slab waveguide formed of the n-type InGaN buffer layer and the neighboring layers, i.e., the n-type AlGaN clad layers.

Figure 10:
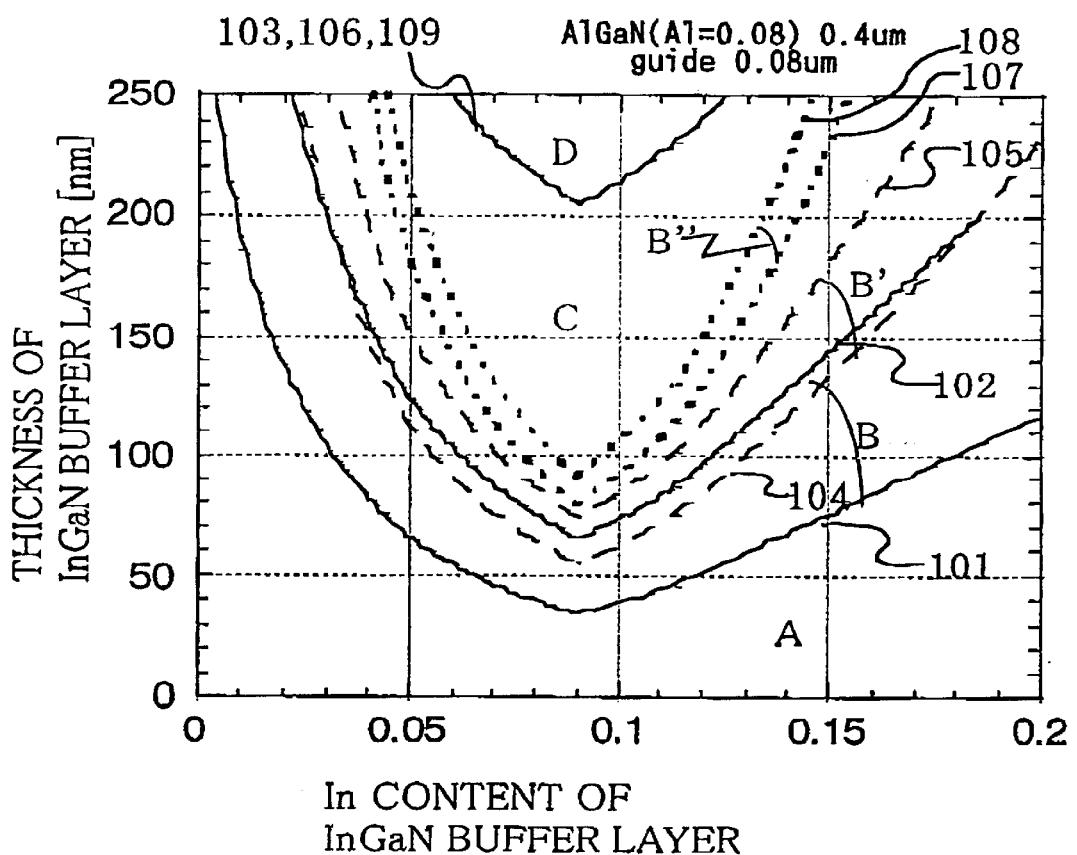
FIG. 10 shows ranges of the indium content and thickness of the InGaN buffer layer satisfying a relationship of F<0.4 in the structure of the semiconductor laser element of a second embodiment including the InGaN buffer layer and a guide layer spaced by 0.4 μm or more, and particularly shows a change in boundary line of the above ranges according to various values of indium contents of p- and n-type guide layers in a range from 0.02 to 0.06.

FIG. 10 shows a case where the InGaN buffer layer and the guide layer are spaced by a distance of 0.4 µm or more, and particularly shows ranges of the indium content and thickness of the n-type InGaN buffer layer satisfying formula (1) in the structure of the semiconductor laser element of this embodiment. In FIG. 10, conditions in regions A and C satisfy the formula (1). Conditions in region B allow easy coupling of the laser oscillation mode to the InGaN buffer layer so that this. region B must be avoided. Conditions in region D cause high-order mode higher than the first order in the InGaN buffer layer, and allow easy recoupling of the laser oscillation mode to the InGaN buffer layer so that this region D must be avoided.

Lines 101–109 represent boundaries, each of which is defined between the region (A or C) satisfying the formula (1) and the region (13) not satisfying the formula (1), under various conditions. As conditions common to all the boundary lines, the semiconductor laser element of this embodiment has such structure that each of the n-type AlGaN clad layers included in the n-type AlGaInN clad layer and the p-type AlGaN clad layer has a thickness of 0.4 µm and a content of 0.08, and each of the n-type $In_sGa_{1-s}N$ guide layer and the p-type $In_tGa_{1-t}N$ guide layer has a thickness of 0.08 µm. Solid lines 101, 102 and 103 represent the boundaries each defined between the regions sa g and not satisfying the formula (1) in the case where each of the n-type $In_sGa_{1-s}N$ guide layer and the p-type $In_tGa_{1-t}N$ guide layer has the indium content of 0.02. Solid line 101 represents the boundary between regions A and B, solid line 102 represents the boundary between regions B and C, and solid line 103 represents the boundary between regions C and D. Broken lines 104, 105 and 106 represent the boundaries each defined between the regions satisfying and not satisfying the formula (1) in the case where each of the n-type $In_sGa_{1-s}N$ guide layer and the p-type $In_tGa_{1-t}N$ guide layer has the indium content of 0.04. Broken line 104 represents the boundary between regions A and B, broken line 105 represents the boundary between regions B and C, and broken line 106 represents the boundary between regions C and D. Dotted lines 107, 108 and 109 represent the boundaries each defined between the regions satisfying and not satisfying the formula (1) in the case where each of the n-type $In_sGa_{1-s}N$ guide layer and the p-type $In_tGa_{1-t}N$ guide layer has the indium content of 0.06. Dotted line 107 represents the boundary between regions A and B. dotted line 108 represents the boundary between regions B and C, and dotted line 109 represents the boundary between regions C and D.

Figure 11:
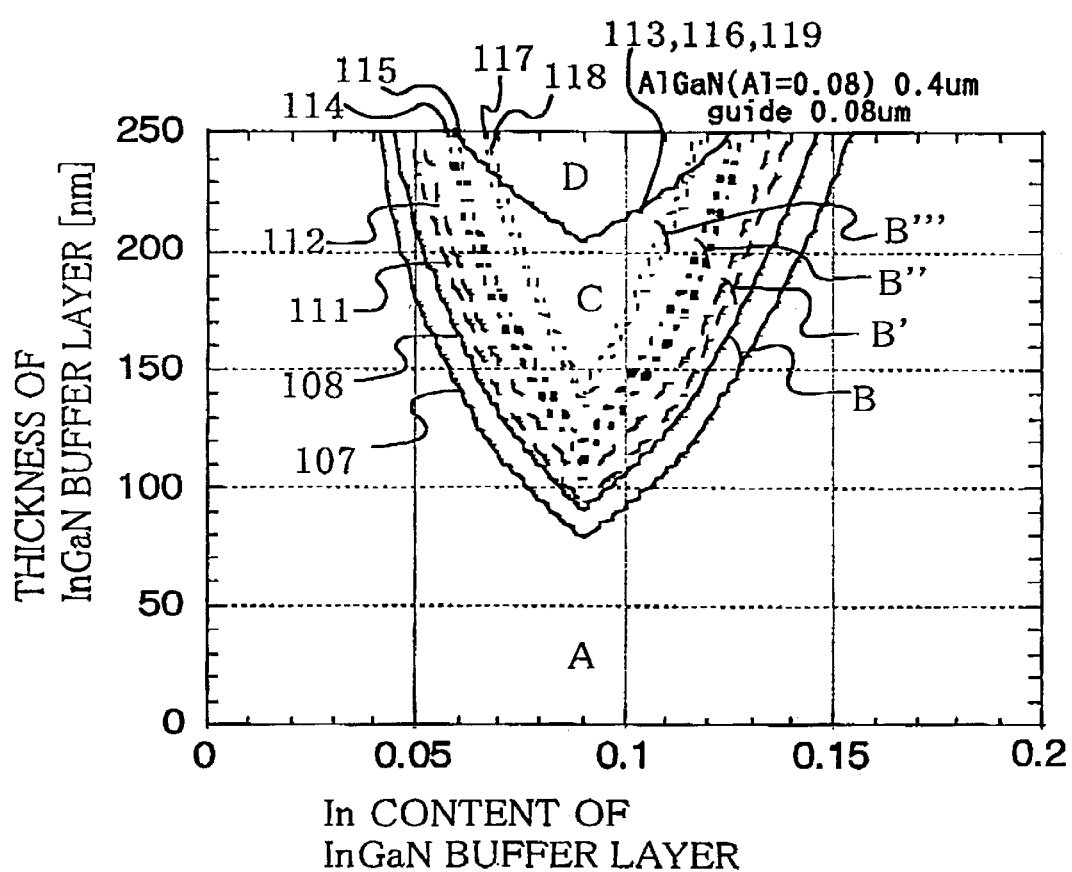
FIG. 11 shows ranges of the indium content and thickness of the InGaN buffer layer satisfying a relationship of F<0.4 in the structure of the semiconductor laser element of the second embodiment including the InGaN buffer layer and the guide layer spaced by 0.4 μm or more, and particularly shows the change in boundary line of the above ranges according to various values of the indium contents of p- and n-type guide layers in a range from 0.06 to 0.09.

FIG. 11 shows a case where the InGaN buffer layer and the guide layer are spaced by a distance of 0.4 µm or more, and particularly shows ranges of the indium content and thickness of the n-type InGaN buffer layer satisfying formula (1) in the structure of the semiconductor laser element of this embodiment. In FIG. 11, conditions in regions A and C satisfy the formula (1). Conditions in region B allow easy coupling of the laser oscillation mode to the InGaN buffer layer so that this region B must be avoided Conditions in region D cause high-order mode higher than the first order in the InGaN buffer layer, and allow easy recoupling of the laser oscillation mode to the InGaN buffer layer so that this region D must be avoided.

Lines 111–119 represent boundaries, each of which is defined between the region (A or C) satisfying the formula (1) and the region (B) not satisfying the formula (1), under various conditions. As conditions common to all the boundary lines, the semiconductor laser element of this embodiment has such structure that each of the n-type AlGaN clad layers included in the n-type AlGaInN clad layer and the p-type AlGaN clad layer has a thickness of 0.4 µm and a content of 0.08, and each of the n-type $In_sGa_{1-s}N$ guide layer and the p-type $In_tGa_{1-t}N$ guide layer has a thickness of 0.08 µm. Solid lines 111, 112 and 113 represent the boundaries each defined between the regions satisfying and not sating the formula (1) in the case where each of the n-type $In_sGa_{1-s}N$ guide layer and the p-type $In_tGa_{1-t}N$ guide layer has the indium content of 0.07. Solid line 111 represents the boundary between regions A and B, solid line 112 represents the boundary between regions B and C, and solid line 113 represents the boundary between regions C and D. Broken lines 114, 115 and 116 represent the boundaries each defined between the regions satisfying and not sating the formula (1) in the case where each of the n-type $In_sGa_{1-s}N$ guide layer and the p-type $In_tGa_{1-t}N$ guide layer has the indium content of 0.08. Broken line 114 represents the boundary between regions A and B, broken line 115 represents the boundary between regions B and C, and broken line 116 represents the boundary between regions C and D. Dotted lines 117, 118 and 119 represent the boundaries each defined between the regions satisfying and not sating the formula (1) in the case where each of the n-type $In_sGa_{1-s}N$ guide layer and the p-type $In_tGa_{1-t}N$ guide layer has the indium content of 0.09. Dotted line 117 represents the boundary between regions A and B, dotted line 118 represents the boundary between regions B and C, and dotted line 119 represents the boundary between regions C and D.

Figure 12:
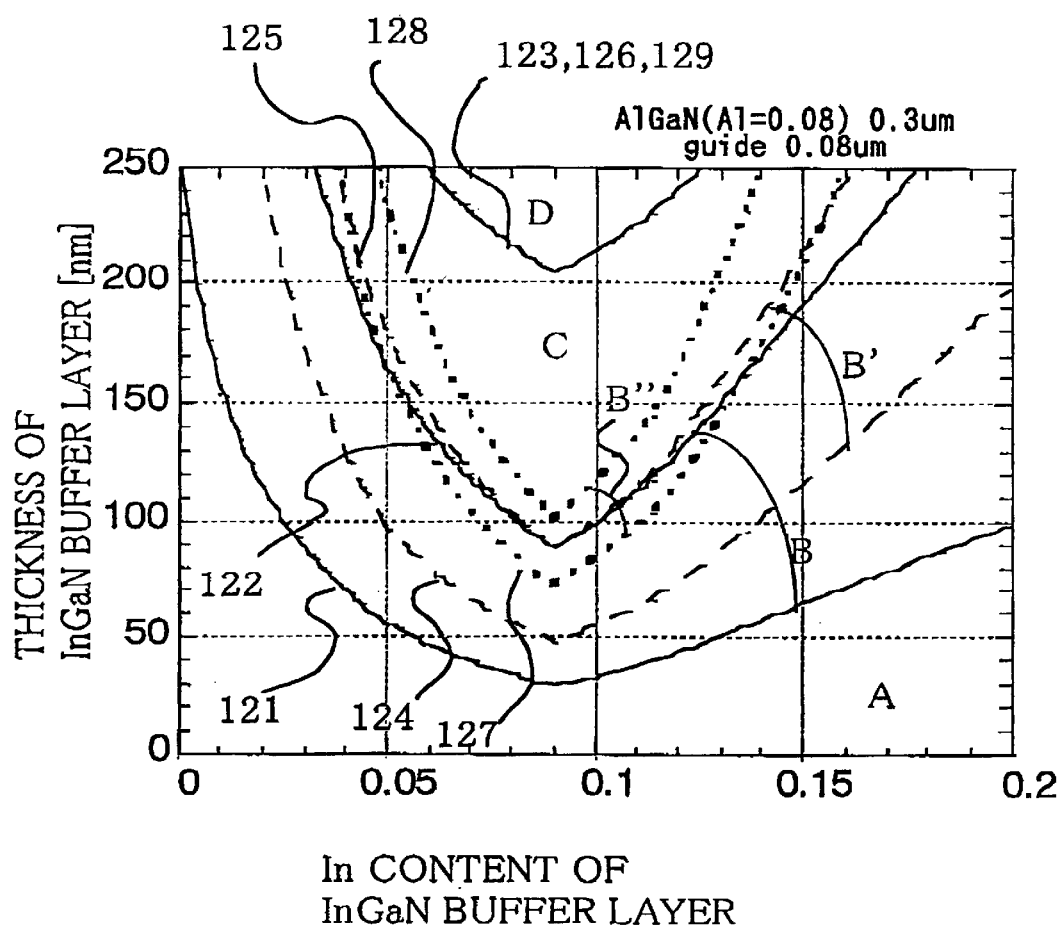
FIG. 12 shows ranges of the indium content and thickness of the InGaN buffer layer satisfying a relationship of F<0.4 in the structure of the semiconductor laser element of the second embodiment including the InGaN buffer layer and the guide layer spaced by a distance of 0.3–0.4 μm, and particularly shows a change in boundary line of the above ranges according to various values of the indium contents of p- and n-type guide layers in a range from 0.02 to 0.06.

FIG. 12 shows a case where the InGaN buffer layer and the guide layer are spaced by a distance from 0.3 to 0.4 µm, and particularly shows ranges of the indium content and thickness of the n-type InGaN buffer layer satisfying formula (1) in the structure of the semiconductor laser element of this embodiment. In FIG. 12, conditions in regions A and C satisfy the formula (1). Conditions in region B allow easy coupling of the laser oscillation mode to the InGaN buffer layer so that this region B must be avoided. Conditions in region D cause high-order mode higher than the first order in the InGaN buffer layer, and allow easy recoupling of the laser oscillation mode to the InGaN buffer layer so that this region D must be avoided.

Lines 121–129 represent boundaries, each of which is defined between the region (A or C) satisfying the formula (1) and the region (B) not satisfying the formula (1), under various conditions. As conditions common to all the boundary lines, the semiconductor laser element of this embodiment has such structure that each of the n-type AlGaN clad layers included in the n-type AlGaInN clad layer and the p-type AlGaN clad layer has a thickness of 0.3 µm and a content of 0.08, and each of the n-type $In_sGa_{1-s}N$ guide layer and the p-type $In_tGa_{1-t}N$ guide layer has a thickness of 0.08 µm. Solid lines 121, 122 and 123 represent the boundaries each defined between the regions satisfying and not sating the formula (1) in the case where each of the n-type $In_sGa_{1-s}N$ guide layer and the p-type $In_tGa_{1-t}N$ guide layer has the indium content of 0.02. Solid line 121 represents the boundary between regions A and B, solid line 122 represents the boundary between regions B and C, and solid line 123 represents the boundary between regions C and D. Broken lines 124, 125 and 126 represent the boundaries each defined between the regions satisfying and not satisfying the formula (1) in the case where each of the n-type $In_sGa_{1-s}N$ guide layer and the p-type $In_tGa_{1-t}N$ guide layer has the indium content of 0.04. Broken line 124 represents the boundary between regions A and B, broken line 125 represents the boundary between regions B and C, and broken line 126 represents the boundary between regions C and D. Dotted lines 127, 128 and 129 represent the boundaries each defined between the regions satisfying and not satisfying the formula (1) in the case where each of the n-type $In_sGa_{1-s}N$ guide layer and the p-type $In_tGa_{1-t}N$ guide layer has the indium content of 0.06. Dotted line 127 represents the boundary between regions A and B, dotted line 128 represents the boundary between regions B and C, and dotted line 129 represents the boundary between regions C and D.

Figure 13:
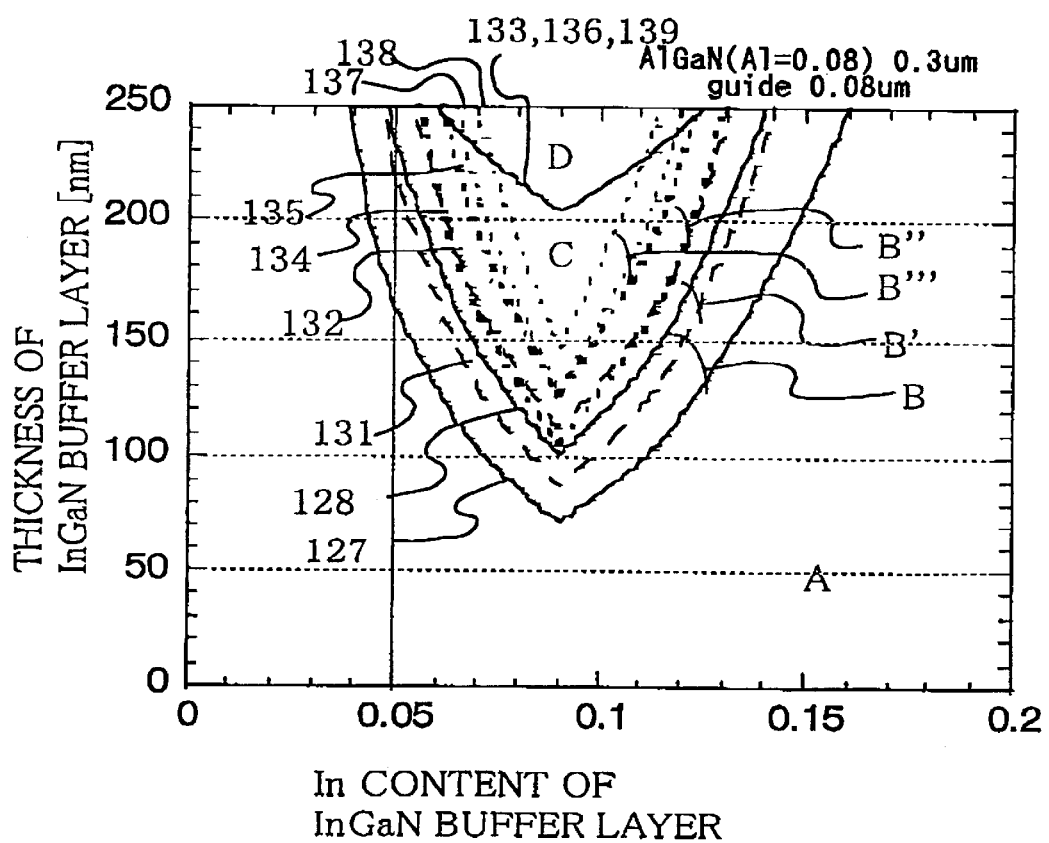
FIG. 13 shows ranges of the indium content and thickness of the InGaN buffer layer satisfying a relationship of F<0.4 in the structure of the semiconductor laser element of the second embodiment including the InGaN buffer layer and a guide layer spaced by a distance of 0.3–0.4 μm, and particularly shows a change in boundary line of the above ranges according to various values of the indium contents of p- and n-type guide layers in a range from 0.06 to 0.09.

FIG. 13 shows a case where the InGaN buffer layer and the guide layer are spaced by a distance from 0.3 to 0.4 μm, and particularly shows ranges of the indium content and thickness of the n-type InGaN buffer layer satisfying formula (1) in the structure of the semiconductor laser element of this embodiment. In FIG. 13, conditions in regions A and C satisfy the formula (1). Conditions in region B allow easy coupling of the laser oscillation mode to the InGaN buffer layer so that this region B must be avoided. Conditions in region D cause high-order mode higher than the first order in the InGaN buffer layer, and allow easy recoupling of the laser oscillation mode to the InGaN buffer layer so that this region D must be avoided.

Lines 131–139 represent boundaries, each of which is defined between the region (A or C) satisfying the formula (1) and the region (B) not satisfying the formula (1), under various conditions. As conditions common to all the boundary lines, the semiconductor laser element of this embodiment has such structure that each of the n-type AlGaN clad layers included in the n-type AlGaInN clad layer and the p-type AlGaN clad layer has a thickness of 0.3 μm and a content of 0.08, and each of the n-type $In_sGa_{1-s}N$ guide layer and the p-type $In_tGal_{1-t}N$ guide layer has a thickness of 0.08 μm. Solid lines 131, 132 and 133 represent the boundaries each defined between the regions satisfying and not satisfying the formula (1) in the case where each of the n-type $In_sGa_{1-s}N$ guide layer and the n-type $In_tGa_{1-t}N$ guide layer has the indium content of 0.07. Solid line 131 represents the boundary between regions A and B, solid line 132 represents the boundary between regions B and C, and solid line 133 represents the boundary between regions C and D. Broken lines 134, 135 and 136 represent the boundaries each defined between the regions satisfying and not satisfying the formula (1) in the case where each of the n-type $In_sGa_{1-s}N$ guide layer and the p-type $In_tGa_{1-t}N$ guide layer has the indium content of 0.08. Broken line 134 represents the boundary between regions A and B, broken line 135 represents the boundary between regions B and C, and broken line 136 represents the boundary between regions C and D. Dotted lines 137, 138 and 139 represent the boundaries each defined between the regions satisfying and not satisfying the formula (1) in the case where each of the n-type $In_sGa_{1-s}N$ guide layer and the p-type $In_tGa_{1-t}N$ guide layer has the indium content of 0.09. Dotted line 137 represents the boundary between regions A and B, dotted line 138 represents the boundary between regions B and C, and dotted line 139 represents the boundary between regions C and D.

Figure 14:
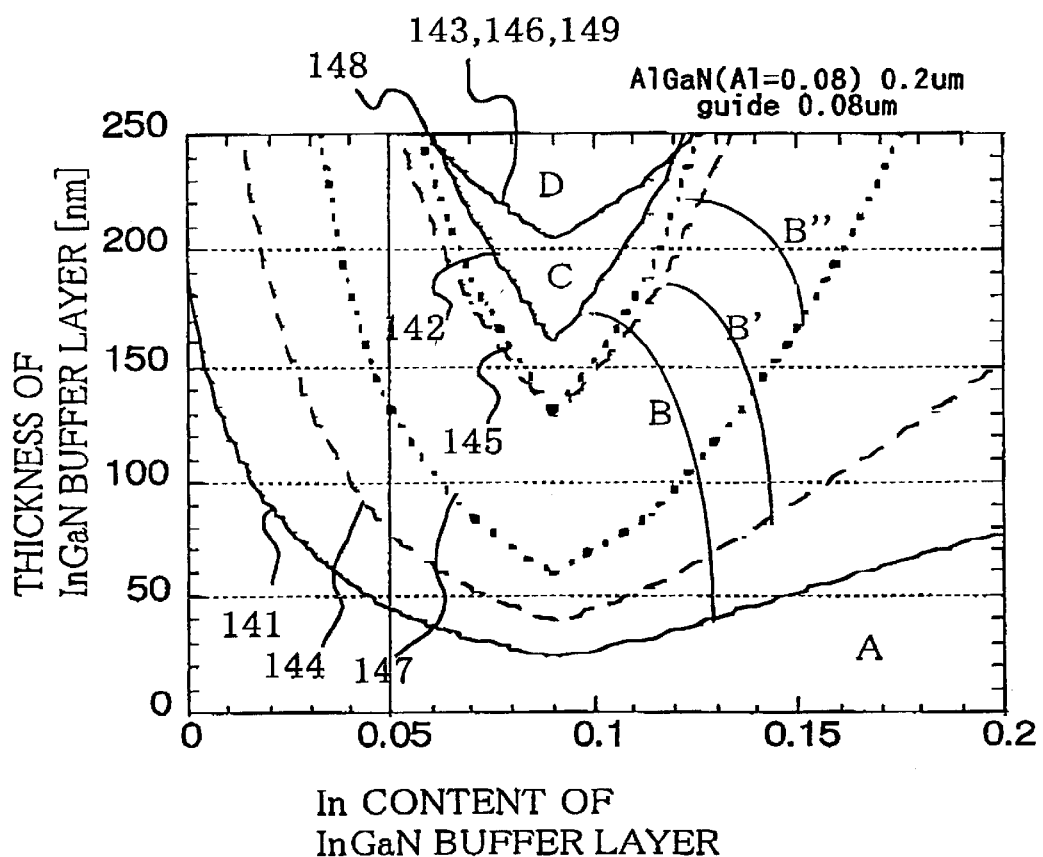
FIG. 14 shows ranges of the indium content and thickness of the InGaN buffer layer satisfying a relationship of F<0.4 in the structure of the semiconductor laser element of the second embodiment including the InGaN buffer layer and the guide layer spaced by a distance of 0.2–0.3 μm, and particularly shows a change in boundary line of the above ranges according to various values of the indium contents of p- and n-type guide layers in a range from 0.02 to 0.06.

FIG. 14 shows a case where the InGaN buffer layer and the guide layer are spaced by a distance from 0.2 to 0.3 μm, and particularly shows ranges of the indium content and thickness of the n-type InGaN buffer layer satisfying formula (1) in the structure of the semiconductor laser element of this embodiment. In FIG. 14, conditions in regions A and C satisfy the formula (1). Conditions in region B allow easy coupling of the laser oscillation mode to the InGaN buffer layer so that this region B must be avoided. Conditions in region D cause high-order mode higher than the first order in the InGaN buffer layer, and allow easy recoupling of the laser oscillation mode to the InGaN buffer layer so that this region D must be avoided.

Lines 141–149 represent boundaries, each of which is defined between the region (A or C) satisfying the formula (1) and the region (B) not satisfying the formula (1), under various conditions. As conditions common to all the boundary lines, the semiconductor laser element of this embodiment has such structure that each of the n-type AlGaN clad layers included in the n-type AlGaInN clad layer and the p-type AlGaN ad layer has a thickness of 0.2 μm and a content of 0.08, and each of the n-type $In_sGa_{1-s}N$ guide layer and the p-type $In_tGa_14N$ guide layer has a thickness of 0.08 μm. Solid lines 141, 142 and 143 represent the boundaries each defined between the regions sating and not satisfying the formula (1) in the case where each of the n-type $In_sGa_{1-s}N$ guide layer and the p-type $In_tGa_{1-t}N$ guide layer has the indium content of 0.02. Solid line 141 represents the boundary between regions A and B, solid line 142 represents the boundary between regions B and C, and solid line 143 represents the boundary between regions C and D. Broken lines 144, 145 and 146 represent the boundaries each defined between the regions satisfying and not satisfying the formula (1) in the case where each of the n-type $In_sGa_{1-s}N$ guide layer and the p-type $In_tGa_{1-t}N$ guide layer has the indium content of 0.04. Broken line 144 represents the boundary between regions A and B, broken line 145 represents the boundary between regions B and C, and broken line 146 represents the boundary between regions C and D. Dotted lines 147, 148 and 149 represent the boundaries each defined between the regions satisfying and not satisfying the formula (1) in the case where each of the n-type $In_sGa_{1-s}N$ guide layer and the p-type $In_tGa_{1-t}N$ guide layer has the indium content of 0.06. Dotted line 147 represents the boundary between regions A and B, dotted line 148 represents the boundary between regions B and C, and dotted line 149 represents the boundary between regions C and D.

Figure 15:
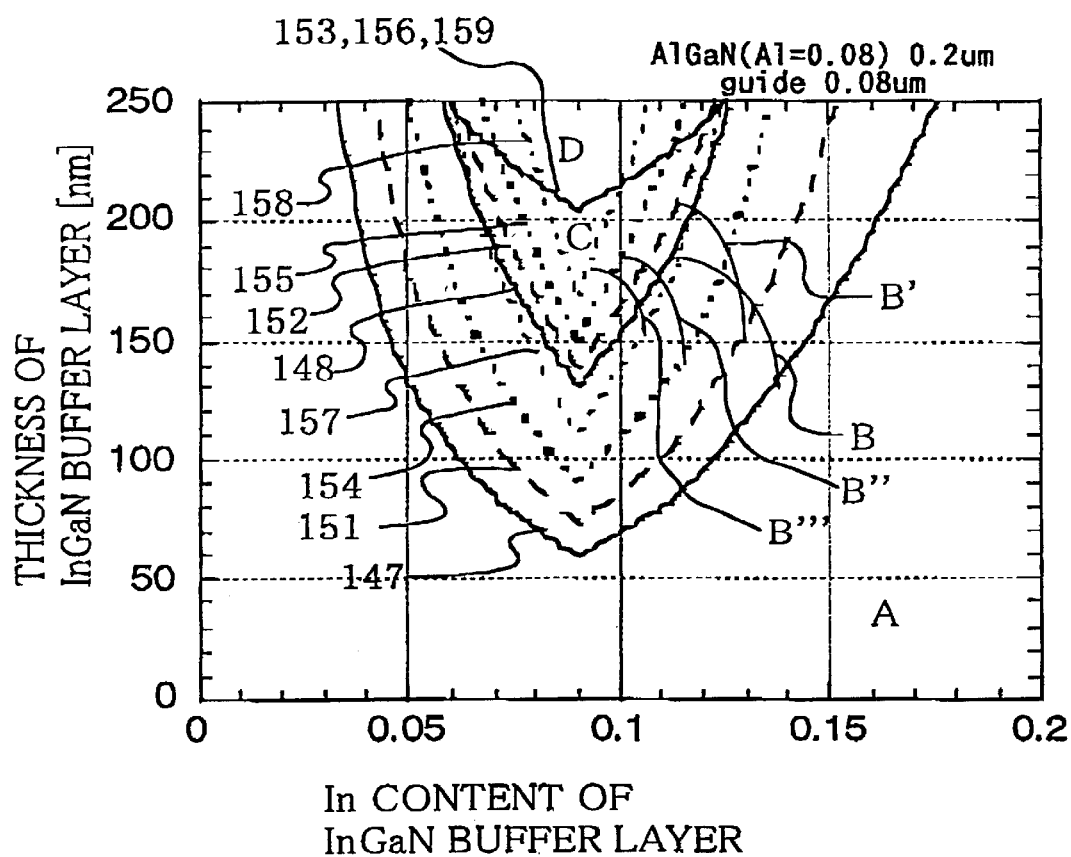
FIG. 15 shows ranges of the indium content and thickness of the InGaN buffer layer satisfying a relationship of F<0.4 in the structure of the semiconductor laser element of the second embodiment including the InGaN buffer layer and the guide layer spaced by a distance of 0.2–0.3 μm, and particularly shows a change in boundary line of the above ranges according to various values of the indium contents of p- and n-type guide layers in a range from 0.06 to 0.09.

FIG. 15 shows a case where the InGaN buffer layer and the guide layer are spaced by a distance from 0.2 to 0.3 μm, and particularly shows ranges of the indium content and thickness of the n-type InGaN buffer layer satisfying formula (1) in the structure of the semiconductor laser element of this embodiment. In FIG. 15, conditions in regions A and C satisfy the formula (1). Conditions in region B allow easy coupling of the laser oscillation mode to the InGaN buffer layer so that this region B must be avoided. Conditions in region D cause high-order mode higher than the first order in the InGaN buffer layer, and allow easy recoupling of the laser oscillation mode to the InGaN buffer layer so that this region D must be avoided.

Lines 151–159 represent boundaries, each of which is defined between the region (A or C) satisfying the formula (1) and the region (B) not satisfying the formula (1), under various conditions. As conditions common to all the boundary lines, the semiconductor laser element of this embodiment has such structure that each of the n-type AlGaN clad layers included in the n-type AlGaIGN clad layer and the p-type AlGaN clad layer has a thickness of 0.2 μm and a content of 0.08, and each of the n-type $In_sGa_{1-s}N$ guide layer and the p-type $In_tGa_{1-t}N$ guide layer has a thickness of 0.08 μm. Solid lines 151, 152 and 153 represent the boundaries each defined between the regions satisfying and not satisfying the formula (1) in the case where each of the a-type $In_sGa_{1-s}N$ guide layer and the p-type $In_tGa_{1-t}N$ guide layer has the indium content of 0.07. Solid line 151 represents the boundary between regions A and B, solid line 152 represents the boundary between regions B and C, and solid line 153 represents the boundary between regions C and D. Broken lines 154, 155 and 156 represent the boundaries each defined between the regions satisfying and not satisfying the formula (1) in the case where each of the n-type $In_sGa_{1-s}N$ guide layer and the p-type $In_tGa_{1-t}N$ guide layer has the indium content of 0.08. Broken line 154 represents the boundary between regions A and B, broken line 155 represents the boundary between regions B and C, and broken line 156 represents the boundary between regions C and D. Dotted lines 157, 158 and 159 represent the boundaries each defined between the regions satisfying and not satisfying the formula (1) in the case where each of the n-type $In_sGa_{1-s}N$ guide layer and the p-type $In_tGa_{1-t}N$ guide layer has the Indium content of 0.09. Dotted line 157 represents the boundary between regions A and B, dotted line 158 represents the boundary between regions B and C, and dotted line 159 represents the boundary between regions C and D.

For the simplicity reason, the results of calculation shown in FIGS. 10–15 are obtained from the symmetrical structure, in which the upper and lower InGaN guide layers are symmetrical, and more specifically, the indium content s and the thickness $d_1$ [μm] of the n-type guide layer are equal to the indium content t and the thickness $d_2$ [μm] of the p-type guide layer, respectively. However, the structure for the calculation may be asymmetrical. In this case, the average thickness of the upper and lower guide layers, i.e., $(d_1+d_2)/2=d$ may be deemed as the guide layer thickness, and thereby the substantially same relationships as those in FIGS. 10–15 can be employed, Further, the weighted average of the composition of the upper and lower glide layers, i.e., $(s·d_1+t·d_2)/(d_1+d_2)$ may be deemed as the guide layer indium composition. Thereby, the substantially same relationships as those in FIGS. 10–15 can be employed. In an actual operation, however, an excessively asymmetrical structure would adversely affect the light confinement in the active layer. Therefore, the ranges are naturally restricted to the range not causing such adverse effects. Practically, a relationship of $-0.05 \leq s-t \leq 0.05$ is necessary, and a relationship of $-0.03 \leq s-t \leq 0.03$ is particularly preferable. Practically, a relationship of $0.33 \leq d_1/d_2 \leq 3$ is necessary, and a relationship of $0.56 \leq d_1/d_2 \leq 1.8$ is particularly preferable. Assuming that the InGaN buffer layer has the indium content of $p_1$ and the thickness of $t_1$ [nm], lines in FIGS. 10–15 can be approximately expressed as follows: Solid line 101 in FIG. 10 can be approximately expressed by:

$$t_1=(0.002182+0.2838p_1)^{(-1)} \text{ if } p_1 \leq 0.09,$$

and $$t_1=-27.916+631.14p_1+418.94p_1^2 \text{ if } 0.09 \leq p_1 \leq 0.2.$$

Solid line 102 in FIG. 10 can be approximately expressed by:

$$t_1=(0.0006499+0.15812p_1)^{(-1)} \text{ if } p_1 \leq 0.09,$$

and $$t_1=10.467+180.02p_1+4063.7p_1^2 \text{ if } 0.09 \leq p_1 \leq 0.2.$$

Solid line 103 in FIG. 10 can be approximately expressed by:

$$t_1=(0.0020902+0.031559p_1)^{(-1)} \text{ if } p_1 \leq 0.09,$$

and $$t_1=-27.916+631.14p_1+418.94p_1^2 \text{ if } 0.09 \leq p_1 \leq 0.2.$$

Broken line 104 in FIG. 10 can be approximately expressed by:

$$t_1=(-0.00057916+0.20257p_1)^{(-1)} \text{ if } p_1 \leq 0.09,$$

and $$t_1=20.248-212.49p_1+6390p_1^2 \text{ if } 0.09 \leq p_1 \leq 0.2.$$

Broken line 105 in FIG. 10 can be approximately expressed by:

$$t_1=(-0.0013694+0.16355p_1)^{(-1)} \text{ if } p_1 \leq 0.09,$$

and $$t_1=60.409-840.5p_1+10843p_1^2 \text{ if } 0.09 \leq p_1 \leq 0.2.$$

Broken line 106 in FIG. 10 can be approximately expressed by:

$$t_1=(-0.0020902+0.031559p_1)^{(-1)} \text{ if } p1 \leq 0.09,$$

and $$t_1=-27.916+631.14p_1+418.94p_1^2 \text{ if } 0.09 \leq p1 \leq 0.2.$$

Dotted line 107 in FIGS. 10 and 11 can be approximately expressed by:

$$t_1=(-0.0028164+0.16971p_1)^{(-1)} \text{ if } p1 \leq 0.09,$$

and $$t_1=259.37-4759.8p_1+30608p_1^2 \text{ if } 0.09 \leq p1 \leq 0.2.$$

Dotted line 108 in FIGS. 10 and 11 can be approximately expressed by:

$$t_1=(-0.0025782+0.14902p_1)^{(-1)} p1 \leq 0.09,$$

and $$t_1=345.07-6361.6p_1+39339p_1^2 \text{ if } 0.09 \leq p1 \leq 0.2.$$

Dotted line 109 in FIGS. 10 and 11 can be approximately expressed by:

$$t_1=(-0.0020902+0.031559p_1)^{(-1)} \text{ if } p1 \leq 0.09,$$

and $$t_1=-27.916+631.14p_1+418.94p_1^2 \text{ if } 0.09 \leq p1 \leq 0.2.$$

Broken line 111 in FIG. 11 can be approximately expressed by:

$$t_1=(-0.0030588+0.15804p_1)^{(-1)} \text{ if } p1 \leq 0.09,$$

and $$t_1=1192.2-22262p_1+112670p_1^2 \text{ if } 0.09 \leq p1 \leq 0.2.$$

Broken line 112 in FIG. 11 can be approximately expressed by:

$$t_1=(-0.0035017+0.14571p_1)^{(-1)} \text{ if } p1 \leq 0.09,$$

and $t_1=524.75-10029p_1+59406p_1^2$ if $0.09 \leq p1 \leq 0.2$.

Broken line 113 in FIG. 11 can be approximately expressed by:

$t_1=(-0.0020902+0.031559p_1)^{(-1)}$ if $p1 \leq 0.09$, and $t_1=-27.916+631.14p_1+418.94p_1^2$ if $009 \leq p1 \leq 0.2$.

Thick dotted line 114 in FIG. 11 can be approximately expressed by:

$t_1=(-0.004347+0.14719p_1)^{(-1)}$ if $p1 \leq 0.09$, and $t_1=858.65-16866p_1+95186p_1^2$ if $0.09 \leq p1 \leq 0.2$.

Thick dotted line 115 in FIG. 11 can be approximately expressed by:

$t_1=(-0.0041761+0.13916p_1)^{(-1)}$ if $p1 \leq 0.09$, and $t_1=958.16-18852p_1+105870p_1^2$ if $0.09 \leq p1 \leq 0.2$.

Thick dotted line 116 in FIG. 11 can be approximately expressed by:

$t_1=(-0.0020902+0.081559p_1)^{(-1)}$ if $p1 \leq 0.09$, and $t_1=-27.916+631.14p_1+418.94p_1^2$ if $0.09 \leq p1 \leq 0.2$.

Thin dotted line 117 in FIG. 11 can be approximately expressed by:

$t_1=(-0.0052742+0.14125p_1)^{(-1)}$ if $p1 \leq 0.09$, and $t_1=2298-45941p_1+243280p_1^2$ if $0.09 \leq p1 \leq 0.2$.

Thin dotted line 118 in FIG. 11 can be approximately expressed by:

$t_1=(-0.005134+0.1362p_1)^{(-1)}$ if $p1 \leq 0.09$, and $t_1=2497.8-49961p_1+264020p_1^2$ if $0.09 \leq p1 \leq 0.2$.

Thin dotted line 119 in FIG. 11 can be approximately expressed by:

$t_1=(-0.0020902+0.031559p_1)^{(-1)}$ if $p1 \leq 0.09$, and $t_1=-27.916+631.14p_1+418.94p_1^2$ if $0.09 \leq p \leq 0.2$.

Solid line 121 in FIG. 12 can be approximately expressed by:

$t_1=(0.0028147+0.32751p_1)^{(-1)}$ if $p1 \leq 0.09$, and $t_1=-24.449+560.59p_1+222.45p_1^2$ if $0.09 \leq p1 \leq 0.2$.

Solid line 122 in FIG. 12 can be approximately expressed by:

$t_1=(0.00054668+0.11697p_1)^{(-1)}$ if $p1 \leq 0.09$, and $t_1=-57.468+1392.1p_1+1784.3p_1^2$ if $0.09 \leq p1 \leq 0.2$.

Solid line 123 in FIG. 12 can be approximately expressed by:

$t_1 (-0.0020902+0.031559p_1)^{(-1)}$ if $p1 \leq 0.09$, and $t_1=40.78+1986.7p_1-2295.7p_1^2$ if $0.09 \leq p1 \leq 0.2$.

Broken line 124 in FIG. 12 can be approximately expressed by:

$t_1=(-0.000048081+0.22812p_1)^{(-1)}$ if $p1 \leq 0.09$, and $t_1=6.7893+7.0097p_1+4779.4p_1^2$ if $0.09 \leq p1 \leq 0.2$.

Broken line 125 in FIG. 12 can be approximately expressed by:

$t_1=(-0.0011606+0.13789p_1)^{(-1)}$ if $p1 \leq 0.09$, and $t_1=81.043-1159.4p_1+13537p_1^2$ if $0.09 \leq p1 \leq 0.2$.

Broken line 126 in FIG. 12 can be approximately expressed by:

$t_1 (-0.0020902+0.031559p_1)^{(-1)}$ if $p1 \leq 0.09$, and $t=1.40.78+1986.7p_1-2295.7p_1^2$ if $0.09 \leq p1 \leq 0.2$.

Dotted line 127 in FIGS. 12 and 13 can be approximately expressed by:

$t_1=(-0.0029727+0.18468p_1)^{(-1)}$ if $p1 \leq 0.09$, and $t_1=211.87-3874.3p_1+25752p_1^2$ if $0.09 \leq p1 \leq 0.2$.

Dotted line 128 in FIGS. 12 and 13 can be approximately expressed by:

$t_1=(-0.0024039+0.13561p_1)^{(-1)}$ if $p1 \leq 0.09$, and $t_1=410.2-7584.7p_1+46101p_1^2$ if $0.09 \leq p1 \leq 0.2$.

Dotted line 129 in FIGS. 12 and 13 can be approximately expressed by:

$t_1=(-0.0020902+0.031559p_1)^{(-1)}$ if $p1 \leq 0.09$, and $t_1=40.78+1986.7p_1-2295.7p_1^2$ if $0.09 \leq p1 \leq 0.2$.

Solid line 131 in FIG. 13 can be approximately expressed by:

$t_1=(-0.0038108+0-16856p_1)^{(-1)}$ if $p1 \leq 0.09$, and $t_1=973.69-18186p_1+93321p_1^2$ if $0.09 \leq p1 \leq 0.2$.

Solid line 132 in FIG. 13 can be approximately expressed by:

$t_1=(-0.0033291+0.13586p_1)^{(-1)}$ if $p1 \leq 0.09$, and $t_1=687.7-11264p_1+66380p_1^2$ if $0.09 \leq p1 \leq 0.2$.

Solid line 133 in FIG. 13 can be approximately expressed by:

$t_1=(-0.0020902+0.031559p_1)^{(-1)}$ if $p1 \leq 0.09$, and $t_1=40.78+1986.7p_1-2295.7p_1^2$ if $0.09 \leq p1 \leq 0.2$.

Broken line 134 in FIG. 13 can be approximately expressed by:

$t_1=(-0.0044872+0.15446p_1)^{(-1)}$ if $p1 \leq 0.09$, and $t_1=780.25-15299p_1+86683p_1^2$ if $0.09 \leq p1 \leq 0.2$.

Broken line 135 in FIG. 13 can be approximately expressed by:

$t_1=(-0.0040339+0.13236p_1)^{(-1)}$ if $p1 \leq 0.09$, and $t_1=1056.2-20815p_1+116460p_1^2$ if $0.09 \leq p1 \leq 0.2$.

Broken line 136 in FIG. 13 can be approximately expressed by:

$t_1=(-0.0020902+0.031559p_1)^{(-1)}$ if $p1 \leq 0.09$, and $t_1=40.78+1986.7p_1-2295.7p_1^2$ if $0.09 \leq p1 \leq 0.2$.

Dotted line 137 in FIG. 13 can be approximately expressed by:

$t_1=(-0.054023+0.14641p_1)^{(-1)}$ if $p1 \leq 0.09$, and $t_1=2088-41719p_1+221580p_1^2$ if $0.09 \leq p1 \leq 0.2$.

Dotted line 138 in FIG. 13 can be approximately expressed by:

$t_1=(-0.0049851+0.13106p_1)^{(-1)}$ if $p1 \leq 0.09$, and $t_1 1.2705.9-54169p_1+285760p_1^2$ if $0.09 \leq p1 \leq 0.2$.

Dotted line 139 in FIG. 13 call be approximately expressed by:

$t_1=(-0.0020902+0.031559p_1)^{(-1)}$ if $p1 \leq 0.09$, and $t 27.916+631.14p_1+418.94p_1^2$ if $0.09 \leq p1 \leq 0.2$.

Solid line 141 in FIG. 14 can be approximately expressed by:

$t_1=(0.0039942+0.89645p_1)^{(-1)}$ if $p1 \leq 0.09$, and $t_1=-21.331+488.13p_1$ if $0.09 \leq p1 \leq 0.2$.

Solid line 142 in FIG. 14 can be approximately expressed by:

$t_1=(0.0062727+0.05911p_1)^{(-1)}$ if $p1 \leq 0.09$, and $t_1=-155.12+3494.3p_1-1052.9p_1^2$ if $0.09 \leq p1 \leq 0.2$.

Solid line 143 in FIG. 14 can be approximately expressed by:

$t_1=(-0.0020902+0.031559p_1)^{(-1)}$ if $p1 \leq 0.09$, and $t_1=40.78+1986.7p_1-2295.7p^2$ if $0.09 \leq p1 \leq 0.2$.

Broken line 144 in FIG. 14 can be approximately expressed by:

$t_1=(-0.000076166+0.27608p_1)^{(-1)}$ if $p1 \leq 0.09$, and $t_1=(4.9294+213.76p_1+2827.4p_1^2$ if $0.09 \leq p1 \leq 0.2$.

Broken line 145 in FIG. 14 can be approximately expressed by:

$t_1=(-0.00076798+0.093666p_1)^{(-1)}$ if $p1 \leq 0.09$, and $t_1=108.61-1511.6p_1+19016p_1^2$ if $0.09 \leq p1 \leq 0.2$.

Broken line 146 in FIG. 14 can be approximately expressed by:

$t_1=(-0.0020902+0.031559p_1)^{(-1)}$ if $p1 \leq 0.09$, and $t_1=40.78+1986.7p_1-2295.7p_1^2$ if $0.09 \leq p1 \leq 0.2$.

Dotted line 147 in FIGS. 14 and 15 can be approximately expressed by:

$t=(-0.0031947+0.21903p_1)^{(-1)}$ if $p1 \leq 0.09$, and $t_1=139.37-2496.5p_1+17831p_1^2$ if $0.09 \leq p1 \leq 0.2$.

Dotted line 148 in FIGS. 14 and 15 can be approximately expressed by:

$t_1=(-0.0018961+0.10494p_1)^{(-1)}$ if $p1 \leq 0.09$, and $t_1=536.08-9966.9p_1+60707p_1^2$ if $0.09 \leq p1 \leq 0.2$.

Dotted line 149 in FIGS. 14 and 15 can be approximately expressed by:

$t_1=(-0.0020902+0.031559p_1)^{(-1)}$ if $p1 \leq 0.09$, and $t_1=40.78+1986.7p_1-2295.7p_1^2$ if $0.09 \leq p1 \leq 0.2$.

Solid line 151 in FIG. 15 can be approximately expressed by:

$t_1=(0.0040773+0.19547p_1)^{(-1)}$ if $p1 \leq 0.09$, and $t_1=539.75+10088p_1+547577p_1^2$ if $0.09 \leq p1 \leq 0.2$.

Solid line 152 in FIG. 15 can be approximately expressed by:

$t_1=(-0.0028237+0.11113p_1)^{(-1)}$ if $p1 \leq 0.09$, and $t_1=766.52-14773p_1+86589p_1^2$ if $0.09 \leq p1 \leq 0.2$.

Solid line 153 in FIG. 15 can be approximately expressed by:

$t_1=(-0.0020902+0.031559p_1)^{(-1)}$ if $p1 \leq 0.09$, and $t_1=40.78+1986.7p_1-2295.7p_1^2$ if $0.09 \leq p1 \leq 0.2$.

Broken line 154 in FIG. 15 can be approximately expressed by:

$t_1=(-0.0048885+0.17591p_1)^{(-1)}$ if $p1 \leq 0.09$, and $t_1=-597.65+11661p_1+66983p_1^2$ if $0.09 \leq p1 \leq 0.2$.

Broken line 155 in FIG. 15 can be approximately expressed by:

$t_1=(-0.0035424+0.11285p_1)^{(-1)}$ if $p1 \leq 0.09$, and $t_1=1335.8-26428p_1+147260p_2$ if $0.09 \leq p1 \leq 0.2$.

Broken line 156 in FIG. 15 can be approximately expressed by:

$t_1=(-0.0020902+0.031559p_1)^{(-1)}$ if $p1 \leq 0.09$, and $t_1=40.78+1986.7p_1-2295.7p_1^2$ if $0.09 \leq p1 \leq 0.2$.

Dotted line 157 in FIG. 15 can be approximately expressed by:

$t_1=(-0.0057371+0.16211p_1)^{(-1)}$ if $p1 \leq 0.09$, and $t_1=1533.6-30585p_1+164380p_1^2$ if $0.09 \leq p1 \leq 0.2$.

Dotted line 158 in FIG. 15 can be approximately expressed by:

$t_1=(-0.0044282+0.11446p_1)^{(-1)}$ if $p1 \leq 0.09$, and $t_1=3324.9-66656p_1+351050p_1^2$ if $0.09 \leq p1 \leq 0.2$.

Dotted line 159 in FIG. 15 can be approximately expressed by:

$t_1=(-0.0020902+0.031559p_1)^{(-1)}$ if $p1 \leq 0.09$, and $t_1=40.78+1986.7p_1-2295.7p_1^2$ if $0.09 \leq p1 \leq 0.2$.

In the actual manufacturing of the semiconductor laser element, the thickness and indium content of the InGaN buffer layer are designed to fall within the region satisfying the formula (1), i.e., region A or C, and it is desired that these values are contained in a region which is sufficiently remote from the boundary line between the regions satisfying and not satisfying the formula (1).

According to the experiments by the inventors and others, the InGaN buffer layer having the layered structure of 200 nm or more in thickness caused deterioration of crystallinity of the semiconductor layer formed thereon. The InGaN buffer layer of the indium content larger than 0.2 caused deterioration of crystallinity of the semiconductor layer formed thereon. According to these results, it is appropriate that the InGaN buffer layer has the thickness of 200 nm or less and the indium content of 0.2 or less. Further, the InGaN buffer layer could achieve an effect of preventing a crack even if the content of indium was very small and did not exceed 0.001. Even if the indium content was changed, the degree of the crack preventing effect hardly changed. The InGaN buffer layer could achieve the effect of preventing a crack even if the thickness thereof was very small and did not exceed 10 nm. Even if the thickness was changed, the degree of the crack preventing effect hardly changed From the above result, it can be understood that, in the semiconductor laser element of this embodiment, the regions must be substantially satisfied as follows by ($p_1$, $t_1$), i.e., by the indium content $p_1$ and thickness $t_1$ [nm] of the InGaN buffer layer in the cases (A), (B) and (C) relating to the distance between the InGaN buffer layer and the guide layer, and more specifically, in the case (A) of the distance of 0.4 μm or more, the case (B) of the distance of 0.3 or more but smaller than 0.4 μm, and the case (C) of the distance of 0.2 μm or more but smaller than 0.3 μm. In each of the above cases (A), (B) and (C), the region to be substantially satisfied by ($p_1$, $t_1$) changes depending on the indium contents of the guide layers, and more specifically depending on the case (a) of $0 \leq s=t<0.02$, the case (b) of $0.02 \leq s=t<0.04$, the case (c) of $0.04 \leq s=t<0.06$, the case (d) of $0.06 \leq s=t<0.07$, and the case (c) of $0.07 \leq s=t<0.08$.

(A) The distance between the InGaN buffer layer and the guide layer is 0.4 μm or more.

(a) In the case of $0 \leq s=t<0.02$, $10 \leq t_1 \leq (0.002182+0.2838p_1)^{(-1)}$, $t_1 \leq 200$, and $0.001 \leq p_1 \leq 0.09$ or $10 \leq t_1 \leq -27.916+631.14p_1+418.94p_1^2$, $t_1 \leq 200$, and $0.09 < p_1 \leq 0.2$ or $(-0.0013694+0.16355p_1)^{(-1)} \leq t_1 \leq 200$, and $0.001 \leq p_1 \leq 0.09$ or $60.409-840.0p_1+10843p_1^2 \leq t_1 \leq 200$, and $0.09 < p_1 \leq 0.2$ (7)

(b) In the case of $0.02 \leq s=t0.04$, $10 \leq t_1 \leq (-0.00057916+0.20257p_1)^{(-1)}$, $t_1 \leq 200$, and $0.001 \leq p_1 \leq 0.09$ or $10 \leq t_1 \leq 20.248 - 212.49 p_1 + 6390 p_1^2$, $t1 \leq 200$, and $0.09 < p_1 \leq 0.2$ or $(-0.0025782 + 0.14902 p_1)^{(-1)} \leq t_1 \leq 200$, and $0.001 \leq p_1 \leq 0.09$ or $345.07 - 6361.6 p_1 + 39339 p_1^2 \leq t_1 \leq 200$, and $0.09 < p_1 \leq 0.2$ (8)

(c) In the case of $0.04 \leq s = t < 0.06$, $10 \leq t_1 \leq 0.0036588 + 0.15804 p_1)^{(-1)}$, $t_1 \leq 200$, and $0.001 \leq p_1 0.09$ or $10 \leq t_1 23\ 1192.2 - 22262 p_1 + 112670 p_1^2$, $t1 \leq 200$, and $0.09 < p_1 \leq 0.2$ or $(-0.0035017 + 0.14571 p_1)^{(-1)} \leq t_1 \leq 200$, and $0.001 \leq p_1 \leq 0.09$ or $524.75 - 10029 p_1 + 59406 p_1^2 \leq t_1 \leq 200$, and $0.09 < p_1 \leq 0.2$ (9)

(d) In the case of $0.06 \leq s = t \leq 0.07$, $10 \leq t_1 \leq (-0.0036588 + 0.15804 p_1)^{(-1)}$, $t_1 \leq 200$, and $0.001 \leq p_1 \leq 0.09$ or $10 \leq t_1 \leq 1192.2 - 22262 p_1 + 112670 p_1^2$, $t1 \leq 200$, and $0.09 < p_1 \leq 0.2$ or $(-0.0041761 + 0.13916 p_1)^{(-1)} \leq t_1 \leq 200$, and $0.001 \leq p_1 \leq 0.09$ or $958.16 - 18852 p_1 + 105870 p_1^2 \leq t_1 \leq 200$, and $0.09 < p_1 \leq 0.2$ (10)

(e) In the case of $0.07 \leq s = t \leq 0.10$, $10 \leq t_1 \leq (-0.004347 + 0.14719 p_1)^{(-1)}$, $t_1 \leq 200$, and $0.001 \leq p_1 \leq 0.09$ or $10 \leq t_1 \leq 858.55 - 16866 p_1 + 95186 p_1^2$, $t1 \leq 200$, and $0.09 < p_1 \leq 0.2$ or $(-0.005134 + 0.1362 p_1)^{(-1)} \leq t_1 \leq 200$, and $0.001 \leq p_1 \leq 0.09$ or $2497.8 - 49961 p_1 + 264020 p_1^2 \leq t_1 \leq 200$, and $0.09 < p_1 \leq 0.2$ (11)

(B) The distance between the InGaN buffer layer and the guide layer is 0.3 µm or more but smaller than 0.4 µm.

(a) In the case of $0 \leq s = t < 0.02$, $10 \leq t_1 \leq (0.0028147 + 0.32751 p_1)^{(-1)}$, $t_1 \leq 200$, and $0.001 \leq p_1 \leq 0.09$ or $10 \leq t_1 \leq -24.449 + 560.59 p_1 + 222.45 p_1^2$, $t1200$, and $0.09 < p_1 \leq 0.2$ or $(-0.0011606 + 0.13789 p_1)^{(-1)} \leq t_1 200$, and $0.001 \leq p_1 \leq 0.09$ or $81.043 - 1159.4 p_1 + 13587 p_1^2 \leq t_1 \leq 200$, and $0.09 < p_1 \leq 0.2$ (13)

(b) In the case of $0.02 \leq s = t < 0.04$, $10 \leq t_1 \leq (-0.000048081 + 0.22812 p_1)^{(-1)}$, $t_1 \leq 200$, and $0.001 \leq p_1 \leq 0.09$ or $10 \leq t_1 \leq 6.7893 + 7.0097 p_1 + 4779.4 p_1^2$, $t1 \leq 200$, and $0.09 < p_1 23\ 0.2$ or $(-0.0024039 + 0.13561 p_1)^{(-1)} \leq t_1 \leq 200$, and $0.001 \leq p_1 \leq 0.09$ or $410.2 - 7584.7 p_1 + 46101 p_1^2 \leq t_1 \leq 200$, and $0.09 < p_1 \leq 0.2$ (14)

(c) In the case of $0.04 \leq s = t \leq 0.06$, $10 \leq t_1 \leq (-0.0029727 + 0.18468 p_1)^{(-1)}$, $t_1 \leq 200$, and $0.001 \leq p_1 \leq 0.09$ or $10 \leq t_1 \leq 211.87 - 3874.3 p_1 + 25752 p_1^2$, $t1 \leq 200$, and $0.09 < p_1 \leq 0.2$ or $(-0.0033291 + 0.13586 p_1)^{(-1)} \leq t_1 \leq 200$, and $0.001 \leq p_1 \leq 0.09$ or $587.7 - 11264 p_1 + 66380 p_1^2 \leq t_1 \leq 200$, and $0.09 < p_1 \leq 0.2$ (15)

(d) In the case of $0.06 \leq s = t < 0.07$, $10 \leq t_1 \leq (-0.0038108 + 0.16856 p_1)^{(-1)}$, $t_1 \leq 200$, and $0.001 \leq p_1 \leq 0.09$ or $10 \leq t_1 \leq 973.69 - 18186 p_1 + 93321 p_1^2$, $t1 \leq 200$, and $0.09 < p_1 \leq 0.2$ or $(-0\ 0040339 + 0.13236 p_1)^{(-1)} \leq t_1 \leq 200$, and $0.001 \leq p_1 \leq 0.09$ or $1056.2 - 20815 p_1 + 116460 p_1^2 \leq t_1 \leq 200$, and $0.09 < p_1 \leq 0.2$ (16)

(e) In the case of $0.07 \leq s = t \leq 0.10$, $10 \leq t_1 \leq (-0.0044872 + 0.15446 p_1)^{(-1)}$, $t_1 \leq 200$, and $0.001 \leq p_1 \leq 0.09$ or $10 \leq t_1 \leq 780.25 - 15299 p_1 + 86683 p_1^2$, $t1 \leq 200$, and $0.09 < p_1 \leq 0.2$ or $(-0.0049851 + 0.13106 p_1)^{(-1)} \leq t_1 \leq 200$, and $0.001 \leq p_1 \leq 0.09$ or $2705.9 - 54159 p_1 + 285760 p_1^2 \leq t_1 \leq 200$, and $0.09 < p_1 \leq 0.2$ (17)

(C) The distance between the InGaN buffer layer and the guide layer is equal to 0.2 µm or more but smaller 0.3 µm.

(a) In the case of $0 \leq s = t \leq 0.02$, $10 \leq t_1 \leq (0.0039942 + 0.39645 p_1)^{(-1)} t_1 \leq 200$, and $0.001 \leq p_1 \leq 0.09$ or $10 \leq t_1 \leq -21.331 + 488.13 p_1$, $t1 \leq 200$, and $0.09 < p_1 \leq 0.2$ or $$(-0.00076798+0.093666p_1)^{(-1)} \leq t_1 \leq 200, \text{ and } 0.001 \leq p_1 \leq 0.09$$

or $$108.61-1511.6p_1+19016p_1^2 \leq t_1 \leq 200, \text{ and } 0.09 < p_1 \leq 0.29 \quad (19)$$

(b) In the case of $0.02 \leq s = t \leq 0.04$, $$10 \leq t_1 \leq (-0.000076166+0.27608p_1)^{(-1)}, t_1 \leq 200, \text{ and } 0.001 \leq p_1 \leq 0.09$$

or $$10 \leq t_1 \leq -4.9294+213.76p_1+2827.4p_1^2, t1 \leq 200; \text{ and } 0.09 < p_1 \leq 0.2$$

or $$(-0.0018961+0.10494p_1)^{(-1)} \leq t_1 \leq 200, \text{ and } 0.001 \leq p_1 \leq 0.09$$

or $$536.08-9966.9p_1+60707p_1^2 \leq t_1 \leq 200, \text{ and } 0.09 < p_1 \leq 0.2 \quad (20)$$

(c) In the case of $0.04 \leq s = t \leq 0.06$, $$10 \leq t_1 \leq (-0.0031947+0.21903p_1)^{(-1)}, t_1 \leq 200, \text{ and } 0.001 \leq p_1 \leq 0.09$$

or $$10 \leq t_1 \leq 139.37-2496.5p_1+17831p2, t_1 \leq 200, \text{ and } 0.09 < p_1 \leq 0.2$$

or $$(-0.0028237+0.11113p_1)^{(-1)} \leq t_1 \leq 200, \text{ and } 0.001 \leq p_1 \leq 0.09$$

or $$766.52-14773p_1+86589p_1^2 \leq t_1 \leq 200, \text{ and } 0.09 < p_1 \leq 0.2 \quad (21)$$

(d) In the case of $0.06 \leq s = t \leq 0.07$, $$10 \leq t_1 \leq (-0.0040773+0.19547p_1)^{(-1)}, t_1 \leq 200, \text{ and } 0.001 \leq p_1 0.09$$

or $$10 \leq t_1 \leq 539.75-10088p_1+54757p_1^2, t1 \leq 200, \text{ and } 0.09 < p_1 \leq 0.2$$

or $$(-0.0035424+0.11285p_1)^{(-1)} \leq t_1 \leq 200, \text{ and } 0.001 \leq p_1 \leq 0.09$$

or $$1335.8-26428p_1+147260p_1^2 \leq t_1 \leq 200, \text{ and } 0.09 < p_1 \leq 0.2 \quad (22)$$

(e) In the case of $0.07 \leq = t \leq 0.10$, $$10 \leq t_1 \leq (-0.0048885+0.17591p_1)^{(-1)}, t_1 \leq 200, \text{ and } 0.001 \leq p_1 \leq 0.09$$

or $$10 \leq t_1 \leq 597.65-11661p_1+66983p_1^2, t1 \leq 200, \text{ and } 0.09 < p_1 \leq 0.2$$

or $$(-0.0044282+0.11446p_1)^{(-1)} \leq t_1 \leq 200, \text{ and } 0.001 \leq p_1 \leq 0.09$$

or $$3324.9-66656p_1+351050p_1^2 \leq t_1 \leq 200, \text{ and } 0.09 < p_1 \leq 0.2 \quad (23)$$

The ranges described above do not change even when the calculation is made with the central wavelength of the laser oscillation varying in a range from 370–430 nm (20° C.), and even when the calculation is made with the content of the AlGaN clad layer interposed between the InGaN buffer layer and the guide layer varying in a range from 0.08 to 0.2.

The foregoing example of the InGaN buffer layer, which is used in the method of manufacturing the semiconductor laser element of the embodiment, ha* the thickness of 50 nm and the content of 0.02, which fall within the foregoing ranges.

In the ranges defined in the case (e) described above, the refractivity variable range of the $In_sGa_{1-s}N$ (or $In_tGa_{1-t}N$) within the range of $0.09 \leq s=t \leq 0.10$ is substantially equivalent to the refractivity variable range of the $In_sGa_{1-s}N$ (or $In_tGa_{1-t}N$) within the range of $0.08 \leq s=t \leq 0.09$. Therefore, the result of calculation in the range of $0.09 \leq s=t \leq 0.10$ is substantially the same as the result of calculation in the range of $0.08 \leq s=t \leq 0.09$ so that the results of calculation in these ranges are represented as the result in the combined range of $0.08 \leq s=t \leq 0.10$.

For achieving the good optical characteristics, the indium content $p_1$ and thickness $t_1$ of the InGaN buffer layer are restricted to the foregoing regions. For satisfying the following demand, the preferable range of the InGaN buffer layer is further restricted The InGaN buffer layer disposed in the p- or n-type clad layer performs the absorption, which causes absorption of the laser oscillation mode, and increases the threshold current density. Therefore, it is desired that the absorption factor of the InGaN buffer layer is small. If the indium content of the InGaN buffer layer is large, the absorption of the laser oscillation mode in the InGaN buffer layer increases so that it is preferable that the indium content of the InGaN buffer layer is relatively small. In view of the above, it is further desirable that the conditions of $p_1 \leq 0.09$ are added to the restrictions on the range described above.

Almost all the laser elements prepared in accordance with the embodiment performed the oscillation with the oscillation threshold voltage ($V_{op}$) of about 5 V and the threshold current density ($J_{th}$) of about 1.5 kA/cm². In the conventional semiconductor laser, such a phenomenon in which the light output rapidly lowers occurs when the oscillation continues for 10 hours or more. According to the laser element of the embodiment, in which the n-type InGaN buffer layer is disposed in the n-type AlGaN clad layer, characteristics do not change even after elapsing of about 1000 hours. Further, the FFP has a single crest, and good optical characteristics can be achieved.

In this embodiment, it is not essential that all the n-type AlGaN cad layers included in the n-type AlGaInN clad layer and the p-type AlGaN layer have the same aluminum content. Even if different aluminum contents are employed, the semiconductor laser element may have the structure including the InGaN buffer layer, which is designed to satisfy the formula (1) by the parameter of the foregoing F, in the n-type AlGaInN clad layer, whereby the effects of the invention can be achieved. However, it is desired that all the aluminum contents of the AlGaN clad layers in the semiconductor laser element structure are the same, in view of the symmetry of the laser oscillation mode.

In this embodiment, the active layer is formed of the three-layer quantum well active layer. However, it may be formed of a quantum well active layer having two, four or more layers. Even in the latter case, the relational formula (1) required in the invention as well as the relational formulas required in connection with the InGaN buffer layer are the same as those already described, and the same effects can be achieved.

In the structure of the semiconductor laser element of the embodiment, the n-type $In_rGa_{1-r}N$ buffer layer interposed between the n-type AlGaIn cad layer and the n-type GaN contact layer has the effect of further reducing the cracks in the semiconductor multilayer grown film. However, the structure not provided with the n-type $In_rGa_{1-r}N$ buffer layer is also contained in the scope of the appended claims, and hardly affects the active layer confinement factor of the semiconductor laser element and the FFP.

The substrate used in the semiconductor laser element of the embodiment is made of sapphire, but may be made of another material such as GaN In the latter case, the content and thickness of the InGaN buffer layer disposed in the AlGaInN clad layer must satisfy the same ranges of conditions as the case of the sapphire substrate.

(Third Embodiment)

Figure 16:
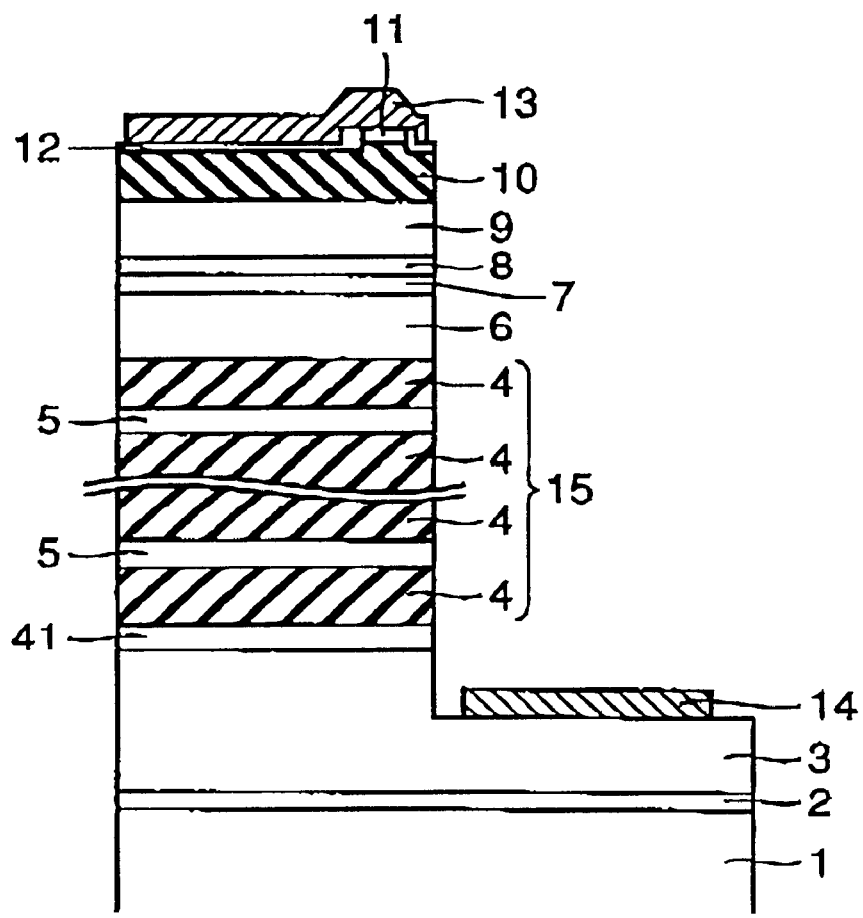
FIG. 16 is a schematic view showing a semiconductor laser element according to a third embodiment of the invention.

FIG. 16 is a schematic view showing a semiconductor laser element of the third embodiment of the invention. FIG. 16 shows a section of a waveguide portion of the semiconductor laser element, and particularly shows the section perpendicular to a resonator. The semiconductor laser element includes various nitride-contained semiconductor layers, and more specifically includes (0001) C-surface sapphire substrate 1 (thickness: 30–300 μm), GaN low-temperature buffer layer 2 (thickness: 0–100 nm), n-type GaN contact layer 3 (thickness: 0.1–10 μm), n-type $In_rGa_{1-r}N$ ($0 \leq r \leq 0.2$) buffer layer 41 (thickness: 0–200 nm), n-type AlGaInN clad layer 15 (total thickness: about 0.6- about 10 μm: In this embodiment, the n-type AlGaN clad layers are grown at three or more levels with the n-type InGaN buffer layers therebetween) formed of the alternately layered structure (n-type AlGaN clad layer, n-type InGaN buffer layer, . . . , n-type InGaN buffer layer and n-type AlGaN clad layer) including n-type $Al_{x1}Ga_{1-x1}N$ ($0.08 \leq x1 \leq 0.2$) clad layer 4 (thickness: 0.2–0.8 μm) and n-type $In_{p1}Ga_{1-p1}N$ ($0.001 < p1 \leq 0.2$) buffer layer 5 (thickness: 10–200 nm), n-type GaN guide layer 6 (thickness: 0.08–0.15 μm), multiple quantum well active layer 7 (light emission wavelength: 370–430 μm, total thickness: 5–60 nm) formed of an alternate multilayer structure (barrier layer, well layer, . . . , well layer and barrier layer) including $In_wGa_{1-w}N$ ($0 \leq w \leq 0.2$) well layer and $In_vGa_{1-v}N$ ($0 < v < w$) barrier layer, p-type $Al_zGa_{1-z}N$ ($0 \leq z \leq 0.3$) carrier block layer 8 (thickness: 0–20 nm), p-type GaN guide layer 9 (thickness: 0.08–0.15 μm), p-type $Al_yGa_{1-y}N$ ($0.08 \leq y \leq 0.2$) clad layer 10 (thickness; 0.2–0.8 μm) and p-type GaN contact layer 11 (thickness: 0.01–10 μm).

Above these layers, an insulating film 12 of a required configuration is formed in a mesa-like form on the substantially whole surface. A positive electrode 13 (e.g., Pd/Au, Ni/Pd/Au or Pd/Pt/Au) is formed over the substantially whole surface in a mesa-like form including the whole of the exposed surface of the p-type GaN contact layer. The negative electrode 14 (e.g., Ti/Al, Zr/Al or Hf/Al) is formed on a portion of an exposed surface of the n-type GaN contact layer. The mesa is formed of the n-type GaN contact layer, n-type InGaN buffer layer, n-type AlGaInN clad layer, n-type GaN guide layer, InGaN multiple quantum well active layer, p-type AlGaN carrier block layer, p-type GaN guide layer, p-type AlGaN clad layer, p-type GaN contact layer, insulating film (more specifically, only in the required region) and positive electrode. The opposite end surfaces of the stripe function as mirrors, and form a photo-resonator.

Then, description will be given on a method of manufacturing the semiconductor laser element of the third embodiment.

First, the (0001) C-surface sapphire substrate is cleaned. The cleaned (0001). C-surface sapphire substrate is moved into a MOCVD device, and is subjected to cleaning within an atmosphere of $H_2$ at a temperature of about 1100° C. After lowering the temperature, $NH_3$ and trimethyl gallium (TMG) at 600° C. are supplied at rates of 5 liter/minute and 20 mol/minute, respectively, while flowing hydrogen ($H_2$) at 10 liter/minute as a carrier gas. Thereby, the GaN low temperature buffer layer of 0–100 nm (e.g., about 20 nm) in thickness is grown. The low temperature buffer layer is not restricted to GaN. Alternatively, trimethyl aluminum (TMA), TMG or NH3 may be used, and thereby an AlN or GaAlN film may be used without causing no adverse effect.

Then, the temperature is raised to about 1050° C. while flowing $N_2$ and $NH_3$ each at a rate of 5 liter/minute. When the temperature rises, the carrier gas is changed from $N_2$ to $H_2$, and TMG and $SiH_4$ are supplied at rates of 100 μmol/minute and 10 nmol/minute, respectively, so that the n-type GaN contact layer of 0.1–10 μm (e.g., about 4 μm) is grown. Then, the supply of TMG is stopped, and the carrier gas is changed from $H_2$ to $N_2$ again. After lowering the temperature to about 800° C., the flow rate of TMG is adjusted to 15 μmol/minute, and trimethyl indium (TMI) which is an indium material is supplied at a constant rate. Thereby, the $In_rGa_{1-r}N$ (e.g., r=0.07) buffer layer of 0–200 nm (e.g., 50 nm) in thickness is grown. Then, the supply of TMI and TMG is stopped, and the temperature is raised to 1050° C. again. The carrier gas is changed from $N_2$ to $H_2$. The flow rate of TMG is adjusted to 50 μmol/minute, and the TMA is supplied at a rate of 40 μmol/minute. Thereby, the n-type $Al_{x1}Ga_{1-x1}N$ (e.g., $x_1$=0.1) clad layer of 0.2–0.8 μm (e.g., 0.5 μm) in thickness is grown.

The supply of TMG and TMA is stopped, and the carrier gas is changed from $H_2$ to $N_2$. After lowering the temperature to about 800° C., the flow rate of TMG is adjusted to 15 μmol/minute, and the TMI is supplied at a constant rate. Thereby, the $In_{p1}Ga_{1-p1}N$ (e.g., p1=0.02) buffer layer of 10–200 nm (e.g., 50 nm) in thickness is grown. Then, the supply of TMG is stopped, and the temperature is raised to 1050° C. again. The carrier gas is changed from $N_2$ to $H_2$. The flow rate of TMG is adjusted to 50 μmol/minute, and the TMA is supplied at a rate of 40 μmol/minute. Thereby, the n-type $Al_{x2}Ga_{1-x2}N$ (e.g., $x_2$=0.1) clad layer of 0.2–0.8 μm (e.g., 0.5 μm) in thickness is grown. The n-type InGaN buffer layers, which are k in total number, are grown in the similar manner so that the n-type AlGaInN clad layer thus grown includes the n-type AlGaN clad layers of (k+1) in total number, which are present between the n-type InGaN buffer layers or on the opposite sides of the n-type InGaN buffer layers. When the growth of the n-type AlGaInN clad layer stops, the supply of TMA is stopped, and the flow rate of TMG is adjusted to 100 μmol/minute so that the n-type GaN guide layer is grown to have the thickness from 0.08–0.15 μm (e.g., 0.1 μm). Thereafter, the supply of TMG is stopped, and the carrier gas is changed from $H_2$ to $N_2$ again. After lowering the temperature to 700° C., the trimethyl indium (TMI) which is an indium material is supplied at a rate of 10 μmol/minute, and the TMG is supplied at a rate of 15 μmol/minute. Thereby, the barrier wall made of $In_vGa_{1-v}N$ (e.g., v=0.05) and having a thickness of, e.g., 4 nm is grown. Thereafter, the supply rate of TMI is increased to a 50 μmol/minute so that the well layer having a thickness of, e.g., 2 nm and made of $In_wGa_{1-w}N$ (e.g., w=0.17) is grown. The well layers which are three in total number are grown in the similar manner, and the multiple quantum well (MQW) having a light emission wavelength of about 380–430 nm (e.g., 400–410 nm) is grown. This MQW includes the barrier layers of four in total number, which are present between the well layers or on the opposite sides of the well layers. When the growth of the MQW ends, the supply of TMI and TMG is stopped, and the temperature is raised to 1050° C. again. The carrier gas is changed from $N_2$ to $H_2$ again, and the TMG is supplied at a rate of 50 μmol/minute Also, the TMA is supplied at a rate of 30 μmol/minute, and the bis cyclopentadienyl magnesium ($Cp_2Mg$), which is a p-type doping material, is flowed at a rate of 10 nmol/minute so that the p-type $Al_zGa_{1-z}N$ (e.g., z=0.2) carrier block layer of 0–20 nm (e.g., 20 nm) in thickness is grown. When growth of the carrier block layer stops, the supply of TMA is stopped, and the supply rate of TMG is adjusted to 100 μmol/minute so that the p-type GaN guide layer of 0.08–0.15 μm (e.g., 0.1 μm) in thickness is grown. Thereafter, the supply rate of TMG is adjusted to 50 μm, and the TMA is supplied at a rate of 40 μmol/minute so that the p-type $Al_yGa_{1-y}N$ clad layer (e.g., y=0.1) of 0.2–0.8 μm (e.g., 0.5 μm) in thickness is grown. Finally, the supply rate of TMG is adjusted to 100 μmol/minute, and the supply of TMA is stopped so that the p-type GaN contact layer of 0.01–10 μm (e.g., 0.1 μm) in thickness is grown. Thereby, the growth of the light-emitting element structure ends. When the growth ends, the supply of TMG and $Cp_2Mg$ is stopped, and the temperature is lowered. Then, the structure at a room temperature is taken out from the MOCVD device.

The outermost surface (last grown surface) of the film having the laser structure of the embodiment had a surface roughness of about 10 nm in average value (Ra), and thus exhibited a very good flatness. Further, a plurality of wafers were prepared. Each wafer had the structure formed of the (0001) C-surface sapphire substrate, GaN low temperature buffer layer (thickness: 20 nm), n-type GaN contact layer (thickness: about 4 μm), n-type $Al_{0.1}Ga_{0.9}N$ clad layer (thickness: 0.5 μm), n-type $Al_{0.09}Ga_{0.97}N$ buffer layer (thickness: 50 nm) and n-type $Al_{0.1}Ga_{0.9}N$ clad layer (thickness: 0.5 μm). The surfaces of these wafers were observed with an optical microscope of a magnification of about 200 times. It was found that no hexagonal crack was present in each wafer. In this wafer, the total thickness of the n-type Al0.1Ga0.9N clad layers was equal to about 1 μm. The problem of the prior art could be overcome owing to the fact that the buffer layers including at least indium was formed in the n-type Al0.1Ga0.9N clad layer.

Thereafter, the photolithography technique and reactive ion etching technique are used to effect the etching on the p-type $Al_yGa_{1-y}N$ clad layer while leaving the p-type GaN contact layer in the stripe form having a stripe width of 3 μm. Thereby, the insulating film is formed by the photolithography technique in the region except for a portion, where the p-type GaN contact layer is in contact with the electrode. Thereafter, the reactive ion etching technique is used to remove a portion, where the negative electrode is to be formed, from a region between the wafer top surface and a middle position of the n-type GaN contact layer. Thereafter, the positive electrode is formed on the exposed portion of the surface of the p-type GaN contact layer in the mesa-like form. The material of the electrodes may be Au/Ni or Au/Pd. The negative electrode is formed substantially entirely over the exposed surface portion of the n-type GaN contact layer. The material of the negative electrode may be Al/Ti or Au/W.

Finally, the surface of the sapphire substrate remote from the semiconductor multilayer film surface is polished so that the layer thickness including the semiconductor multilayer film and the sapphire substrate may be equal to a value (e.g., about 60 μm) in a range from 30 to 300 μm. Thereafter, cleavage is used to achieve the element length of about 0.5 mm, and the end surface forming the mirror is formed.

In the foregoing manners, the semiconductor laser element of the third embodiment shown in FIG. 16 is manufactured.

In the semiconductor laser element of the third embodiment, the plurality of n-type InGaN buffer layers disposed in the n-type AlGaInN clad layer have the film thickness and the indium content, which are designed to satisfy the formula (1) of such conditions that the laser oscillation mode does not couple to the three-layer slab waveguide formed of the n-type InGaN buffer layer and the neighboring layers, i.e., the n-type AlGaN clad layers. More specifically, it is assumed that the n-type InGaN buffer layers of two or more in total number are disposed in the n-type AlGaInN clad layer. Also, it is assumed that the parameter F is calculated in view of the waveguide mode (effective refractive index $n_{eq}$, electric field amplitude $f_{eq}(x)$) which occurs on the multilayer slab waveguide formed of the n-type AlGaN clad layer (having an infinite thickness), n-type GaN guide layer, InGaN multilayer quantum well active layer, p-type AlGaN carrier stop layer, p-type GaN guide layer and p-type AlGaN clad layer (having an infinite thickness) as well as the waveguide mode (effective refractive index $n_i$, electric field amplitude $f_i(x)$) which occurs on the three-layer slab waveguide (n-type AlGaN clad layer (having an infinite thickness), n-type InGaN buffer layer and n-type AlGaN clad layer (having an infinite thickness) having a core formed of the n-type InGaN buffer layer in the ith (i=1, 2, ...) position. The indium content and the thickness of the n-type InGaN buffer layer in the ith position are determined so that the parameter F calculated in view of the above satisfies the formula (1). If at least one of the InGaN buffer layers which are present in the n-type AlGaN clad layer satisfies the foregoing conditions, the effects of suppressing the ripples in FFP and improving the active layer confinement factor can be achieved. However, it is desired that all the InGaN buffer layers satisfy the foregoing conditions.

The ranges of the content and thickness of the InGaN buffer layer satisfying the formula (1) are the same as the ranges obtained from FIGS. 5 to 8.

Almost all the laser elements prepared in accordance with the embodiment performed the oscillation with the oscillation threshold voltage ($V_{op}$) of about 5 V and the threshold current density ($J_{th}$) of about 1.2 kA/cm $^2$. In the conventional semiconductor laser, such a phenomenon in which the light output rapidly lowers occurs when the oscillation continues for 10 hours or more, even if no crack is present in the element. According to the laser of the embodiment, in which the n-type InGaN buffer layer is disposed in the n-type AlGaN clad layer, characteristics do not change even after elapsing of about 1000 hours. Further, the FFP has a single crest, and good optical characteristics can be achieved.

In this embodiment, it is not essential that all the n-type AlGaN clad layers included in the n-type AlGaInN clad layer and the p-type AlGaN layer have the same aluminum content. Even if different aluminum contents are employed, the semiconductor laser element may have the structure including the InGaN buffer layer, which is designed to satisfy the formula (1) by the parameters of the foregoing F, in the n-type AlGaInN clad layer, whereby the effects of the invention can be achieved However, it is desired that all the aluminum contents of the AlGaN clad layers in the semiconductor laser element structure are the same, in view of the symmetry of the laser oscillation mode.

In this embodiment, the active layer is formed of the three-layer quantum well active layer. However, it may be formed of a quantum well active layer having two, four or more layers. Even in the latter case, the relational formula (1) required in the invention as well as the relational formulas required in connection with the InGaN buffer layer are the same as those already described, and the same effects can be achieved.

In this embodiment, the guide layer is made of GaN. However, it may be formed of an InGaN guide layer. Even in the latter case, the relational formula (1) required in the invention as well as the relational formulas required in connection with the InGaN buffer layer are the same as those shown in FIGS. 10–15, and the same effects can be achieved.

In the structure of the semiconductor laser element of the embodiment, the n-type $In_rGa_{1-r}N$ buffer layer interposed between the n-type AlGaIn clad layer and the n-type GaN contact layer has the effect of further reducing the cracks in the semiconductor multilayer wafer. However, the structure not provided with the n-type $In_rGa_{1-r}N$ buffer layer is also contained in the scope of the appended claims, and hardly affects the active layer confinement factor of the semiconductor laser element and the FFP.

The substrate used in the semiconductor laser element of the embodiment is made of sapphire, but may be made of another material such as GaN. In this case, the content and thickness of the InGaN buffer layer disposed in the AlGaInN clad layer must satisfy the same ranges of conditions as the case of the sapphire substrate.

(Fourth Embodiment)

Figure 17:
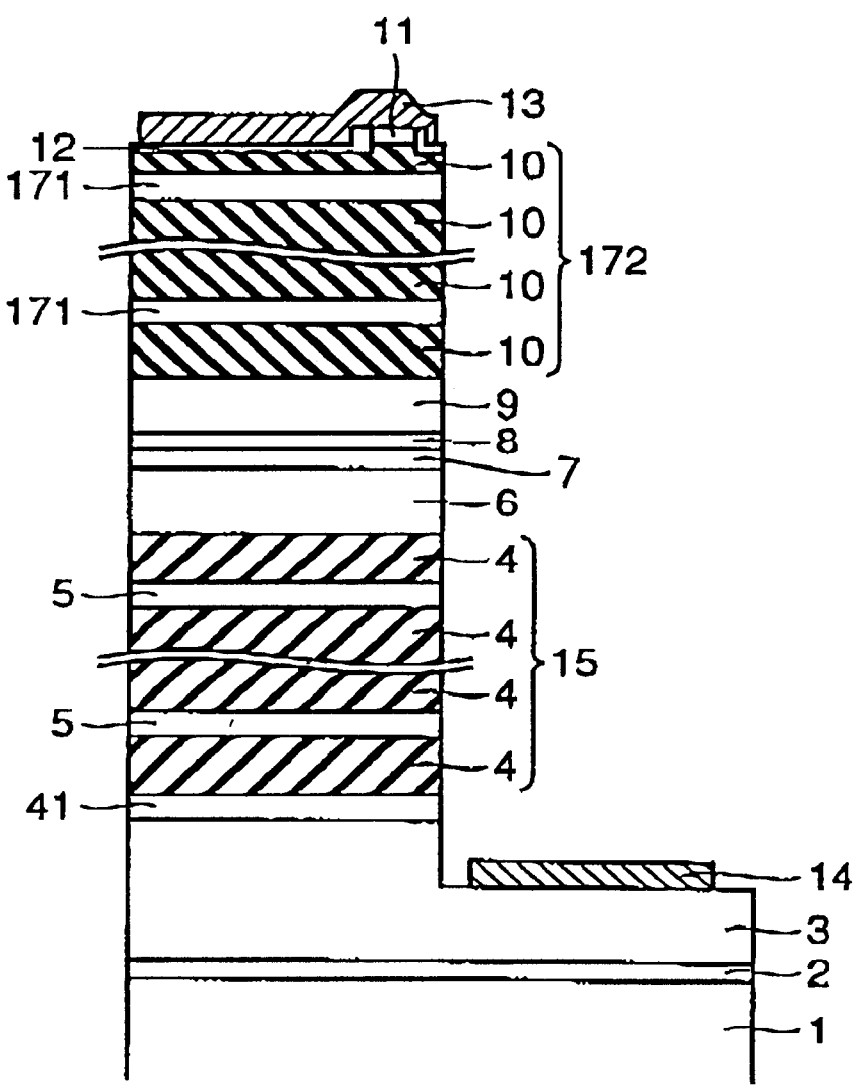
FIG. 17 is a schematic view showing a semiconductor laser element according to a fourth embodiment of the invention.

FIG. 17 is a schematic view showing a semiconductor laser element of the fourth embodiment of the invention. FIG. 17 shows a section of a waveguide portion of the semiconductor laser element, and particularly shows the section perpendicular to a resonator. The semiconductor laser element includes various nitride-contained semiconductor layers, and more specifically includes (0001) C-surface sapphire substrate 1 (thickness: 30–300 $\mu$m), GaN low-temperature buffer layer 2 (thickness: 0–100 nm), n-type GaN contact layer 3 (thickness: 0.1–10 $\mu$m), n-type AlGaInN clad layer 15 (total thickness: 0.8–10 $\mu$m) formed of the alternate multilayer structure (n-type clad layer, n-type buffer layer, . . . , n-type buffer layer and n-type clad layer) including n-type $Al_xGa_{1-x}N$ ($0.08 \leq x \leq 0.2$) clad layer 4 (thickness: 0.2–0.8 $\mu$m) and n-type $In_pGa_{1-p}N$ ($0.001 < p \leq 0.2$) buffer layer 5 (thickness; 10–200 nm), n-type GaN guide layer 6 (thickness: 0.08–0.15 $\mu$m), multiple quantum well active layer 7 (light emission wavelength: 370–430 nm, total thickness: 5–60 nm) formed of an alternate multilayer structure (barrier layer, well layer, . . . , well layer and barrier layer) including $In_wGa_{1-w}N$ ($0 < w < 0.2$) well layer and $In_vGa_{1-v}N$ ($0 < v < w$) barrier layer, p-type $Al_zGa_{1-z}N$ ($0 \leq z \leq 0.3$) carrier block layer 8 (thickness: 0–20 nm), p-type GaN guide layer 9 (thickness: 0.08–0.15 $\mu$m), a p-type AlGaInN clad layer 172 (total thickness: 0.8–10 $\mu$m) formed of the alternate multilayer structure (p-type clad layer, p-type buffer layer, . . . , p-type buffer layer and p-type clad layer) including p-type $Al_yGa_{1-y}N$ ($0.08 \leq y \leq 0.2$) clad layer 10 (thickness: 0.2–0.8 $\mu$m) and a p-type $In_qGa_{1-q}N$ ($0.001 < q \leq 0.2$) buffer layer 171 (thickness: 10–200 nm), and p-type GaN contact layer 11 (thickness: 0.01–10 $\mu$m).

Above these layers, an insulating film 12 of a required configuration is formed in a mesa-like form on the substantially whole surface. A positive electrode 13 (e.g., Pd/Au, Ni/Pd/Au or Pd/Pt/Au) is formed over the substantially whole surface in a mesa-like form including the whole of the exposed surface of the p-type GaN contact layer. The negative electrode 14 (e.g., Ti/Al, Zr/Al or Hf/Al) is formed on a portion of an exposed surface of the n-type GaN contact layer. The mesa is formed of the n-type GaN contact layer, n-type InGaN buffer layer, n-type AlGaInN clad layer, n-type GaN guide layer, InGaN multiple quantum well active layer, p-type AlGaN carrier block layer, p-type AlGaN clad layer, p-type GaN contact layer, insulating film (more specifically, only in the required region) and positive electrode. The opposite end surfaces of the stripe function as mirrors, and form a photo-resonator.

Then, description will be given on a method of manufacturing the semiconductor laser element of this embodiment.

First, the (0001) C-surface sapphire substrate is cleaned. The cleaned (0001) C-surface sapphire substrate is moved into a MOCVD device, and is subjected to cleaning within an atmosphere of $H_2$ at a temperature of about 1100° C. After lowering the temperature, $NH_3$ and trimethyl gallium (TMG) at 600° C. are supplied at rates of 5 liter/minute and 20 mol/minute, respectively, while flowing hydrogen ($H_2$) at 10 liter/minute as carrier gas. Thereby, the GaN low temperature buffer layer of 0–100 nm (e.g., 20 nm) in thickness is grown. The low temperature buffer layer is not restricted to GaN. Alternatively, trimethyl aluminum (TMA), TMG or NH3 may be used, and thereby an AlN or GaAlN film may be used without causing no adverse effect.

Then, the temperature is raised to about 1050° C. while flowing $N_2$ and $NH_3$ each at a rate of 5 liter/minute. When the temperature rises, the carrier gas is changed from $N_2$ to $H_2$, and TMG and $SiH_4$ are supplied at rates of 100 $\mu$mol/minute and 10 nmol/minute, respectively, so that the n-type GaN contact layer of 0.1–10 $\mu$m (e.g., about 4 $\mu$m) is grown. Then, the flow rate of TMG is adjusted to 50 $\mu$mol/minute, and the TMA is supplied at a constant rate so that the n-type $Al_{x1}Ga_{1-x1}N$ (e.g., x1=0.1) clad layer of 0.2–0.8 $\mu$m (e.g., 0.5 $\mu$m) in thickness is grown. Then, the supply of TMG and TMA is stopped, and the carrier gas is changed from $H_2$ to $N_2$ again. After lowering the temperature to about 800° C., the flow rate of TMG is adjusted to 15 $\mu$mol/minute, and the TMI is supplied at a constant rate. Thereby, the $In_pGa_{1-p}N$ (e.g., p=0.02) buffer layer of 0–200 nm in thickness is grown. Then, the supply of TMI and TMG is stopped, and the temperature is raised to 1050° C. again. The carrier gas is changed from $N_2$ to $H_2$. The flow rate of TMG is adjusted to 50 $\mu$mol/minute, and the TMA is supplied at a constant rate. Thereby, the n-type $Al_{x2}Ga_{1-x2}N$ (e.g., x2=0.1) clad layer of 0.2–0.8 $\mu$m in thickness is grown. The above growth of the n-type AlGaN layer and the n-type InGaN layer is repeated to grow the n-type AlGaInN clad layer, which has a total thickness of 0.8–10 $\mu$m, and is formed of the alternate multilayer structure (n-type clad layer, n-type buffer layer, . . . , n-type buffer layer and n-type clad layer) including the n-type AlGaN buffer layers and n-type InGaN buffer layers. When growth of the AlGaInN ends, the supply of TMA is stopped, and the flow rate of TMG is adjusted to 100 $\mu$mol/minute so that the n-type GaN guide layer of 0.08–0.15 $\mu$m in thickness is grown. Thereafter, the supply of TMG is stopped, and the carrier gas is changed from $H_2$ to $N_2$. After lowering the temperature to 700° C., the trimethyl indium (TMI) which is an indium material is supplied at a constant rate, and the TMG is supplied at a rate of 15 $\mu$mol/minute so that the barrier layer made of $In_vGa_{1-v}N$ (e.g., v=0.05) is grown. Thereafter, the supply rate of TMI is increased to a certain value so that the well layer made of $In_wGa_{1-w}N$ (e.g., w=0.17) is grown. The multiple quantum well (MQW) active layer formed of tie alternate multilayer structure (barrier layer, well layer, . . . , well layer and barrier layer) including the InGaN barrier layer and the InGaN well layer. The contents of InGaN in the barrier layers and well layers as well as the thicknesses thereof are designed to provide the light emission wavelength in a range of 370–430 nm (e.g., 400–410 nm). The flow rate of TMI which is supplied during the growth is adjusted to provide the film of the indium composition equal to a designed value.

When the growth of the MQW active layer ends, the supply of TMI and TMG is stopped, and the temperature is raised to 1050° C. again. The carrier gas is changed from $N_2$ to $H_2$ again, and the TMG is supplied at a rate of 50 μmol/minute. Also, the TMA is supplied at an appropriate rate, and bis cyclopentadienyl magnesium ($Cp_2Mg$), which is a p-type doping material, is flowed at a rate of 10 nmol/minute so that the p-type $Al_zGa_{1-z}N$ (e.g., z=0.3) carrier block layer of 0–20 nm (e.g., 20 nm) in thickness is grown. When growth of the carrier block layer stops, the supply of TMA is stopped, and the supply rate of TMG is adjusted to 100 μmol/minute so that the p-type GaN guide layer of 0.08–0.15 μm (e.g., 0.1 μm) in thickness is grown.

Then, the supply rate of TMG is adjusted to 50 μm, and the TMA is supplied at a constant rate so that the p-type $Al_{y1}Ga_{1-y1}N$ clad layer (e.g., $y_1$=0.1) of 0.2–0.8 μm in thickness is grown. Then, the supply of TMG, TMA and $Cp_2Mg$ is stopped, and the carrier gas is changed from $H_2$ to $N_2$. After lowering the temperature to about 800° C., the flow rate of TMG is adjusted to 15 μmol/minute, and the TMI is supplied at a constant rate. Thereby, the p-type $In_qGa_{1-q}N$ (e.g., q=0.02) buffer layer of 0–200 nm (e.g., 50 nm) in thickness is grown. Then, the supply of TMI and TMG is stopped, and the temperature is raised to 1050° C. again. The carrier gas is changed from $N_2$ to $II_2$. The flow rate of TMG is adjusted to 50 μmol/minute, and the TMA is supplied at a constant rate. Thereby, the p-type $Al_{y2}Ga_{1-y2}N$ (e.g., y2=0.1) clad layer of 0.2–0.8 μm (e.g., 0.5 μm) in thickness is grown. The p-type AlGaN layer and n-type InGaN layer are repetitively grown so as to grow the p-type AlGaInN clad layer having a total thickness of 0.8–10 μm (e.g., about 1 μm) and formed of the alternate multilayer structure (p-type clad layer, p-type buffer layer, . . . , p-type buffer layer and p-type clad layer) including the p-type AlGaN buffer layer and the p-type InGaN buffer layer. When growth of the AlGaInN ends, the supply of TMA is stopped, and finally the flow rate of TMG is adjusted to 100 μmol/minute so that the p-type GaN contact layer of 0.01–10 μm in thickness is grown. Thereby, the growth of the light-emitting element structure ends. When the growth ends, the supply of TMG and $Cp_2Mg$ is stopped, and the temperature is lowered. Then, the structure at a room temperature is taken out from the MOCVD device.

The outermost surface (last grown surface) of the film having the laser structure of the embodiment had a surface roughness of about 10 nm in average value (Ra), and thus exhibited a very good flatness. Further, a plurality of wafers were prepared. Each wafer had the structure formed of the (0001) C-surface sapphire substrate, GaN low temperature buffer layer, n-type GaN contact layer, and n-type AlGInN clad layer (thickness: about 1 μm) formed of the alternate multilayer structure (n-type clad layer, n-type buffer layer, . . . , n-type buffer layer and n-type clad layer) including the n-type AlGaN clad layers and the n-type InGaN buffer layers. The surfaces of these wafers were observed with an optical microscope of a magnification of about 200 times. It was found that substantially no hexagonal crack was present in each wafer. More specifically, a hexagonal crack was present on a periphery of only one wafer among ten wafers. The problem of the prior art could be overcome owing to the fact that the n-type AlGaN clad layers were grown at the multiple levels between which the buffer layers containing indium were interposed.

Thereafter, the photolithography technique and reactive ion etching technique are used to effect the etching on the p-type AlGaN clad layer while leaving the p-type GaN contact layer in the stripe form having a stripe width of 3 μm. Thereby, the insulating film is formed by the photolithography technique in the region except for a portion, where the p-type GaN contact layer is in contact with the electrode. Thereafter, the reactive ion etching technique is used to remove a portion, where the negative electrode is to be formed, from a region between the wafer top surface and a middle position of the n-type GaN contact layer. Thereafter, the positive electrode is formed on the exposed portion of the surface of the p-type GaN contact layer in the mesa-like form. The material of the electrodes may be Au/Ni or Au/Pd. The negative electrode is formed substantially entirely over the exposed surface portion of the n-type GaN contact layer. The material of the negative electrode may be Al/Ti or Au/W.

Finally, the surface of the sapphire substrate remote from the semiconductor multilayer film surface is polished so that the layer thickness including the semiconductor multilayer film and the sapphire substrate may be equal to a value (e.g., 60 μm) in a range from 30 to 300 μm. Thereafter, cleavage is used to achieve the element length of about 0.5 mm, and the end surface forming the mirror is formed.

In the foregoing manners, the laser which has the blue violet light emitting wavelength and uses the nitride compound semiconductor shown in FIG. 17 is manufactured.

The semiconductor laser element of the fourth embodiment includes the p-type AlGaIn clad layer, in which the InGaN buffer layer is interposed between the p-type clad layers. The plurality of InGaN buffer layers disposed in the n- and p-type AlGaInN clad layers have the film thickness and the indium content, which are, designed to satisfy the formula (1) of such conditions that the laser oscillation mode does not couple to the three-layer slab waveguide formed of the InGaN buffer layer and the neighboring layers, i.e., the AlGaN clad layers. More specifically, it is assumed that the single or the plurality of n-type (p-type) InGaN buffer layer(s) are interposed between the n-type (p-type) AlGaInN clad layers. Also, it is assumed that the parameter F is calculated in view of the .waveguide mode (effective refractive index $n_{eq}$, electric field amplitude $f_{eq}(x)$) which occurs on the multilayer slab waveguide formed of the n-type AlGaN clad layer (having an infinite thickness), n-type GaN guide layer, InGaN multilayer quantum well active layer, p-type AlGaN carrier stop layer, p-type GaN guide layer and p-type AlGaN clad layer (having an infinite thickness) as well as the waveguide mode (effective refractive index $n_i$, electric field amplitude $f_i(x)$) which occurs on the three-layer slab waveguide (AlGaN clad layer (having an infinite thickness), InGaN buffer layer and AlGaN clad layer (having an infinite thickness) having a core formed of the n-type (or p-type) InGaN buffer layer in the ith (i=1, 2, . . . ) position. The indium content and the thickness of the InGaN buffer layer in the ith position are determined so that the parameter F calculated in view of the above satisfies the formula (1).

The ranges of the refractivity and thickness of the InGaN buffer layer satisfying the formula (1) are the same as the ranges obtained from FIGS. 5 to 8.

In the structure having the InGaN buffer layer interposed between the p-type clad layers, the following advantage can be achieved. The electric field distribution of the laser oscillation mode may spread into the p-type GaN contact layer, and this may lower the active layer confinement factor of the laser oscillation mode, and may cause ripples in the FFP. For preventing these disadvantages, it is desired that the p-type clad layer has a larger thickness. However, the thickness of the p-type AlGaN clad layer, which can be grown on the p-type GaN layer with good yield, is restricted due to difficulty in the crystal growth. By growing the p-type AlGaN clad layers at the multiple levels with the InGaN buffer layers therebetween, it is possible to increase the layer thickness of the p-type AlGaInN clad layer. Thereby, it is possible to suppress spreading of the laser oscillation mode into the p-type GaN contact layer, and thereby can prevent disadvantageous lowering of the active layer confinement factor of the laser oscillation mode and generation of ripples in the FFP.

Increase in thickness of the p-type clad layer can achieve such a peculiar effect that the p-type GaN contact layer can be thick. In the prior art, increase in thickness of the p-type GaN contact layer would remarkably cause the lowering of the active layer confinement factor and the generation of ripples in the FFP due to the spreading of laser oscillation mode to the p-type GaN contact layer. For the above reason, the p-type GaN contact layer cannot have a large thickness in the prior art. This causes a problem when forming a cleavage end surface in the process of producing the semiconductor laser element. More specifically, such a problem occurs that the cleavage end surface perpendicular to the semiconductor growth surface cannot be formed at the vicinity of the active layer due to a difference in thickness between the p- and n-type GaN contact layers. Further, in a process of mounting the conventional semiconductor laser element on a heat sink made of copper, if the semiconductor growth surface were opposed to the heat sink of copper for adhesion, a material of adhesive such as indium would be liable to adhere onto a side surface of the semiconductor laser element chip due to a surface tension, and thereby the p- and n-type semiconductor layers would become conductive with each other, resulting in an element failure. In the prior art, therefore, it is essential that the semiconductor laser element is mounted with its substrate side opposed to the copper heat sink. In contrast to this, spreading to the p-type GaN contact layer is suppressed owing to the increase in thickness of the p-type clad layer so that it is possible to grow the p-type GaN contact layer of a large thickness. As a result, it is possible to form the cleavage end surface which is perpendicular to the semiconductor growth surface at the vicinity of the active layer. Further, in the process of mounting the element onto the copper heat sink, the semiconductor growth surface can be opposed to the copper heat sink for adhesion so that the semiconductor laser device can have improved temperature characteristics as a whole.

Almost all the laser elements prepared in accordance with the embodiment performed the oscillation with the oscillation threshold voltage ($V_{op}$) of about 5 V and the threshold current density ($J_{th}$) of about 1 kA/cm$^2$. In the conventional semiconductor laser, such a phenomenon in which the light output rapidly lowers occurs when the oscillation continues for 10 hours or more, even if no crack is present in the element. According to the laser of the embodiment, in which the n-type InGaN buffer layer is disposed in the n-type AlGaN clad layer, characteristics do not change even after elapsing of about 1000 hours. Further, the FFP has a single crest, and good optical characteristics can be achieved.

In this embodiment, it is not essential that all the n-type AlGaN clad layers included in the n-type AlGaInN clad layer and the p-type AlGaN layer have the same aluminum content. Even if different aluminum contents are employed, the semiconductor laser element may have the structure including the InGaN buffer layer, which is designed to satisfy the formula (1) by the parameters of the foregoing F, in the n-type AlGaInN clad layer, whereby the effects of the invention can be achieved. However, it is desired that all the aluminum contents of the AlGaN clad layers in the semiconductor laser element structure are the same, in view of the symmetry of the laser oscillation mode.

In this embodiment, the active layer is formed of the three-layer quantum well active layer. However, it may be formed of a quantum well active layer having two, four or more layers. Even in the latter case, the relational formula (1) required in the invention as well as the relational formulas required in connection with the InGaN buffer layer are the same as those already described, and the same effects can be achieved.

In this embodiment, the guide layer is made of GaN. However, it may be formed of an InGaN guide layer. Even in the latter case, the relational formula (1) required in the invention as well as the relational formulas required in connection with the InGaN buffer layer are the same as those shown in FIGS. 10–15, and the same effects can be achieved.

In the structure of the semiconductor laser element of the embodiment, the n-type $In_rGa_{1-r}N$ buffer layer interposed between the n-type AlGaIn clad layer and the n-type GaN contact layer has the effect of further reducing the cracks in the semiconductor multilayer wafer. However, the structure not provided with the n-type $In_rGa_{1-r}N$ buffer layer is also contained in the scope of the appended claims, and hardly affects the active layer confinement factor of the semiconductor laser element and the FFP.

The substrate used in the semiconductor laser element of the embodiment is made of sapphire, but may be made of another material such as GaN. In this case, the content and thickness of the InGaN buffer layer disposed in the AlGaInN clad layer must satisfy the same ranges of conditions as the case of the sapphire substrate.

(Fifth Embodiment)

Figure 18:
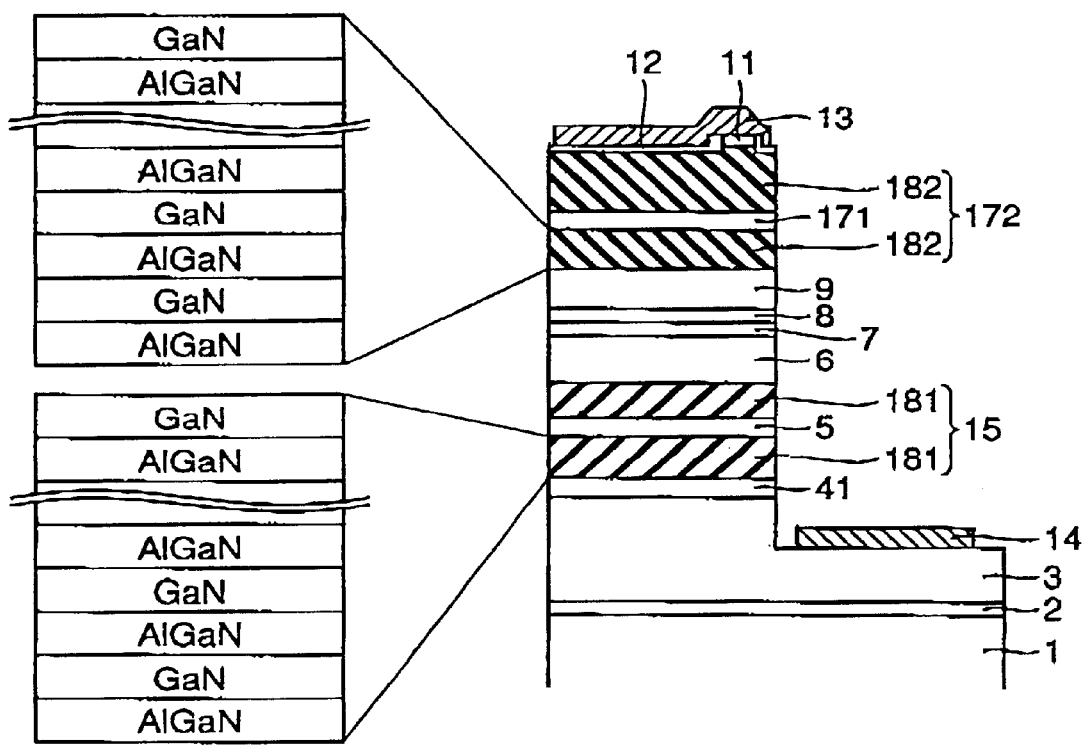
FIG. 18 is a schematic view showing a semiconductor laser element according to a fifth embodiment of the invention.

FIG. 18 is a schematic view showing a semiconductor laser element of the fifth embodiment of the invention. FIG. 18 shows a section of a waveguide portion of the semiconductor laser element, and particularly shows the section perpendicular to a resonator. The semiconductor laser element includes various nitride-contained semiconductor layers, and more specifically includes (0001) C-surface sapphire substrate 1 (thickness: 30–300 μm), GaN low-temperature buffer layer 2 (thickness: 0–100 nm), n-type GaN contact layer 3 (thickness: 0.1–10 μm), n-type $In_rGa_{1-r}N$ ($0 \leq r \leq 0.2$) buffer layer 41 (thickness: 0–200 μm), an n-type AlGaN superlattice clad layer 181 (average composition: $0.08 \leq x_1 \leq 0.2$, total thickness: 0.2–1.5 μm) formed of n-type AlGaN layers of 20–500 Å in individual thickness and n-type GaN layers of 20–500 Å in individual thickness, which are approximately 10–100 in total number, and are layered alternately to each other, n-type $In_pGa_{1-p1}N$ ($0.001 \leq p_1 \leq 0.2$) buffer layer 5 (thickness: 10–200 nm), n-type AlGaN superlattice clad layer 181 (average composition: $0.08 \leq x_1 \leq 0.2$, total thickness: 0.2–1.5 μm) formed of n-type AlGaN layers of 20–500 Å in individual thickness and n-type GaN layers of 20–500 Å in individual thickness, which are 10–100 in total number, and are layered alternately to each other, n-type GaN guide layer 6 (thickness: 0.08–0.15 μm), multiple quantum well active layer 7 (light emission wavelength; 370–430 μm, total thickness: 5–60 nm) formed of an alternate multilayer structure (barrier layer, well layer, . . . , well layer and barrier layer) including $In_wGa_{1-w}N$ ($0<w<0.2$) well layer and $In_vGa_{1-v}N$ ($0<v<w$) barrier layer, p-type $Al_zGa_{1-z}N$ ($0<z<0.3$) carrier block layer 8 (thickness: 0–20 nm), p-type GaN guide layer 9 (thickness:

0.08–0.2 µm), a p-type AlGaN superlattice clad layer 182 (average composition: $0.08 \leq y_1 \leq 0.15$, total thickness: 0.2–1.5 µm) formed of p-type AlGaN layers of 20–500 Å in individual thickness and p-type GaN layers of 20–500 Å in individual thickness, which are approximately 10–100 in total number, and are layered alternately to each other, p-type $In_{q1}Ga_{1-q1}N$ ($0.001 \leq q_1 \leq 0.2$) buffer layer 171 (thickness: 10–200 nm), p-type AlGaN superlattice clad layer 182 (average composition: $0.08 \leq y_1 \leq 0.15$, total thickness: 0.2–1.5 µm) formed of p-type AlGaN layers of 20–500 Å in individual thickness and p-type GaN layers of 20–600 Å in individual thickness, which are 10–100 in total number, and are layered alternately to each other, and p-type GaN contact layer 11 (thickness: 0.01–10 µm).

Above these layers, an insulating film 12 of a required configuration is formed in a mesa-like form on the substantially whole surface. A positive electrode 13 (e.g., Pd/Au, Ni/Pd/Au or Pd/Pt/Au) is formed over the substantially whole surface in a mesa-like form including the whole of the exposed surface of the p-type GaN contact layer. The negative electrode 14 (e.g., Ti/Al, Zr/Al or Hf/Al) is formed on a portion of an exposed surface of the n-type GaN contact layer. The mesa is formed of the n-type GaN contact layer, n-type InGaN buffer layer, n-type AlGaInN clad layer, n-type GaN guide layer, InGaN multiple quantum well active layer, p-type AlGaN carrier block layer, p-type GaN guide layer, p-type AlGaN clad layer, p-type GaN contact layer, insulating film (more specifically, only in the required region) and positive electrode. The opposite end surfaces of the stripe function as mirrors, and form a photo-resonator. The n-type AlGaInN clad layer 15 is formed of the n-type AlGaN superlattice clad layer formed of the n-type AlGaN layers and n-type GaN layers, which are approximately 10–100 in number, and are layered alternately to each other, the n-type $In_{p1}Ga_{1-p1}N$ buffer layer, and the n-type AlGaN superlattice clad layer formed of the n-type AlGaN layers and n-type GaN layers, which are approximately 10–100 in number, and are layered alternately to each other. The n-type AlGaInN clad layer 15 thus formed has the total thickness of 0.8–10 µm. The p-type AlGaInN clad layer 172 is formed of the p-type AlGaN superlattice clad layer formed of the p-type AlGaN layers and p-type GaN layers, which are approximately 10–100 in number, and are layered alternately to each other, the p-type $In_{q1}Ga_{1-q1}N$ buffer layer, and the p-type AlGaN superlattice clad layer formed of the p-type AlGaN layers and p-type GaN layers, which are approximately 10–100 in number, and are layered alternately to each other. The p-type AlGaInN clad layer 172 thus formed has the total thickness of 0.8–10 µm.

Then, description will be given on a method of manufacturing the semiconductor laser element of this embodiment.

First, the (0001) C-surface sapphire substrate is cleaned. The cleaned (0001) C-surface sapphire substrate is moved into a MOCVD device, and is subjected to cleaning within an atmosphere of $H_2$ at a temperature of about 1100° C. After lowering the temperature, $NH_3$ and trimethyl gallium (TMG) at 600° C. are supplied at rates of 5 liter/minute and 20 mol/minute, respectively, while flowing hydrogen ($H_2$) at 10 liter/minute as a carrier gas. Thereby, the GaN low temperature buffer layer of 0–100 nm (e.g., about 20 nm) in thickness is grown. The low temperature buffer layer is not restricted to GaN. Alternatively, trimethyl aluminum (TMA), TMG or NH3 may be used, and thereby an AlN or GaAlN film may be used without causing no adverse effect.

Then, the temperature is raised to about 1050° C. while flowing $N_2$ and $NH_3$ each at a rate of 5 liter/minute. When the temperature rises, the carrier gas is changed from $N_2$ to $H_2$, and TMG and $SiH_4$ are supplied at rates of 100 µmol/minute and 10 nmol/minute, respectively, so that the n-type GaN contact layer of 0.1–10 µm (e.g., about 4 µm) is grown. Then, the supply of TMG is stopped, and the carrier gas is changed from $H_2$ to $N_2$ again. After lowering the temperature to about 800° C., the flow rate of TMG is adjusted to 15 µmol/minute, and the trimethyl indium (TMI) which is an indium material is supplied at a constant rate. Thereby, the $In_rGa_{1-r}N$ buffer layer (e.g., r=0.07) of 0–200 nm (e.g., 50 nm) in thickness is grown.

Then, the supply of TMI and TMG is stopped, and the temperature is raised to 1050° C. again. The carrier gas is changed from $N_2$ to $H_2$. The flow rate of TMG is adjusted to 50 µmol/minute, and the TMA is supplied at a constant rate. Thereby, the n-type $Al_{x11}Ga_{1-x11}N$ clad layer (e.g., x11=0.2) of 20–500 Å (e.g., 20 Å) in thickness is grown. Then, the supply of TMA is stopped, and the n-type GaN layer of 20–500 Å (e.g., 20 Å) in thickness a grown. In this manner, processing is performed to grow the n-type AlGaN superlattice clad layer (e.g., an average composition $x_1$=0.1, and a total thickness; 0.8 µm) formed of the alternate layered structure (n-type AlGaN layer, n-type GaN layer, . . . , n-type GaN layer and n-type AlGaN layer) including the n-type AlGaN layer and the n-type GaN layer. Then, the supply of TMG and TMA is stopped, and the carrier gas is changed from $H_2$ to $N_2$. After lowering the temperature to 800° C., the flow rate of TMG is adjusted to 15 µmol/minute, and the TMI is supplied at a constant rate. Thereby, the $In_pGa_{1-p}N$ buffer layer (e.g., p=0.02) of 0–200 nm (e.g., 50 nm) in thickness is grown.

Then, the supply of TMI and TMG is stopped, and the temperature is raised to 1050° C. again. The carrier gas is changed from $N_2$ to $H_2$. The flow rate of TMG is adjusted to 50 µmol/minute, and the TMA is supplied at a constant rate. Thereby, the n-type $Al_{x21}Ga_{1-x21}N$ clad layer (e.g., $x_2$=0.2) of 20–500 Å (e.g., 20 Å) in thickness is grown. Then, the supply of TMA is stopped, and the n-type GaN layer of 20–500 Å (e.g., 20 Å) in thickness is grown. In this manner, processing is performed to grow the n-type AlGaN superlattice clad layer (e.g., an average composition $x_2$=0.1, and a total thickness: 0.8 µm) formed of the alternate layered structure (n-type AlGaN layer, n-type GaN layer, . . . , n-type GaN layer and n-type AlGaN layer) including the n-type AlGaN layer and the n-type GaN layer.

When growth of the n-type AlGaN superlattice stops, the supply of TMA is stopped, and the supply rate of TMG is adjusted to 100 µmol/minute so that the n-type GaN guide layer of 0.08–0.15 µm (e.g., 0.1 µm) in thickness is grown. Thereafter, the supply of TMG is stopped, and the carrier gas is changed from $H_2$ to $N_2$ again. After lowering the temperature to 700° C., the trimethyl indium (TMI) which is an indium material is supplied at a rate of 10 µmol/minute, and the TMG is supplied at a rate of 15 µmol/minute. Thereby, the barrier wall made of $In_vGa_{1-v}N$ (e.g., v=0.05) and having a thickness of, e.g., 4 nm is grown. Thereafter, the supply rate of TMI is increased to a 50 µmol/minute so that the well layer having a thickness of, e.g., 2 nm and made of $In_wGa_{1-w}N$ (e.g, w=0.17) is grown. The well layers which are three in total number are grown in the similar manner, and the multiple quantum well (MQW) having a light emission wavelength of 380–430 nm (e.g., 400–410 nm) is grown. This MQW includes the barrier layers of four in total number, which are present between the well layers or on the opposite sides of the well layers. When the growth of the MQW ends, the supply of TMI and TMG is stopped, and the temperature is raised to 1050° C. again. The carrier gas is changed from $N_2$ to $H_2$ again, and the TMG is supplied at a rate of 50 µmovement. Also, the TMA is supplied at a rate of 30 µmol/minute, and the bis cyclopentadienyl magnesium ($Cp_2Mg$), which is a p-type doping material, is flowed at a rate of 10 nmol/minute so that the p-type $Al_zGa_{1-z}N$ (e.g., z=0.2) carrier block layer of 0–20 nm in thickness is grown. When growth of the carrier block layer stops, the supply of TIA is stopped, and the supply rate of TMG is adjusted to 100 µmol/minute so that the p-type GaN guide layer of 0.08–0.15 µm (e.g., 0.1 µm) in thickness is grown.

Thereafter, the TMA is supplied at a constant rate. Thereby, the p-type $Al_{y11}Ga_{1-y11}N$ clad layer (e.g., y11=0.2) of 20–500 Å (e.g., 20 Å) in thickness is grown. Then, the supply of TMA is stopped, and the p-type GaN layer of 20–500 Å (e.g., 20 Å) in thickness is grown. In this manner, processing is performed to grow the p-type AlGaN superlattice clad layer (e.g., an average composition $y_1$=0.1, and a total thickness: 0.8 µm) formed of the alternate layered structure (p-type AlGaN layer, p-type GaN layer, . . . , p-type GaN layer and p-type AlGaN layer) including the p-type AlGaN layer and the p-type GaN layer.

Then, the supply of TMI and TMG is stopped, and the carrier gas is changed from $H_2$ to $N_2$ again. After lowering the temperature to about 800° C., the flow rate of TMG is adjusted to 15 µmol/minute, and the TMI is supplied at a constant rate. Thereby, the p-type $In_{q1}Ga_{1-q1}N$ buffer layer (e.g., $q_1$=0.02) of 10–200 nm (e.g., 50 nm) in thickness is grown.

Then, the supply of TMI and TMG is stopped, and the temperature is raised to 1050° C. again. The carrier gas is changed from $N_2$ to $H_2$. The flow rate of TMG is adjusted to 50 µmol/minute, and the TMA is supplied at a constant rate. Thereby, an n-type $Al_{y21}Ga_{1-y21}N$ clad layer (e.g., y21=0.2) of 20–500 Å (e.g., 20 Å) in thickness is grown. Then, the supply of TMA is stopped, and the GaN layer of 20–500 Å (e.g., 20 Å) in thickness is grown. In this manner, processing is performed to grow the n-type AlGaN superlattice clad layer (e.g., an average composition $y_2$=0.1, and a total thickness: 0.8 µm) formed of the alternate layered structure (n-type AlGaN layer, n-type GaN layer, . . . , n-type GaN layer and n-type AlGaN layer) including the n-type AlGaN layer and the n-type GaN layer.

Finally, the flow rate of TMG is adjusted to 100 µmol/minute, and the supply of TMA is stopped so that the p-type GaN contact layer of 0.01–10 µm (e.g. 0.1 µm) in thickness is grown. Thereby, the growth of the light-emitting element structure ends. When the growth ends, the supply of TMG and $Cp_2Mg$ is stopped, and the temperature is lowered. Then, the structure at a room temperature is taken out from the MOCVD device.

The outermost surface (last grown surface) of the film having the laser structure of the embodiment had a surface roughness of about 10 nm in average value (Ra), and thus exhibited a very good flatness. Further, a plurality of wafers were prepared. Each wafer had the structure formed of the (0001) C-surface sapphire substrate, GaN low temperature buffer layer (thickness: 20 nm), n-type GaN contact layer (thickness: about 4 µm), n-type AlGaN clad layer (thickness: 0.8 µm), n-type $In_{0.03}Ga_{0.97}N$ buffer layer (thickness: 50 nm) and n-type AlGaN superlattice clad layer (thickness: 0.8 µm). The surfaces of these wafers were observed with an optical microscope of a magnification of about 200 times. It was found that no hexagonal crack was present in each wafer. In this wafer, the total thickness of the n-type Al0.1Ga0.9N clad layers was equal to about 1.6 µm. The problem of the prior art could be overcome owing to the fact that the buffer layers including at least indium was formed in the n-type clad layer.

Thereafter, the photolithography technique and reactive ion etching technique are used to effect the etching on the p-type AlGaN superlattice clad layer while leaving the p-type GaN contact layer in the stripe form having a stripe width of 3 µm. Thereby, the insulating film is formed by the photolithography technique in the region except for a portion, where the p-type GaN contact layer is in contact with the electrode. Thereafter, the reactive ion etching technique is used to remove a portion, where the negative electrode is to be formed, from a region between the wafer top surface and a middle position of the n-type GaN contact layer. Thereafter, the positive electrode is formed on the exposed portion of the surface of the p-type GaN contact layer in the mesa-like form. The material of the electrodes may be Au/Ni or Au/Pd. The negative electrode is formed substantially entirely over the exposed surface portion of the n-type GaN contact layer. The material of the negative electrode may be Al/Ti or Au/W.

Finally, the surface of the sapphire substrate remote from the semiconductor multilayer film surface is polished so that the layer thickness including the semiconductor multilayer film and the sapphire substrate may be equal to a value (e.g., about 60 µm) in a range from 30 to 300 µm. Thereafter, cleavage is used to achieve the element length of about 0.5 mm, and the end surface forming the mirror is formed.

In the foregoing manners, the semiconductor laser element of the fifth embodiment shown in FIG. 18 is manufactured.

The fifth embodiment differs from the other embodiments in that the AlGaN clad layers in the n- and p-type AlGaInN clad layers are formed of the AlGaN superlattice clad layers. Owing to this structure, the crack reducing effect can be further improved.

The semiconductor laser element of the fifth embodiment includes the AlGaInN clad layer, in which the InGaN buffer layer has the content and the film thickness, which are designed to satisfy the formula (1) of such conditions that the laser oscillation mode does not couple to the three-layer slab waveguide formed of the InGaN buffer layer and the neighboring layers, i.e., the n-type AlGaN clad layers. when calculating the formula (1), the AlGaN superlattice clad layers may be replaced with the single AlGaN clad layer. In this case, however, the content of the virtual AlGaN clad layer takes on the same value as the average content of the AlGaN superlattice clad layer, and the thickness thereof becomes equal to the total thickness of the AlGaN superlattice clad layer. The content and the thickness of the InGaN buffer layer, which are determined in the above manner and satisfy the formula (1), fall within the same ranges as those obtained from FIGS. 5 to 8.

Almost all the laser elements prepared in accordance with the embodiment performed the oscillation with the oscillation threshold voltage ($V_{op}$) of about 5 V and the threshold current density ($J_{th}$) of about 1 $kA/cm^2$. In the conventional semiconductor laser, such a phenomenon in which the light output rapidly lowers occurs when the oscillation continues for 10 hours or more, even if no crack is present in the element. According to the laser of the embodiment, in which the n-type InGaN buffer layer is disposed in the n-type AlGaN clad layer, characteristics do not change even after elapsing of about 1000 hours. Further, the FFP has a single crest, and good optical characteristics can be achieved.

In this embodiment, it is not essential that all the n-type AlGaN clad layers included in the n-type AlGaInN clad layer and the p-type AlGaN layer have the same aluminum content. Even if different aluminum contents are employed, the semiconductor laser element may have the structure including the InGaN buffer layer, which is designed to satisfy the formula (1) by the parameters of the foregoing F, in the n-type AlGaInN clad layer, whereby the effects of the invention can be achieved. However, it is desired that all the aluminum contents of the AlGaN clad layers in the semiconductor laser element structure are the same, in view of the symmetry of the laser oscillation mode.

In this embodiment, the active layer is formed of the three-layer quantum well active layer. However, it may be formed of a quantum well active layer having two, four or more layers. Even in the latter case, the relational formula (1) required in the invention as well as the relational formulas required in connection with the InGaN buffer layer are the same as those already described, and the same effects can be achieved.

In this embodiment, the guide layer is made of GaN. However, it may be formed of an InGaN guide layer. Even in the latter case, the relational formula (1) required in the invention as well as the relational formulas required in connection with the InGaN buffer layer are the same those shown in FIGS. 10–15, and the same effects can be achieved.

In this embodiment, only one n-type InGaN buffer layer is disposed in the n-type AlGaN clad layer, and only one p-type InGaN buffer layer is disposed in the p-type AlGaN clad layer. However, two or more n-type InGaN buffer layers may be disposed in the n-type AlGaN clad layer, and/or two or more p-type InGaN buffer layers may be disposed in the p-type AlGaN clad layer. If two or more n- and/or p-type InGaN buffer layers are employed, the influence of the mode coupling to the InGaN buffer layers is reduced to a substantially ignorable degree if the layer satisfying the relationship of $F_i<0.4$ is present where $F_1, F_2, \ldots, F_i \ldots$ are determined by the electric field distribution ($f_{eq}(x)$) and the effective refractive index ($n_{eq}$) of the waveguide mode as well as the electric field distributions ($f_1(x), f_2(x), \ldots, f_i(x), \ldots$) and the effective refractive index ($n_1, n_2, \ldots, n_i, \ldots$) of the waveguide mode occurring on the respective InGaN buffer layers. If the InGaN buffer layers which are present in the n-type AlGaN clad layer include at least one InGaN buffer layer satisfying the foregoing conditions, the effects of suppressing the ripple in the FFP and improving the active layer confinement factor are achieved.

In this embodiment, it is not essential that both the n- and p-type clad layers contain the InGaN buffer layers, respectively. Only the n-type clad layer may be the AlGaInN clad layer, or only the p-type clad layer may be the AlGaInN clad layer.

In the structure of the semiconductor laser of the embodiment, the n-type $In_rGa_{1-r}N$ buffer layer interposed between the n-type AlGaIn clad layer and the n-type GaN contact layer has the effect of further reducing the cracks in the semiconductor multilayer wafer. However, the structure not provided with the n-type $In_rGa_{1-r}N$ buffer layer falls within the scope of the appended claims, and it hardly affect the active layer confinement factor of the semiconductor laser element and the FFP.

The substrate used in the semiconductor laser element of the embodiment is made of sapphire, but may be made of another material such as GaN. In this case, the content and thickness of the InGaN buffer layer disposed in the AlGaInN clad layer must satisfy the same ranges of conditions as the case of the sapphire substrate.

(Sixth Embodiment)

Figure 19:
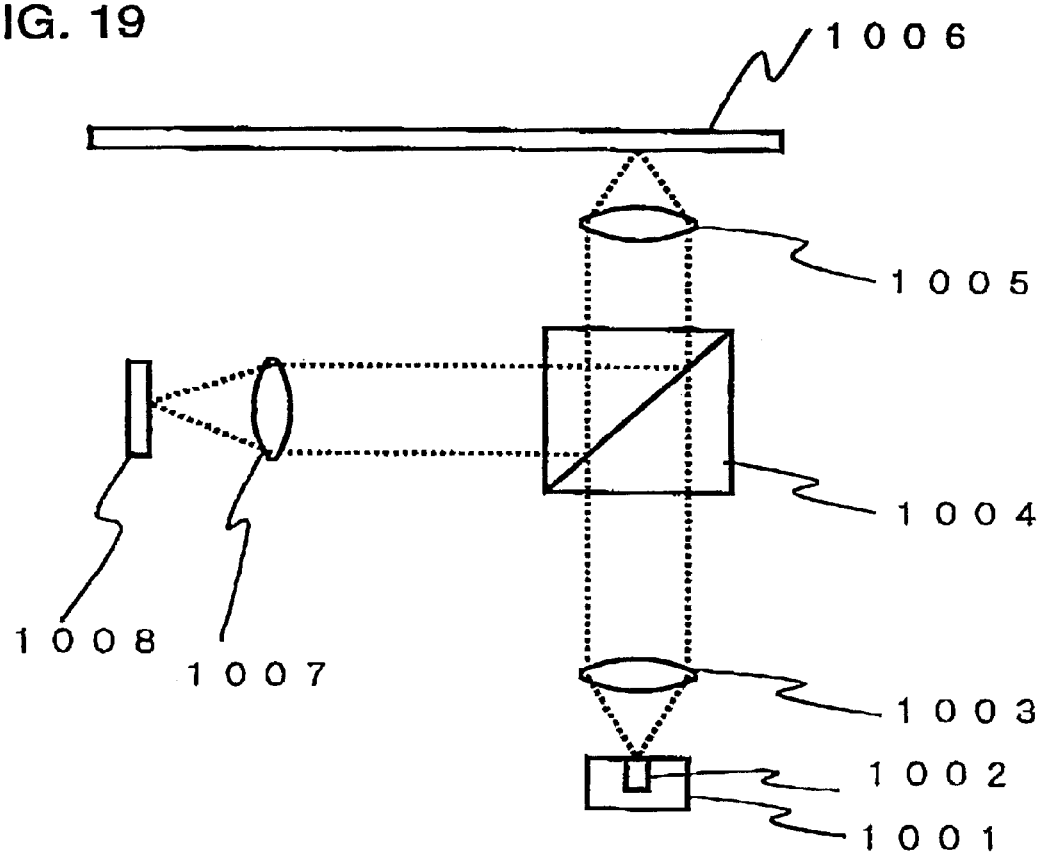
FIG. 19 is an optical information reproducing device according to a sixth embodiment of the invention.

FIG. 19 shows an optical information reproducing device of a sixth embodiment, The device includes a base 1001, an semiconductor laser element 1002 of the first embodiment arranged on base 1001, a collimator lens 1003, a beam splitter 1004, an objective lens 1005, an optical disk 1006, a lens 1007 for collecting reflected light, and a photodetector 1008 for detecting the collected light. In this optical information reproducing device, the laser light emitted from semiconductor laser element 1002 is converted by collimator lens 1003 into parallel or nearly parallel light, passes through beam splitter 1004 and is collected by object lens 1005 onto an information recording surface of optical disk 1006. The information recording surface of optical disk 1006 bears bit information taking the form of convexities and concavities, or bit information written by magnetic modulation or refractivity modulation. The laser light thus collected is reflected by the information recording surface to objective lens 1005. The light passed through the objective lens 1005 is split by beam splitter 1004, and is collected by lens 1007 to photo-detector 1008. Signals are optically detected therefrom, and are converted into electrical signals for reading the recorded information.

Since the optical information reproducing device of this embodiment uses the semiconductor laser element which can suppress the ripples in FFP, and has good optical characteristics, objective lens 1005 can collect the light at a high resolution on the information recording surface of optical disk 1006. For example, the semiconductor laser element, which has the InGaN buffer layer of the case 1 in the table 1, may be used as semiconductor laser element 1001 of the optical information reproducing device in FIG. 19. It is already confirmed that this optical information reproducing device can read out the written information from the optical disk having a high record density of 5 M/m² with a bit error rate of $10^{-6}$. Also, it is already confirmed that the optical information reproducing devices, which use the semiconductor laser elements having the InGaN buffer layers of the case 2, case 3 and case 4 in the table 1, respectively, can achieve the bit error rate of about $10^{-6}$ under the similar conditions. Each of the semiconductor laser elements having the InGaN buffer layers of the case 5 and case 6 in the table 1, respectively, which are not contained in the scope of the appended claims, was used instead of semiconductor laser element 1001 shown in FIG. 19. The device thus constructed exhibited a impractical bit error rate of about $10^{-3}$ under similar conditions. According to the embodiment, as described above, information can be read out from the optical disk having a high record density. Therefore, it can be confirmed that the optical information reproducing device of this embodiment can collect the light at a high resolution onto the optical disk.

Further, semiconductor laser elements 1001 in the optical information reproducing devices of the embodiment were replaced with the semiconductor laser elements of the second, third, fourth and fifth embodiments, respectively. It was confirmed that all the devices thus constructed could achieve the bit error rate of $10^{-5}$–$10^{-7}$ under the above conditions, and therefore could collect the light at a high resolution on the optical disk.

According to the invention, since the semiconductor laser element using the gallium-nitride-contained semiconductor includes the n-type clad layer in which the InGaN buffer layer is disposed, the clad layer having a large thickness can be grown while remarkably suppressing cracks. This improves the crystallity of the active layer grown on the n-type clad layer, and can achieve the effects of reduction of the threshold current density as well as improvement of the yield and lifetime of the semiconductor laser element. By employing the InGaN buffer layer having the predetermined content and thickness, it is possible to suppress coupling of the laser oscillation mode to the InGaN buffer layer and coupling thereof to the n-type contact layer. Thereby, it is possible to suppress lowering of the active layer confinement factor of the laser oscillation mode, and the effects of further reducing the threshold current density of the semiconductor laser element as well as the ripples in FFP can be achieved.

By disposing the InGaN buffer layer in the p-type clad layer, the thickness of p-type clad layer can be increased. Further, by employing the predetermined composition and thickness of the InGaN buffer layer, it is possible to suppress coupling of the laser oscillation mode to the InGaN buffer layer and the coupling thereof to the p-type GaN contact layer. As a result, it is possible to suppress absorption of the laser oscillation mode in the positive electrode, and the threshold current density can be further reduced. Since the p-type GaN contact layer can be increased in thickness, the cleavage mirror end surface forming the resonator of the semiconductor laser element can be perpendicular to the semiconductor layer at the vicinity of the active layer. Therefore, even if the semiconductor laser element is mounted on a sub-mount by die bonding with its semiconductor growth surface opposed to the sub-mount, it is possible to prevent a failure in the semiconductor laser element due to short-circuiting between the p- and n-type semiconductor layers.

The invention can provide the semiconductor laser element having good optical characteristics with good yield, and the optical information reproducing device using the semiconductor laser element of the invention can focus the light at a high resolution, and can perform reading from the optical disk having a high record density.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A nitride-contained semiconductor laser element comprising:
    an $Al_{x1}Ga_{1-x1}N$ ($0.08 \leq x1 \leq 0.2$) lower clad layer;
    an active layer formed of an alternate multilayer structure including a well layer and a barrier layer; and
    an $Al_{x2}Ga_{1-x2}N$ ($0.08 \leq X_2 \leq 0.2$) upper clad layer, wherein
    one or a plurality of $In_{p1}Ga_{1-p1}N$ ($0.001 \leq p1 \leq 0.2$) buffer layer(s) of 200 nm or less in thickness being sandwiched in at least one of said lower and upper clad layers.

2. The nitride-contained semiconductor laser element according to claim 1, wherein
    said $In_{p1}Ga_{1-p1}N$ ($0.001 \leq p1 \leq 0.2$) buffer layer(s) have a thickness and a composition determined to suppress ripples in a fore field pattern in a direction perpendicular to a layer surface.

3. The nitride-contained semiconductor laser element according to claim 1, wherein
    either or each of said upper and lower clad layers has a total thickness in a range from 0.8 μm to 10 μm.

4. The nitride-contained semiconductor laser element according to claim 1, wherein
    at least one of said $In_{p1}Ga_{1-p1}N$ ($0.001 \leq p1 \leq 0.2$) buffer layers (having a dielectric constant $\in_I$) and said neighboring lower/upper clad layers (having a dielectric constant $\in_A$) form a first waveguide providing a first waveguide mode with an effective refractive index $n_i$, and an electric field distribution $f_i(x)$ in a direction perpendicular to the semiconductor layer;

the active layer forms a second waveguide providing a second waveguide mode with an effective refractive index $n_{eq}$, and an electric field distribution $f_{eq}(x)$ in the direction perpendicular to the semiconductor layer;

wherein the first and second waveguide modes determine a maximum transfer rate F of the light wave power from first mode to the second mode of less than 0.4, where $F = 1/\{1 + (\Delta/\kappa)^2\}$, $\Delta = (\pi/\lambda)(n_{eq} - n_i)$, $\kappa = (\omega \cdot \in_0/4) \int \{f_{eq}(x)^* \cdot \delta\in(x) \cdot f_i(x)\} dx$, $\delta\in(x) = \in_I - \in_A$, ($x$: within $In_2Ga_{1-z}N$ buffer layer), $0(x$: other than it)

$\omega = 2\pi c_0/\lambda$, $\lambda$ is the wavelength of oscillation light in vacuum,
$c_0$ is the velocity of light in vacuum, and
$\in_0$ is the dielectric constant in vacuum.

5. The nitride-contained semiconductor laser element according to claim 1, further comprising:
    a GaN lower guide layer (thickness: 0.08–0.15 μm) located between said lower clad layer and said active layer, and a GaN upper guide layer (thickness: 0.08–0.15 μm) located between said upper clad layer and said active layer, wherein
    a distance d separates the $In_{p1}Ga_{1-p1}N$ buffer layer disposed in said lower clad layer from the GaN lower guide layer, or a distance d separates the $In_{p1}Ga_{1-p1}N$ buffer layer disposed in said upper clad layer from the GaN upper guide layer;
    wherein the $In_{p1}Ga_{1-p1}N$ buffer layer has a thickness $t_1$, and $t_1$, p1, and the distance d are as follows:

$0.2 \leq d < 0.3$, $10 \leq t_1 \leq 1/(0.0080268 + 0.58533p1)$, and $0.001 \leq p1 \leq 0.09$ or $0.2 \leq d < 0.3$, $10 \leq t_1 \leq -8.9956 + 273.95p1$, and $0.09 < p1 \leq 0.2$ or $0.2 \leq d < 0.3$, $1/(0.00017672 + 0.088604p1) \leq t_1 \leq 200$, and $0.001 \leq p1 \leq 0.09$ or $0.2 \leq d < 0.3$, $-103.63 + 2403.3p1 \leq t_1 23\ 200$, and $0.09 < p1 \leq 0.2$ or $0.3 \leq d < 0.4$, $10 \leq t_1 \leq 1/(0.0067725 + 0.50578p1)$, and $0.001 \leq p1 \leq 0.09$ or $0.3 \leq d < 0.4$, $10 \leq t_1 \leq -10.86 + 321.88p1$, and $0.09 < p1 \leq 0.2$ or $0.3 \leq d < 0.4$, $1/(0.0014296 + 0.13014p1) \leq t_1 \leq 200$, and $0.001 \leq p1 \leq 0.09$ or $0.3 \leq d < 0.4$, $-42.254 + 1273.3p1 \leq t_1 \leq 200$, and $0.09 < p1 \leq 0.2$ or $d \geq 0.4$, $10 \leq t_1 \leq (0.0044063 + 0.3622p1)^{(-1)}$, and $0.001 \leq p1 \leq 0.09$ or $d \geq 0.4$, $10 \leq t_1 \leq -17.958 + 479p1$, and $0.09 < p1 \leq 0.2$ or $d \geq 0.4$, $(0.0031223 + 0.26847p1)^{(-1)} \leq t_1 \leq 200$, and $0.001 \leq p1 \leq 0.09$ or $d \geq 0.4$, $-25.867 + 664.45p1 \leq t_1 \leq 200$, $0.09 < p1 \leq 0.2$.

6. The nitride-contained semiconductor laser element according to claim 1, further comprising:

a lower guide layer (thickness: 0.08–0.15 μm) located between said lower clad layer and said active layer, and containing at least indium at a rate of 0% or more but smaller than 2%, and an upper guide layer (thickness: 0.08–0.15 μm) located between said upper clad layer and said active layer, and containing at least indium at a rate of 0% or more but smaller than 2%, wherein;

a distance d separates the $In_{p1}Ga_{1-p1}N$ buffer layer disposed in said lower clad layer from the GaN lower guide layer, or a distance d separates the $In_{p1}Ga_{1-p1}N$ buffer layer disposed in said upper clad layer from the GaN upper guide layer;

wherein the $In_{p1}Ga_{1-p1}N$ buffer layer has a thickness $t_1$, and $t_1$, p1, and the distance d are as follows:

$d \geq 0.4$, $10 \leq t_1 \leq (0.002182 + 0.2828p_1)^{(-1)}$, $t_1 \leq 200$, and $0.001 \leq p_1 \leq 0.09$ or $d \geq 0.4$, $10 \leq t_1 \leq -27.916 + 631.14p_1 + 418.94p_1^2$, $t_1 \leq 200$, and $0.09 < p_1 < 0.02$ or $d \geq 0.4$, $(-0.0013694 + 0.16355p_1)^{(-1)} \leq t_1 \leq 200$, and $0.001 \leq p_1 \leq 0.09$ or $d \geq 0.4$, $60.409 - 840.5p_1 + 10843p_1^2 \leq t_1 \leq 200$, and $0.09 < p_1 \leq 0.2$ or $0.3 \leq d < 0.4$, $10 \leq t_1 \leq (0.0028147 + 0.32751p_1)^{(-1)}$, $t_1 \leq 200$, and $0.001\ p_1 \leq 0.09$ or $0.3 \leq d < 0.4$, $10 \leq t_1 \leq -24.449 + 560.59p_1 + 222.45p_1^2$, $t_1 \leq 200$, and $0.09 < p_1 \leq 0.02$ or $0.3 \leq d < 0.4$, $(-0.0011606 + 0.13789p_1)^{(-1)} t_1 \leq 200$, and $0.001 \leq p_1 \leq 0.09$ or $0.3 \leq d < 0.4$, $81.043 - 1159.4p_1 + 13537p_1^2 \leq t_1 \leq 200$, and $0.09 < p_1 \leq 0.2$ or $0.2 \leq d0.3$, $10 \leq t_1 \leq (0.0039942 + 0.39645p_1)^{(-1)}$, $t_1 \leq 200$, and $0.001 \leq p_1 \leq 0.09$ or $0.2 \leq d < 0.3$, $10 \leq t_1 - 21.331 + 488.13p_1, t_1 \leq 200$, and $0.09 < p_1 \leq 0.2$ or $0.2 \leq d0.3$, $(-0.00076798 + 0.093666p_1)^{(-1)} \leq t_1 \leq 200$, and $0.001 \leq p_1 \leq 0.09$ or $0.2 \leq d < 0.3$, $108.61 - 1511.6p_1 + 19016p_1^2 \leq t_1 \leq 200$, and $0.09 < p_1 \leq 0.2$.

7. The nitride-contained semiconductor laser element according to claim 1, further comprising:

a lower guide layer (thickness: 0.08–0.15 μm) located between said lower clad layer and said active layer, and containing at least indium at a rate or 2% or more but smaller than 4%, and an upper guide layer (thickness: 0.08–0.15 μm) located between said upper clad layer and said active layer, and containing at least indium at a rate of 2% or more but smaller than 4%, wherein;

a distance d separates the $In_{p1}Ga_{1-p1}N$ buffer layer disposed in said lower clad layer from the GaN lower guide layer, or a distance d separates the $In_{p1}Ga_{1-p1}N$ buffer layer disposed in said upper clad layer from the GaN upper guide layer;

wherein the $In_{p1}Ga_{1-p1}N$ buffer layer has a thickness $t_1$, and $t_1$, p1, and the distance d are as follows:

$d \geq 0.4$, $10 \leq t_1 \leq (-0.00057916 + 0.20257p_1)^{(-1)}$, $t_1 \leq 200$, and $0.001 \leq p_1 \leq 0.09$ or $d24\ 0.4$, $10 \leq t_1 \leq 20.248 - 212.49p_1 + 6390p_1^2$, $t_1 \leq 200$, and $0.09 < p_1 \leq 0.2$ or $d \geq 0.4$, $(-0.0025782 + 0.14902p_1)^{(-1)} \leq t_1 \leq 200$, and $0.001 \leq p_1 \leq 0.09$ or $d \geq 0.4$, $345.07 - 6361.6p_1 + 39339p_1^2 \leq t_1 \leq 200$, and $0.09 < p_1 \leq 0.2$ or $0.3 \leq d < 0.4$, $10 \leq t_1 \leq (-0.000048081 + 0.22812p_1)^{(-1)}$, $t_1 \leq 200$, and $0.001 \leq p_1 \leq 0.09$ or $0.3 \leq d < 0.4$, $10 \leq t_1 \leq 6.7893 + 7.0097p_1 + 4779.4p_1^2$, $t_1 \leq 200$, and $0.09 < p_1 \leq 0.2$ or $0.3 \leq d < 0.4$, $(-0.0024039 + 0.13561p_1)^{(-1)} \leq t_1 200$, and $0.001 \leq p_1 \leq 0.09$ or $0.3 \leq d < 0.4$, $410.2 - 7584.7p_1 + 46101p_1^2 \leq t_1 \leq 200$, and $0.09 < p_1 \leq 0.2$ or $0.2 \leq d < 0.3$, $10 \leq t_1 \leq (-0.000076166 + 0.27608p_1)^{(-1)}$, $t_1 \leq 200$, and $0.001 \leq p_1 \leq 0.09$ or $0.2 \leq d < 0.3$, $10 \leq t_1 \leq -4.9294 + 213.76 p_1 + 2827.4 p_1^2$, $t_1 \leq 200$, and $0.09 < p_1 \leq 0.2$ or $0.2 \leq d < 0.3$, $(-0.0018961 + 0.10494 p_1)^{(-1)} \leq t_1 \leq 200$, and $0.001 \leq p_1 \leq 0.09$ or $0.2 \leq d < 0.3$, $536.08 - 9966.9 p_1 + 60707 p_1 \leq t_1 \leq 200$, and $0.09 < p_1 \leq 0.2$.

8. The nitride-contained semiconductor laser element according to claim 1, further comprising:

a lower guide layer (thickness: 0.08–0.15 μm) located between said lower clad layer and said active layer, and containing at least indium at a rate or 4%o or more but smaller than 6%, and an upper guide layer (thickness: 0.08–0.15 μm) located between said upper clad layer and said active layer, and containing at least indium at a rate of 4% or more but smaller than 6%, wherein;

a distance d separates the $In_{p1}Ga_{1-p1}N$ buffer layer disposed in said lower clad layer from the GaN lower guide layer, or a distance d separates the $In_{p1}Ga_{1-p1}N$ buffer layer disposed in said upper clad layer from the GaN upper guide layer;

wherein the $In_{p1}Ga_{1-p1}N$ buffer layer has a thickness $t_1$, and $t_1$, p1, and the distance d are as follows:

$d \geq 0.4$  $10 \leq t_1 \leq (-0.0036588 + 0.15804 p_1)^{(-1)}$, $t_1 \leq 200$, and $0.001 \leq p_1 \leq 0.09$ or $d \geq 0.4$, $10 \leq t_1 \leq 1192.2 - 22262 p_1 + 112670 p_1^2$, $t_1 \leq 200$, and $0.09 < p_1 \leq 0.2$ or $d \geq 0.4$, $(-0.0635017 + 0.14571 p_1)^{(-1)} < t_1 \leq 200$, and $0.001 \leq p_1 \leq 0.09$ or $d \geq 0.4$, $524.75 - 10029 p_1 + 59406 p_1^2 \leq t_1 \leq 200$, and $0.09 < p_1 \leq 0.2$ or $0.3 \leq d < 0.4$, $10 \leq t_1 \leq (-0.0029727 + 0.18468 p_1)^{(-1)}$, $t_1 \leq 200$, and $0.001 \leq p_1 \leq 0.09$ or $0.3 \leq d < 0.4$, $10 \leq t_1 \leq 21.1.87 - 3874.3 p_1 + 25752 p_1^2$, $t_1 \leq 200$, and $0.09 < p_1 \leq 0.2$ or $0.3 \leq d < 0.4$, $(-0.0033291 + 0.13586 p_1)^{(-1)} \leq t_1 \leq 200$, and $0.001 \leq p_1 \leq 0.09$ or $0.3 \leq d < 0.4$, $587.7 - 11264 p_1 + 66380 p_1^2 \leq t_1 \leq 200$, and $0.09 < p_1 \leq 0.2$ or $0.2 \leq d < 0.3$, $10 \leq t_1 \leq (-0.0031947 + 0.21903 p_1)^{(-1)}$, $t_1 \leq 200$, and $0.001 \leq p_1 \leq 0.09$ or $0.2 \leq d < 0.3$, $10 \leq t_1 \leq 139.37 - 2496.5 p_1 + 17831 p_1^2$, $t_1 \leq 200$, and $0.09 < p_1 \leq 0.2$ or $0.2 \leq d < 0.3$, $(-0.0028237 + 0.11113 p_1)^{(-1)} \leq t_1 \leq 200$, and $0.001 \leq p_1 \leq 0.09$ or $0.2 \leq d < 0.3$, $766.52 - 14773 p_1 + 86589 p_1^2 \leq t_1 \leq 200$, and $0.09 < p_1 \leq 0.2$.

9. The nitride-contained semiconductor laser element according to claim 1, further comprising:

a lower guide layer (thickness: 0.08–0.15 μm) located between said lower clad layer and said active layer, and containing at least indium at a rate or 6% or more but smaller than 7%, and an upper guide layer (thickness: 0.08–0.15 μm) located between said upper clad layer and said active layer, and containing at least indium at a rate of 6% or more but smaller than 7%, wherein;

a distance d separates the $In_{p1}Ga_{1-p1}N$ buffer layer disposed in said lower clad layer from the GaN lower guide layer, or a distance d separates the $In_{p1}Ga_{1-p1}N$ buffer layer disposed in said upper clad layer from the GaN upper guide layer;

wherein the $In_{p1}Ga_{1-p1}N$ buffer layer has a thickness $t_1$, and $t_1$, p1, and the distance d are as follows:

$d \geq 0.4$  $10 \leq t_1 \leq (-0.0036588 + 0.15804 p_1)^{(-1)}$, $t_1 \leq 200$, and $0.001 \leq p_1 \leq 0.09$ or $d \geq 0.4$, $10 \leq t_1 \leq 1192.2 - 22262 p_1 + 112670 p_1^2$, $t_1 \leq 200$, and $0.09 < p_1 \leq 0.02$ or $d \geq 0.4$, $(-0.0041761 + 0.13916 p_1)^{(-1)} \leq t_1 \leq 200$, and $0.001 \leq p_1 \leq 0.09$ or $d \geq 0.4$, $958.16 - 18852 p_1 + 105870 p_1^2 \leq t_1 \leq 200$, and $0.09 < p_1 \leq 0.2$ or $0.3 \leq d < 0.4$, and $10 \leq t_1 \leq (-0.0038108 + 0.16856 p_1)^{(-1)}$, $t_1 \leq 200$, and $0.001 \leq p_1 \leq 0.09$ or $0.3 \leq d < 0.4$, and $10 \leq t_1 \leq 973.69 - 18186 p_1 + 93321 p_1^2$, $t_1 \leq 200$, and $0.09 < p_1 \leq 0.02$ or $0.3 \leq d < 0.4$, and $(-0.0040339 + 0.13236 p_1)^{(-1)} \leq t_1 \leq 200$, and $0.001 \leq p_1 \leq 0.09$ or $0.3 \leq d < 0.4$, and $1056.2 - 20815 p_1 + 116460 p_1^2 \leq t_1 \leq 200$, and $0.09 < p_1 \leq 0.2$ or $0.2 \leq d < 0.3$, $10 \leq t_1 \leq (-0.0040773 + 0.19547 p_1)^{(-1)}$, $t_1 \leq 200$, and $0.001 \leq p_1 \leq 0.09$ or $0.2 \leq d \leq 0.3$, $10 \leq t_1 \leq 539.75 - 10088 p_1 + 54757 p_1^2$, $t_1 \leq 200$, and $0.09 < p_1 \leq 0.2$ or $0.2 \leq d < 0.3$, $(-0.0035424+0.11285p_1)^{(-1)} \leq t_1 \leq 200$, and $0.001 \leq p_1 \leq 0.09$ or $0.2 \leq d < 0.3$, $1335.8-26428p_1+147260p_1^2 \leq t_1 \leq 200$, and $0.09 < p_1 \leq 0.2$.

10. The nitride-contained semiconductor laser element according to claim 1, further comprising:

a lower guide layer (thickness: 0.08–0.15 μm) located between said lower clad layer and said active layer, and containing at least indium at a rate or 7% or more but smaller than 10%, and an upper guide layer (thickness: 0.08–0.15 μm) located between said upper clad layer and said active layer, and containing at least indium at a rate of 7% or more but smaller than 10%, wherein;

a distance d separates the $In_{p1}Ga_{1-p1}N$ buffer layer disposed in said lower clad layer from the GaN lower guide layer, or a distance d separates the $In_{p1}Ga_{1-p1}N$ buffer layer disposed in said upper clad layer from the GaN upper guide layer;

wherein the $In_{p1}Ga_{1-p1}N$ buffer layer has a thickness $t_1$, and $t_1$, p1, and the distance d are as follows:

$d \geq 0.4$, $10 \leq t_1 \leq (-0.004347+0.14719p_1)^{(-1)}$, $t_1 \leq 200$, and $0.001 \leq p_1 \leq 0.09$ or $d \geq 0.4$, $10 \leq t_1 \leq 858.55-16866p_1+95186p_1^2$, $t_1 \leq 200$, and $0.09 < p_1 \leq 0.2$ or $d \geq 0.4$, $(-0.005134+0.1362p_1)^{(-1)} \leq t_1 \leq 200$, and $0.001 \leq p_1 \leq 0.09$ or $d \geq 0.4$, $2497.8-49961p_1+264020p_1^2 \leq t_1 \leq 200$, and $0.09 < p_1 \leq 0.2$ or $0.3 \leq d < 0.4$, and $10 \leq t_1 \leq (-0.0044872+0.15446p_1)^{(-1)}$, $t_1 \leq 200$, and $0.001 \leq p_1 \leq 0.09$ or $0.3 \leq d < 0.4$, and $10 \leq t_1 \leq 780.25-15299p_1+86683p_1^2$, $t_1 \leq 200$, and $0.09 < p_1 \leq 0.2$ or $0.3 \leq d < 0.4$, and $(-0.0049851+0.13106p_1)^{(-1)} \leq t_1 \leq 200$, and $0.001 \leq p_1 \leq 0.09$ or $0.3 \leq d < 0.4$, and $2705.9-54159p_1+285760p_1^2 \leq t_1 \leq 200$, and $0.09 < p_1 \leq 0.2$ or $0.2 \leq d < 0.3$, $10 \leq t_1 \leq (-0.0048885+0.17591p_1)^{(-1)}$, $t_1 \leq 200$, and $0.001 \leq p_1 \leq 0.09$ or $0.2 \leq d < 0.3$, $10 \leq t_1 \leq 597.65-11661p_1+66983p_1^2$, $t_1 \leq 200$, and $0.09 < p_1 \leq 0.2$ or $0.2 \leq d < 0.3$, $(-0.0044282+0.11446p_1)^{(-1)} \leq t_1 \leq 200$, and $0.001 \leq p_1 \leq 0.09$ or $0.2 \leq d < 0.3$, $3324.9-66656p_1+35105p_1^2 \leq t_1 \leq 200$, and $0.09 < p_1 \leq 0.2$.

11. The nitride-contained semiconductor laser element according to claim 1 further comprising:

at least one $In_rGa_{1-r}N$ buffer layer containing indium at a rate of 0% or more but smaller than 20% interposed between said lower clad layer and said substrate.

12. The nitride-contained semiconductor laser element according to claim 2, further comprising:

a lower guide layer (thickness: 0.08–0.15 μm) located between said lower clad layer and said active layer, and continuing at least indium at a rate of 0% or more but smaller than 2%, and an upper guide layer (thickness 0.08–0.15 μm) located between said upper clad layer and said active layer, and containing at least indium at a rate of 0% or more but smaller than 2%;

a distance from the $In_zGa_{1-z}N$ ($0 \leq z \leq 0.2$) buffer layer disposed in said lower clad layer to said GaN upper guide layer, or a distance from said $In_zGa_{1-z}N$ ($0 \leq z \leq 0.2$) buffer layer disposed in said upper clad layer to said GaN upper guide layer is equal to d (μm);

an average aluminum compostion of said lower clad layer disposed in a region from said InGaN buffer layer to said GaN lower guide layer, or an average aluminum composition of said upper clad layer disposed in a region from said InGaN buffer layer to said GaN upper guide layer satisfies a relationship of $0.08 \leq x \leq 0.2$; and a composition $p_1$ and a thickness $t_1$ (nm) of said buffer layer are determined to satisfy the following relationship:

$d \leq 0.4$, $10 \leq t_1 \leq (0.002182=0.2828p_1)^{(-1)}$, $t_1 \leq 200$, and $0.001 \leq p_1 \leq 0.09$ or $d \leq 0.4$, $10 \leq t_1 \leq -27.916=631.14p_1=418.94p_1^2$, $t_1=200$, and $0.09 \leq p_1 \leq 0.2$ or

13. The nitride-contained semiconductor laser element according to claim 2, further comprising:

a lower guide layer (thickness: 0.08–0.15 μm) located between said lower clad layer and said active layer, and continuing at least indium at a rate of 0% or more but smaller than 2%, and an upper guide layer (thickness 0.08–0.15 μm) located between said upper clad layer and said active layer, and containing at least indium at a rate of 0% or more but smaller than 2%;

a distance from the $In_zGa_{1-z}N$ ($0 \leq z \leq 0.2$) buffer layer disposed in said lower clad layer to said GaN upper guide layer, or a distance from said $In_zGa_{1-z}N$ ($0 \leq z \leq 0.2$) buffer layer disposed in said upper clad layer to said GaN upper guide layer is equal to d (μm);

an average aluminum compostion of said lower clad layer disposed in a region from said InGaN buffer layer to said GaN lower guide layer, or an average aluminum composition of said upper clad layer disposed in a region from said InGaN buffer layer to said GaN upper guide layer satisfies a relationship of $0.08 \leq x \leq 0.2$; and a composition $p_1$ and a thickness $t_1$ (nm) of said buffer layer are determined to satisfy the following relationship:

14. The nitride-contained semiconductor laser element according to claim 2, further comprising:

a lower guide layer (thickness: 0.08–0.15 μm) located between said lower clad layer and said active layer, and continuing at least indium at a rate of 0% or more but smaller than 2%, and an upper guide layer (thickness 0.08–0.15 μm) located between said upper clad layer and said active layer, and containing at least indium at a rate of 0% or more but smaller than 2%;

a distance from the $In_zGa_{1-z}N$ ($0 \leq z \leq 0.2$) buffer layer disposed in said lower clad layer to said GaN upper guide layer, or a distance from said $In_zGa_{1-z}N$ ($0 \leq z \leq 0.2$) buffer layer disposed in said upper clad layer to said GaN upper guide layer is equal to d (μm);

an average aluminum compostion of said lower clad layer disposed in a region from said InGaN buffer layer to said GaN lower guide layer, or an average aluminum composition of said upper clad layer disposed in a region from said InGaN buffer layer to said GaN upper guide layer satisfies a relationship of $0.08 \leq x \leq 0.2$; and a composition $p_1$ and a thickness $t_1$ (nm) of said buffer layer are determined to satisfy the following relationship:

15. The nitride-contained semiconductor laser element according to claim 1, wherein the well layer comprises $In_wGa_{1-w}N$ and the barrier layer comprises $In_vGa_{1-v}N$.

16. An optical information reproducing device for reproducing recorded information recorded on an optical disk by performing photo-conversion of reflected light of laser light emitted onto the optical disk having an information recording surface, wherein the laser light is produced by a nitride-contained semiconductor laser element comprising:

an $Al_{x1}Ga_{1-x1}N$ ($0.08 \leq x1 \leq 0.2$) lower clad layer;

an active layer formed of an alternate multilayer structure including an $In_wGa_{1-w}N$ well layer and an $In_vGa_{1-v}N$ barrier layer; and an $Al_{x2}Ga_{1-x2}N$ ($0.08 \leq X_2 \leq 0.2$) upper clad layer, wherein one or a plurality of $In_{p1}Ga_{1-p1}N$ ($0.001 \leq p1 \leq 0.2$) buffer layer(s) of 200 nm or less in thickness being sandwiched in at least one of said lower and upper clad layers.

* * * * *